(12) United States Patent
Kim et al.

(10) Patent No.: US 10,947,449 B2
(45) Date of Patent: *Mar. 16, 2021

(54) ORGANIC LIGHT-EMITTING DIODE WITH HIGH EFFICIENCY AND LONG LIFETIME

(71) Applicant: SFC CO., LTD., Cheongju-si (KR)

(72) Inventors: Hee-Dae Kim, Miryang-si (KR); Seok-Bae Park, Geumsan-gun (KR); Yoona Shin, Seoul (KR); Yu-Rim Lee, Chuncheon-si (KR); Sang-Woo Park, Seoul (KR); Soon-Wook Cha, Goyang-si (KR)

(73) Assignee: SFC CO., LTD., Cheongju (KR)

( * ) Notice: Subject to any disclaimer, the term of this patent is extended or adjusted under 35 U.S.C. 154(b) by 228 days.

This patent is subject to a terminal disclaimer.

(21) Appl. No.: 15/533,064

(22) PCT Filed: Nov. 6, 2015

(86) PCT No.: PCT/KR2015/011875
§ 371 (c)(1),
(2) Date: Jun. 5, 2017

(87) PCT Pub. No.: WO2016/108419
PCT Pub. Date: Jul. 7, 2016

(65) Prior Publication Data
US 2017/0342318 A1 Nov. 30, 2017

(30) Foreign Application Priority Data
Dec. 31, 2014 (KR) .................. 10-2014-0195480

(51) Int. Cl.
| | | |
|---|---|---|
| *C09K 11/06* | (2006.01) | |
| *H01L 51/00* | (2006.01) | |
| *H01L 51/50* | (2006.01) | |
| *C07F 7/30* | (2006.01) | |

(52) U.S. Cl.
CPC ............... *C09K 11/06* (2013.01); *C07F 7/30* (2013.01); *H01L 51/006* (2013.01); *H01L 51/0054* (2013.01); *H01L 51/0058* (2013.01); *H01L 51/0059* (2013.01); *H01L 51/0061* (2013.01); *H01L 51/0062* (2013.01); *H01L 51/0069* (2013.01); *H01L 51/0071* (2013.01); *H01L 51/0073* (2013.01); *H01L 51/0094* (2013.01); *H01L 51/50* (2013.01); *C09K 2211/1018* (2013.01); *C09K 2211/1491* (2013.01); *H01L 51/5012* (2013.01)

(58) Field of Classification Search
CPC ... C07F 7/30; C09K 11/06; C09K 2211/1491; H01L 51/0054; H01L 51/0058; H01L 51/0059; H01L 51/006; H01L 51/0061; H01L 51/0069; H01L 51/0071; H01L 51/0073; H01L 51/0094; H01L 51/50; H01L 51/5012
See application file for complete search history.

(56) References Cited

U.S. PATENT DOCUMENTS

| | | | | |
|---|---|---|---|---|
| 10,014,479 B2* | 7/2018 | Kim | ................... | C07C 211/54 |
| 10,468,603 B2* | 11/2019 | Cha | .................. | H01L 51/00 |
| 10,797,259 B2* | 10/2020 | Cha | .................. | C07D 307/91 |
| 2005/0274961 A1* | 12/2005 | Iou | ...................... | H01L 51/5088 |
| | | | | 257/82 |
| 2008/0220285 A1* | 9/2008 | Vestweber | .............. | C07C 13/62 |
| | | | | 428/690 |
| 2011/0272684 A1* | 11/2011 | Parham | ................ | C07D 209/94 |
| | | | | 257/40 |
| 2014/0054559 A1 | 2/2014 | Kim et al. | | |
| 2014/0183500 A1* | 7/2014 | Ikeda | .................. | H01L 51/0073 |
| | | | | 257/40 |
| 2016/0351818 A1* | 12/2016 | Kim | ...................... | C09K 11/06 |
| 2017/0062729 A1* | 3/2017 | Cha | ....................... | H01L 51/006 |

FOREIGN PATENT DOCUMENTS

| | | | |
|---|---|---|---|
| CN | 102558121 A | | 7/2012 |
| JP | 2005-314239 A | * | 11/2005 |
| JP | 2012-028548 A | * | 2/2012 |
| KR | 1020080015865 A | | 2/2008 |
| KR | 1020120047706 A | | 5/2012 |
| KR | 2013078438 A | * | 7/2013 |
| KR | 1020140026681 A | | 3/2014 |
| KR | 1020130121947 A | | 4/2015 |
| KR | 1020170036743 A | | 4/2017 |
| WO | WO2013105747 A1 | | 7/2013 |

(Continued)

OTHER PUBLICATIONS

Machine translation for KR 2013078438 A (publication date Jul. 2013). (Year: 2013).*
Machine translation for JP 2005-314239 A (publication date Nov. 2005). (Year: 2005).*
Machine translation for JP 2012-028548 A (publication date: Feb. 2012). (Year: 2012).*
International Search Report of PCT/KR2015/011875, dated Feb. 15, 2016, English translation.
Office Action from the China Patent & Trademark Office, dated Mar. 19, 2018.

*Primary Examiner* — Dawn L Garrett
(74) *Attorney, Agent, or Firm* — STIP Law Group, LLC

(57) ABSTRACT

The present invention relates to an organic light-emitting diode exhibiting high efficiency and longevity. The organic light-emitting diode comprises: a first electrode; a second electrode facing the first electrode; and a light-emitting layer interposed between the first electrode and the second electrode, wherein the light-emitting layer contains at least one of the amine compounds represented by Chemical Formula A or Chemical Formula B and at least one of the compounds represented by Chemical Formulas H1 to H7, Chemical Formulas A, B, and H1 to H7 being the same as in the specification.

15 Claims, 1 Drawing Sheet

(56) References Cited

FOREIGN PATENT DOCUMENTS

WO     WO2014010910 A1    1/2014
WO     WO2014058124 A1    4/2014

* cited by examiner

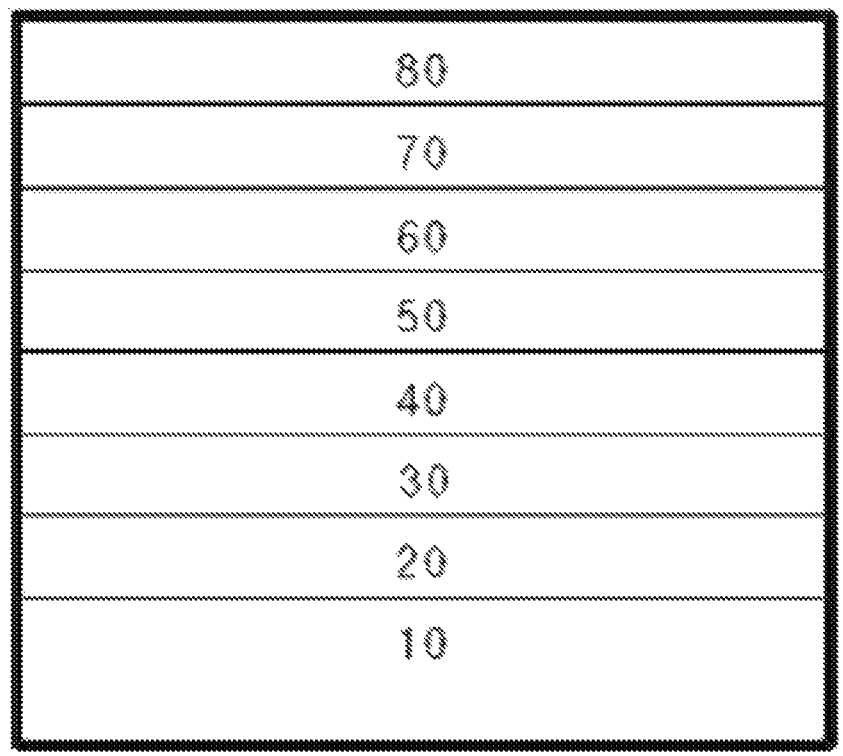

ORGANIC LIGHT-EMITTING DIODE WITH HIGH EFFICIENCY AND LONG LIFETIME

CROSS-REFERENCE TO RELATED APPLICATIONS

This application is the U.S. National Phase under 35 U.S.C. § 371 of International Application No. PCT/KR2015/011875 filed on Nov. 6, 2015, which in turn claims the benefit of Korean Application No. 10-2014-0195480, filed on Dec. 31, 2014, the disclosures of which are incorporated by reference into the present application.

TECHNICAL FIELD

The present disclosure relates to an organic light-emitting diode characterized by high efficiency and a long lifetime and, more particularly, to an organic light-emitting diode containing host and dopant materials of certain structures in a light-emitting layer thereof.

BACKGROUND ART

Organic light-emitting diodes (OLEDs), based on self-luminescence, enjoy the advantage of having a wide viewing angle and being able to be made thinner and lighter than liquid crystal displays (LCDs). In addition, an OLED display exhibits a very fast response time. Accordingly, organic light-emitting diodes find applications in the illumination field as well as the full-color display field.

Materials used as organic layers in organic light-emitting diodes may be divided into luminescent materials and charge transport materials, for example, a hole injection material, a hole transport material, an electron injection material, and an electron transport material. As for the luminescent materials, there are two main families of OLED: those based on small molecules and those employing polymers. The light-emitting mechanism forms the basis for classification of the luminescent materials as fluorescent or phosphorescent materials, which use excitons in singlet and triplet states, respectively. Further, luminescent materials may be divided according to color into blue, green, and red light-emitting materials. Further, yellow and reddish yellow light-emitting materials have been developed in order to achieve more natural colors.

Meanwhile, when a single material is employed as the luminescent material, intermolecular actions cause the wavelength of maximum luminescence to shift toward a longer wavelength, resulting in reduced color purity and light emission efficiency. In this regard, a host-dopant system may be used as a luminescent material so as to increase the color purity and the light emission efficiency through energy transfer.

This is based on the principle whereby, when a dopant is smaller in energy band gap than a host accounting for the light-emitting layer, the addition of a small amount of the dopant to the host generates excitons from the light-emitting layer so that the excitons are transported to the dopant, emitting light at high efficiency. Here, light of desired wavelengths can be obtained depending on the kind of dopant because the wavelength of the host moves to the wavelength range of the dopant.

With regard to related arts pertaining to dopant compounds in the light-emitting layer, reference may be made to Korean Patent Publication No. 10-2008-0015865 (Feb. 20, 2008), which describes an organic light-emitting diode using an arylamine-coupled indenofluorene derivative, and Korean Patent Publication No. 10-2012-0047706 (May 14, 2012), which describes an organic photoelectric device using a compound in which dibenzofuran or dibenzothiophene coexists with fluorene or carbazole.

Further, Korean Patent Application No. 10-2013-0121947, pertaining to a related art of host compound in the light-emitting layer, discloses an organic light-emitting diode employing an anthracene derivative as a fluorescent host.

Despite enormous efforts including the documents describing the related art, there is still the continued need to develop organic light-emitting diodes that exhibit higher light emission efficiency and longer lifetime.

DISCLOSURE

Technical Problem

Accordingly, the purpose to be achieved by the present disclosure is to provide a novel organic light-emitting diode (OLED), characterized by high light emission efficiency and long lifetime, comprising a dopant and a host of specific structures.

Technical Solution

To accomplish the technical purpose, the present disclosure provides an organic light-emitting diode, comprising a first electrode, a second electrode facing the first electrode, and a light-emitting layer interposed therebetween, wherein the light-emitting layer contains at least one of the amine compounds represented by Chemical Formula A or Chemical Formula B and at least one of the compounds represented by Chemical Formulas H1 to H7:

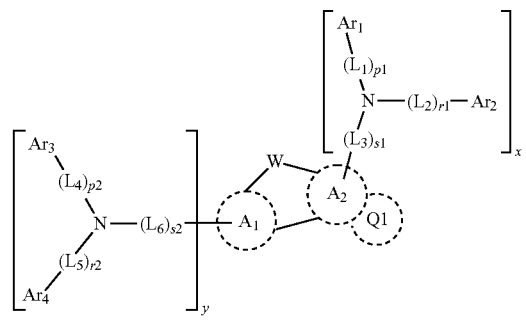

[Chemical Formula A]

-continued

[Chemical Formula B]

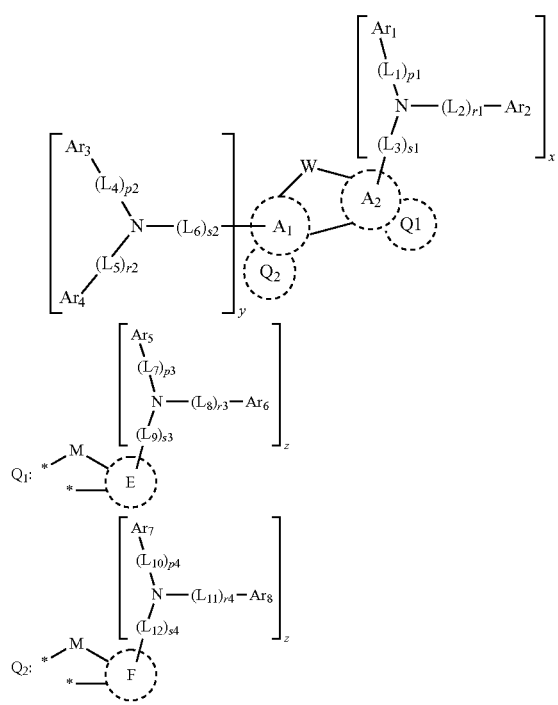

wherein,

A$_1$, A$_2$, E, and F may be the same or different, and are each independently a substituted or unsubstituted aromatic hydrocarbon ring of 6 to 50 carbon atoms, or a substituted or unsubstituted heteroaromatic ring of 2 to 40 carbon atoms, wherein two adjacent carbon atoms of the aromatic ring A$_1$ and two adjacent carbon atoms of the aromatic ring A$_2$ form a 5-membered fused ring together with W;

linkers L$_1$ to L$_{12}$ may be the same or different, and are each independently selected from among a direct bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

W is selected from among CR$_1$R$_2$, SiR$_1$R$_2$, GeR$_1$R$_2$, O, and S,

M is any one selected from among N—R$_3$, CR$_4$R$_5$, SiR$_6$R$_7$, GeR$_8$R$_9$, O, S, and Se;

R$_1$ to R$_9$, and Ar$_1$ to Ar$_8$ may be the same or different, and are each independently any one selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, with the proviso that R$_1$ and R$_2$ may be bonded to each other to form a mono- or polycyclic aliphatic or aromatic ring, which may be a heterocyclic ring containing a heteroatom selected from among N, O, P, Si, S, Ge, Se, and Te as a ring member;

p1 to p4, r$_1$ to r$_4$, and s1 to s4 are each independently an integer of 1 to 3, with the proviso that when any of them is 2 or greater, the corresponding linkers may be the same or different, x is an integer of 1 or 2, and y and z may be the same or different and are each independently an integer of 0 to 3; and Ar$_1$ may form a ring with Ar$_2$, Ar$_3$ may form a ring with Ar$_4$, Ar$_5$ may form a ring with Ar$_6$, and Ar$_7$ may form a ring with Ar$_8$, two adjacent carbon atoms of the A$_2$ ring moiety of Chemical Formula A may occupy respective positions * of Structural Formula Q$_1$ to form a fused ring, and two adjacent carbon atoms of the A$_1$ ring moiety of Chemical Formula B may occupy respective positions * of structural Formula Q$_2$ to form a fused ring, and two adjacent carbon atoms of the A$_2$ ring moiety of Chemical Formula B may occupy respective positions * of Structural Formula Q$_1$ to form a fused ring,

[Chemical Formula H1]

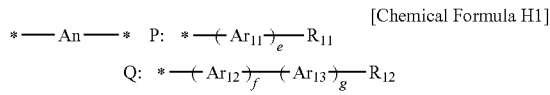

wherein,

An is a substituted or unsubstituted anthracene or a substituted or unsubstituted benzanthracene; Ar$_{11}$ to Ar$_{13}$ may be the same or different and are each independently a single bond, a substituted or unsubstituted aromatic linking group of 5 to 50 carbon atoms, or a substituted or unsubstituted heteroaromatic linking group of 2 to 60 carbon atoms, two sites of An represented by * are positions at which P and Q are respectively bonded to An, R$_{11}$ and R$_{12}$ may be the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, and e, f, and g may be the same or different and are each independently an integer of 0 to 2.

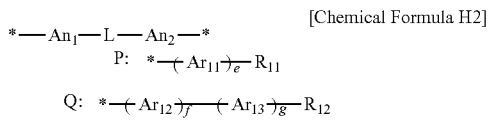

[Chemical Formula H2]

wherein $An_1$ and $An_2$ may be the same or different and are each independently a substituted or unsubstituted anthracene or a substituted or unsubstituted benzanthracene, two sites of An represented by * are positions at which P and Q are respectively bonded to $An_1$ and $A_2$, L, $Ar_{11}$, $Ar_{12}$, and $Ar_{13}$ may be the same or different and are each independently a single bond, a substituted or unsubstituted aromatic linking group of 5 to 50 carbon atoms, or a substituted or unsubstituted heteroaromatic linking group of 2 to 60 carbon atoms; and $R_{11}$ and $R_{12}$, e, f, and g are as defined in [Chemical Formula H1].

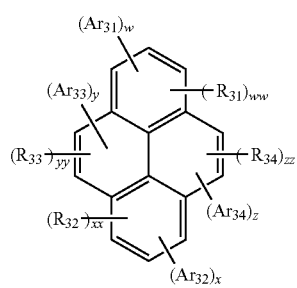

[Chemical Formula H3]

wherein, $Ar_{31}$ to $Ar_{34}$, and $R_{31}$ to $R_{34}$ may be the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, w and ww may be the same or different, satisfying the relationship that w+ww is an integer of 0 to 3, and x and xx may be the same or different, satisfying the relationship that x+xx is an integer of 0 to 3; and y and yy may be the same or different, satisfying the relationship that y+yy is an integer of 0 to 2, and z and zz may be the same or different, satisfying the relationship that z+zz is an integer of 0 to 2.

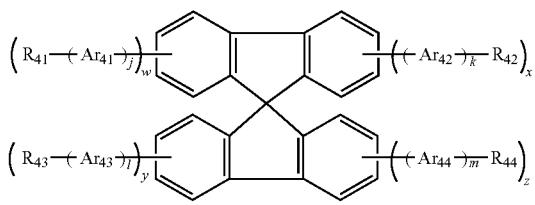

[Chemical Formula H4]

wherein, $Ar_{41}$ to $Ar_{44}$ may be the same or different and are each independently a single bond, a substituted or unsubstituted aromatic linking group of 5 to 60 carbon atoms, or a substituted or unsubstituted heteroaromatic linking group of 5 to 60 carbon atoms, $R_{41}$ to $R_{44}$ may be the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, j to m may the same or different and are each independently an integer of 0 to 2, and w to z may be the same or different and are each independently an integer of 0 to 4.

[Chemical Formula H5]

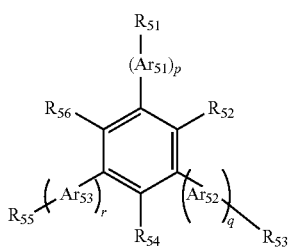

wherein, $Ar_{51}$ to $Ar_{53}$ may the same or different and are each independently a single bond, a substituted or unsubstituted aromatic linking group of 5 to 60 carbon atoms, or a substituted or unsubstituted heteroaromatic linking group of 5 to 60 carbon atoms, $R_{51}$ to $R_{56}$ may be the same or different and are each independently selected from hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, and p to r may be the same or different and are each independently an integer of 0 to 3.

[Chemical Formula H6]

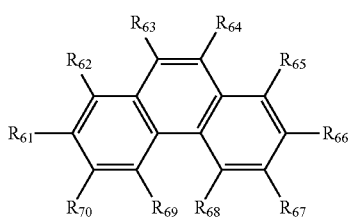

wherein, $R_{61}$ to $R_{70}$ may be the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen.

[Chemical Formula H7]

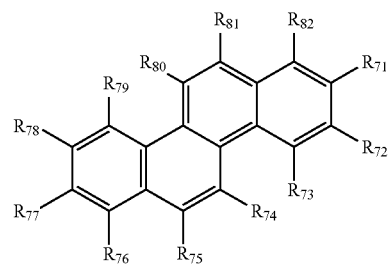

wherein, $R_{71}$ to $R_{82}$ may be the same or different, and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, wherein the term 'substituted' in the expression 'substituted or unsubstituted' used in Chemical Formulas A, B, and H1 to H7 means having at least one substituent selected from the group consisting of a deuterium, a cyano, a halogen, a hydroxy, a nitro, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 1 to 24 carbon atoms, a heteroarylamino of 1 to 24 carbon atoms, an alkylsilyl of 1 to 24 carbon atoms, an arylsilyl of 1 to 24 carbon atoms, and an aryloxy of 1 to 24 carbon atoms.

Advantageous Effects

The organic light-emitting diode according to the present disclosure exhibits improved light emission efficiency and longevity compared to conventional organic light-emitting diodes.

DESCRIPTION OF DRAWINGS

FIG. 1 is a schematic cross-sectional view of an organic light-emitting diode according to some embodiments of the present disclosure.

MODE FOR INVENTION

Below, a detailed description will be given of the present disclosure.

The present disclosure addresses an organic light-emitting diode, comprising a first electrode, a second electrode facing the first electrode, and a light-emitting layer interposed therebetween, wherein the light-emitting layer contains at least one of the amine compounds represented by Chemical Formula A or Chemical Formula B and at least one of the compounds represented by Chemical Formulas H1 to H7.

The expression for a number of carbon atoms, such as in "a substituted or unsubstituted alkyl of 1 to 30 carbon atoms", "a substituted or unsubstituted aryl of 6 to 50 carbon atoms", etc., in the amine compounds represented by Chemical Formula A or B and in the compounds represented by Chemical Formulas H1 to H7 means the total number of carbon atoms in, for example, the alkyl or aryl radical or moiety alone, exclusive of the number of carbon atoms of the substituent. For instance, a phenyl group with a butyl at the para position falls within the scope of an aryl of 6 carbon atoms, even if it is substituted with a butyl radical of 4 carbon atoms.

As used herein, the term "aryl" as a substituent used in the compounds of the present disclosure means an organic radical derived from an aromatic hydrocarbon by removing a hydrogen atom and may further include a fused ring that is formed by adjacent substituents on the organic radical.

Concrete examples of the aryl include phenyl, o-biphenyl, m-biphenyl, p-biphenyl, o-terphenyl, m-terphenyl, p-terphenyl, naphthyl, anthryl, phenanthryl, pyrenyl, indenyl, fluorenyl, tetrahydronaphthyl, perylenyl, chrysenyl, naphthacenyl, and fluoranthenyl, at least one hydrogen atom of which may be substituted by a deuterium atom, a halogen atom, a hydroxy, a nitro, a cyano, a silyl, an amino (—$NH_2$, —NH(R), or —N(R')(R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The substituent heteroaryl used in the compound of the present disclosure refers to a cyclic aromatic system of 2 to 24 carbon atoms containing one to three heteroatoms selected from among N, O, P, Si, S, Ge, Se, and Te. In the aromatic system, two or more rings may be fused. One or more hydrogen atoms on the heteroaryl may be substituted with the same substituents as on the aryl.

As used herein, the term "heteroaromatic ring" refers to an aromatic hydrocarbon ring containing as a ring member at least one heteroatom selected from among N, O, P, Si, S, Ge, Se, and Te.

Examples of the substituent alkyl useful in the present disclosure include methyl, ethyl, propyl, isopropyl, isobutyl, sec-butyl, tert-butyl, pentyl, iso-amyl, and hexyl. At least one hydrogen atom of the alkyl may be substituted by the same substituent as in the aryl.

Examples of the substituent alkoxy useful in the present disclosure include methoxy, ethoxy, propoxy, isobutyloxy, sec-butyloxy, pentyloxy, iso-amyloxy, and hexyloxy. At least one hydrogen atom of the alkoxy may be substituted by the same substituent as in the aryl.

Representative among examples of the substituent silyl useful in the present disclosure are trimethylsilyl, triethylsilyl, triphenylsilyl, trimethoxysilyl, dimethoxyphenylsilyl, diphenylmethylsilyl, silyl, diphenylvinylsilyl, methylcyclobutylsilyl, and dimethylfurylsilyl. One or more hydrogen atoms of the silyl may be substituted by the same substituent as in the aryl.

The amine compound, useful in the organic light-emitting diode of the present invention, represented by Chemical Formula A or B has the structural feature that if Structural Formula $Q_1$ is connected to the $A_2$ ring in Chemical Formula A, the amine moiety containing $Ar_1$ and $Ar_2$ must be bonded to the $A_2$ ring and that if Structural Formula $Q_2$ and $Q_1$ are connected respectively to A and $A_2$ rings in Chemical Formula B, the amine moiety containing $A_1$ and $Ar_2$ must be bonded to the $A_2$ ring.

The light-emitting layer of the organic light-emitting diode according to the present disclosure comprises a host and a dopant, wherein the dopant is selected from among the amine compounds represented by Chemical Formulas A and B and the host is selected from among the compounds represented by Chemical Formulas H1 to H7, whereby the organic light-emitting diode exhibits improved light emission efficiency and longevity compared to conventional organic light-emitting diodes.

In this context, the anthracene derivative of Chemical Formula H1 may be a compound represented by the following Chemical Formula C:

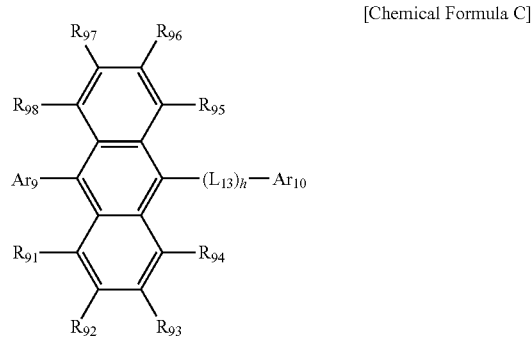

[Chemical Formula C]

wherein $R_{91}$ to $R_{98}$ may be the same or different and are each as defined for $R_1$ to $R_9$;

$Ar_9$ and $Ar_{10}$ may be the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, and a substituted or unsubstituted arylsilyl of 5 to 30 carbon atoms;

$L_{13}$ is a single bond or is selected from among a substituted or unsubstituted arylene of 6 to 20 carbon atoms and a substituted or unsubstituted heteroarylene of 2 to 20 carbon atoms; and h is an integer of 1 to 3, with the proviso that when h is 2 or greater, corresponding $L_{13}$'s may be the same or different.

When the anthracene derivative of Chemical Formula H1 is a compound represented by Chemical Formula C in the present disclosure, $Ar_9$ of Chemical Formula C may be a substituent represented by the following Chemical Formula C-1:

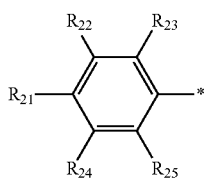

[Chemical Formula C-1]

wherein $R_{21}$ to $R_{25}$ may be the same or different and are each as defined for $R_{11}$ and $R_{12}$, with the proviso that adjacent substituents may form a saturated or unsaturated cyclic ring.

In this case, $L_{13}$ may be a single bond or a substituted or unsubstituted arylene of 6 to 20 carbon atoms, and h may be 1 or 2, with the proviso that when h is 2, corresponding $L_{13}$'s may be the same or different.

According to some embodiments of the present disclosure, W in Chemical Formulas A and B may be $CR_1R_2$ or $SiR_1R_2$.

According to some embodiments of the present disclosure, A1, A2, E and F in Chemical Formula A or B may be the same or different and are each independently substituted or unsubstituted aromatic hydrocarbon rings of 6 to 50 carbon atoms.

As stated above, when A1, A2, E and F in Chemical Formula A or B are each independently substituted or unsubstituted aromatic hydrocarbon rings of 6 to 50 carbon atoms, the substituted or unsubstituted aromatic hydrocarbon rings of 6 to 50 carbon atoms may be the same or different and are each independently selected from among compounds represented by Structural Formulas 10 to 21.

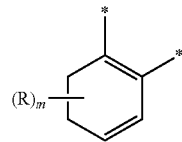

[Structural Formula 10]

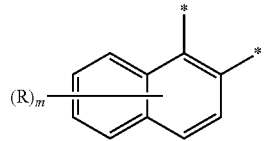

[Structural Formula 11]

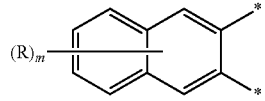

[Structural Formula 12]

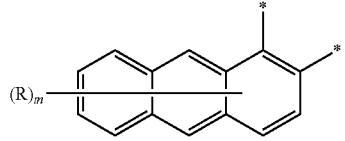

[Structural Formula 13]

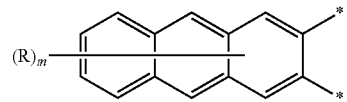

[Structure Formula 14]

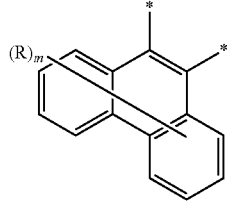

[Structural Formula 15]

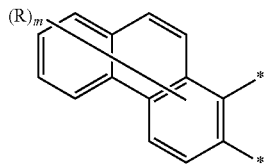

[Structural Formula 16]

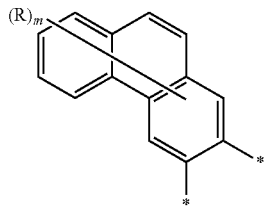

[Structural Formula 17]

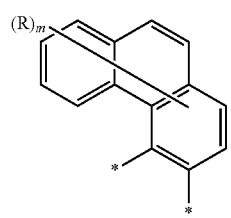

[Structural Formula 18]

-continued

[Structural Formula 19]
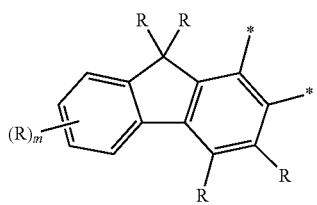

[Structural Formula 20]
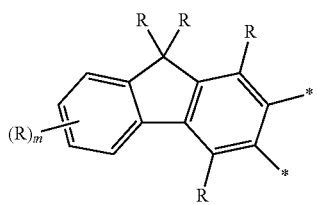

[Structural Formula 21]
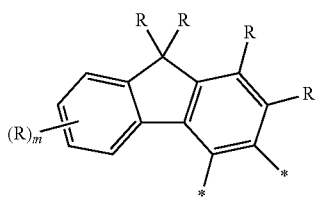

wherein

"-*" denotes a bonding site for forming a 5-membered ring containing W or a bonding site for forming a 5-membered ring containing M of the structural Formula $Q_1$ and $Q_2$;

when one of the aromatic hydrocarbon rings of [Structural Formula 10] to [Structural Formula 21] for $A_1$ or $A_2$ is bonded to Structural Formula Q1 or Structural Formula $Q_2$, two adjacent carbon atoms of the aromatic hydrocarbon ring occupy respective positions * of Structural Formula $Q_1$ or $Q_2$ to form a fused ring;

R's are the same as defined above for $R_1$ and $R_2$, and m is an integer of 1 to 8, with the proviso that when m is 2 or greater or two or more R's exist, the corresponding R's may be the same or different.

In some embodiments of the present disclosure, the compound of Chemical Formula H1 may be that represented by the following Chemical Formula D:

[Chemical Formula D]
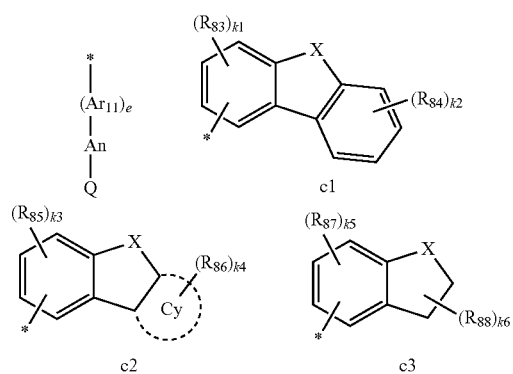

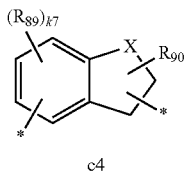
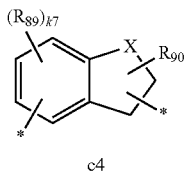

wherein, the site represented by *, connecting to $Ar_{11}$, corresponds to the site represented by * in substituents c1 to c4, X is any one selected from among —O—, —S—, —N($R_{101}$)—, and —C($R_{102}R_{103}$), $R_{83}$ to $R_{90}$, and $R_{101}$ to $R_{103}$ may be the same or different and are each as defined above for $R_{11}$ and $R_{12}$, k1 to k7 are each an integer of 1 to 4, with the proviso that when k1 to k7 are each 2 or greater, corresponding $R_{83}$'s to $R_{89}$'s may be the same or different, An, Q, $Ar_{11}$, and e are each as defined above, and Cy is a substituted or unsubstituted aliphatic cyclic group of 2 to 8 carbon atoms.

According to some embodiments of the present disclosure, the linkers $L_1$ to $L_{12}$ in Chemical Formulas A and B may be the same or different, and each may be a single bond or any one selected from among a substituted or unsubstituted arylene of 6 to 20 carbon atoms and a substituted or unsubstituted heteroarylene of 2 to 20 carbon atoms.

In this regard, the linkers L1 to L12 may each be a single bond or any one selected from among the following Structural Formulas 22 to 30, and p1 to p4, r1 to r4, and s1 to s4 each may be 1 or 2, and x may be 1.

[Structural Formula 22]
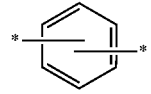

[Structural Formula 23]
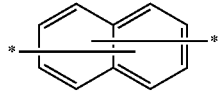

[Structural Formula 24]
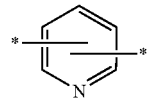

[Structural Formula 25]
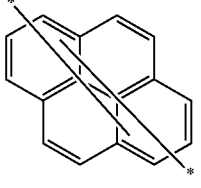

[Structural Formula 26]
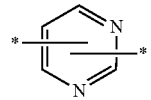

[Structural Formula 27]
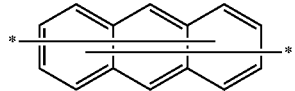

[Structural Formula 28]

[Structural Formula 29]

[Structural Formula 30]

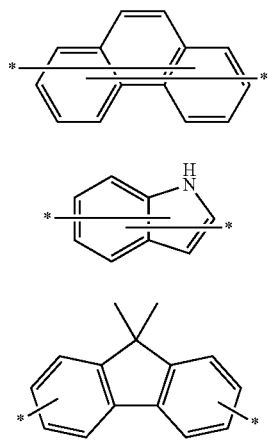

In the linkers, each of the unsubstituted carbon atoms of the aromatic ring moiety is bound with a hydrogen atom or a deuterium atom.

In this case, y may be 1 and z may be 0.

According to a specific embodiment of the present disclosure, $R_1$ to $R_9$, and $Ar_1$ to $Ar_8$ in the amine compound represented by Chemical Formula A or B may be the same or different and may each be independently any one selected from among hydrogen, deuterium, a substituted or unsubstituted aryl of 6 to 20 carbon atoms, a substituted or unsubstituted cycloalkyl of 3 to 30 carbon atoms, a substituted or unsubstituted heteroaryl of 2 to 20 carbon atoms containing at least one heteroatom selected from among O, N, S, and Si, a cyano, and a halogen.

In the amine compound of Chemical Formula A or B according to some embodiments of the present disclosure, $A_1$, $A_2$, E, F, $Ar_1$ to $Ar_8$, $L_1$ to $L_{12}$, and $R_1$ to $R_9$ may have as a substituent any one selected from the group consisting of a cyano, a halogen, an alkyl of 1 to 6 carbon atoms, an aryl of 6 to 18 carbon atoms, an arylalkyl of 6 to 18 carbon atoms, a heteroaryl of 3 to 18 carbon atoms, an alkylsilyl of 1 to 12 carbon atoms, and an arylsilyl of 6 to 18 carbon atoms.

The compound represented by Chemical Formula A or B according to the present disclosure may be any one selected from among the following Compounds 1 to 60:

<Compound 1>

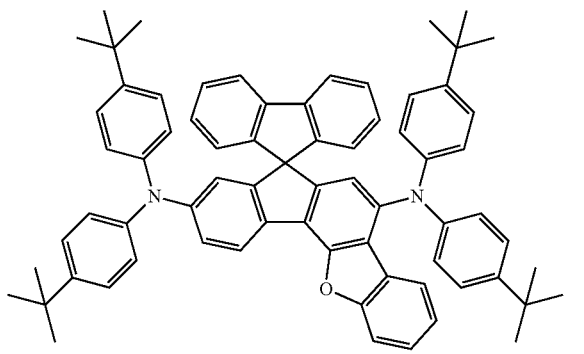

<Compound 2>

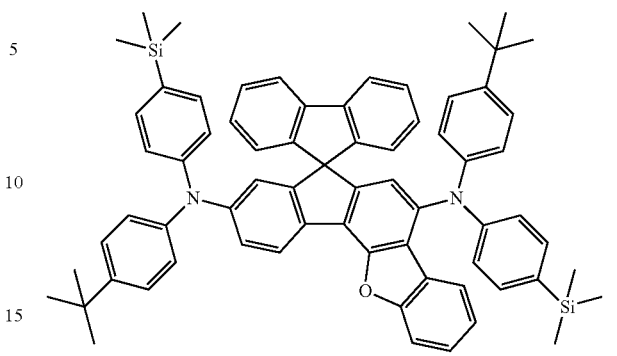

<Compound 3>

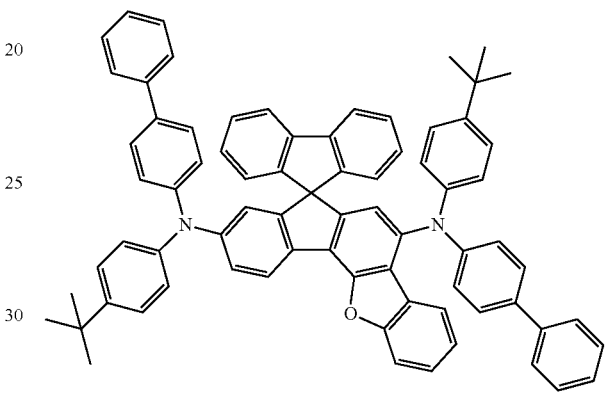

<Compound 4>

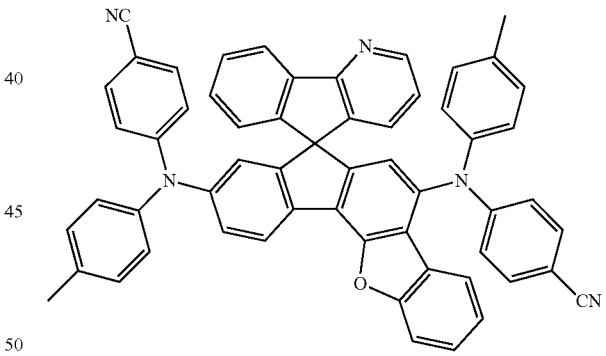

<Compound 5>

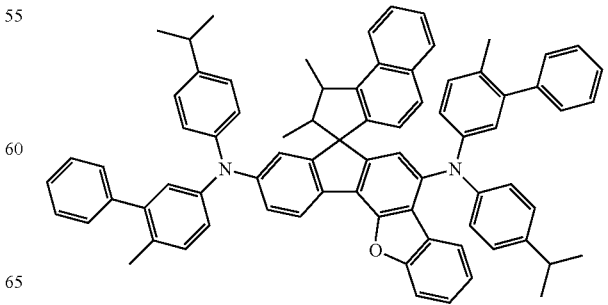

<Compound 6>
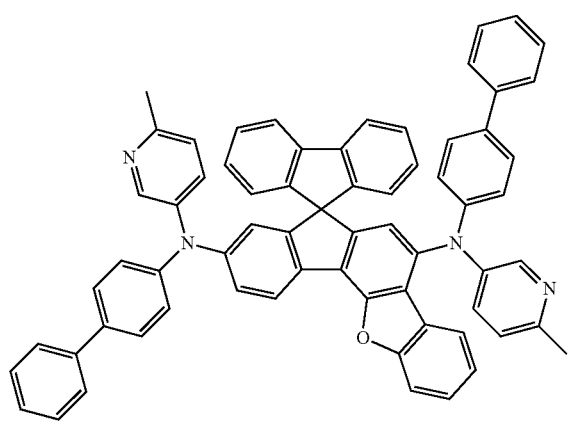
<Compound 7>
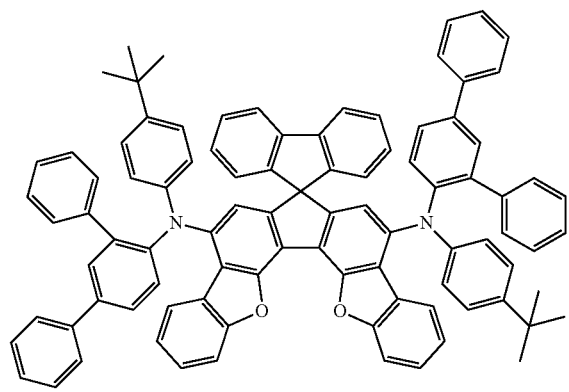
<Compound 8>
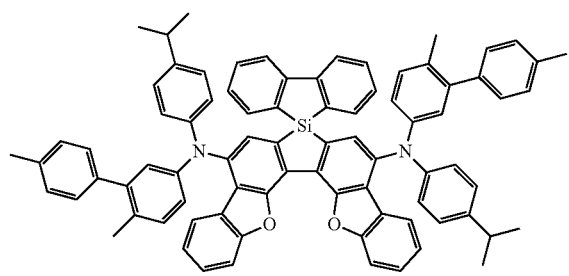
<Compound 9>
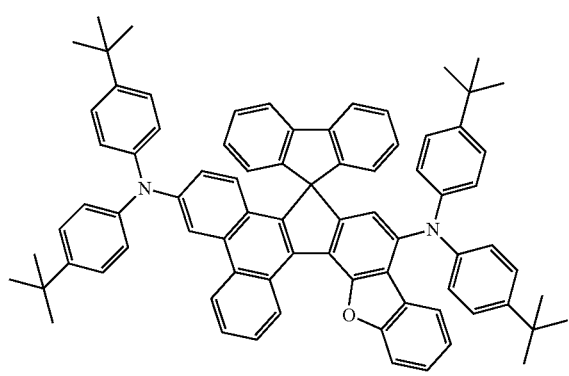
<Compound 10>
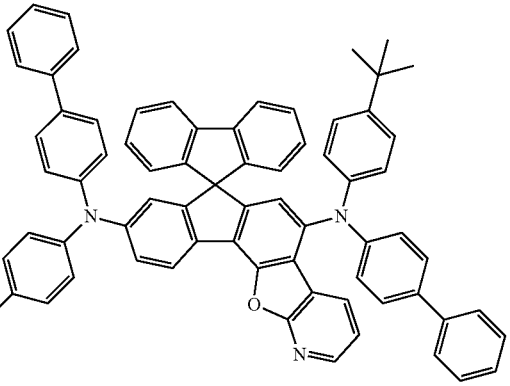
<Compound 11>
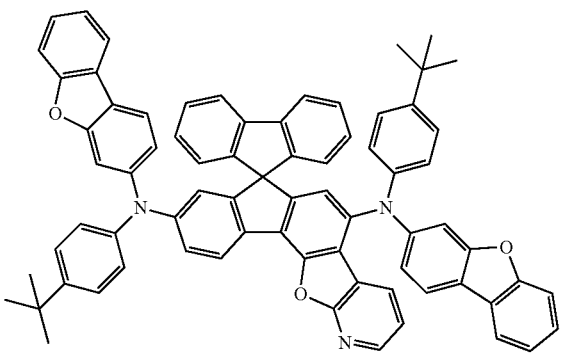
<Compound 12>
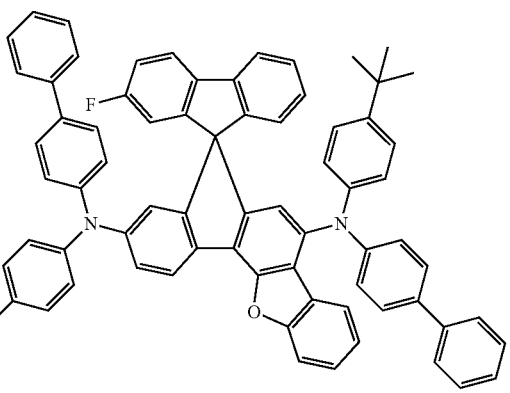
<Compound 13>
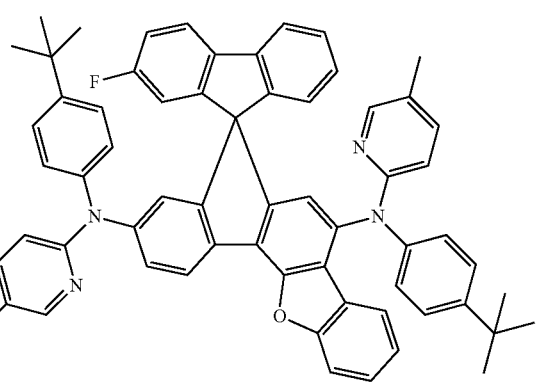

<Compound 14>
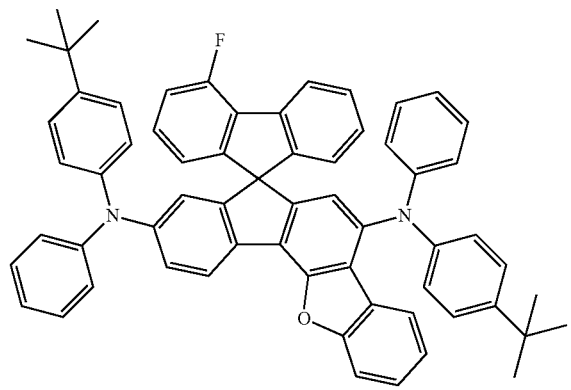
<Compound 15>
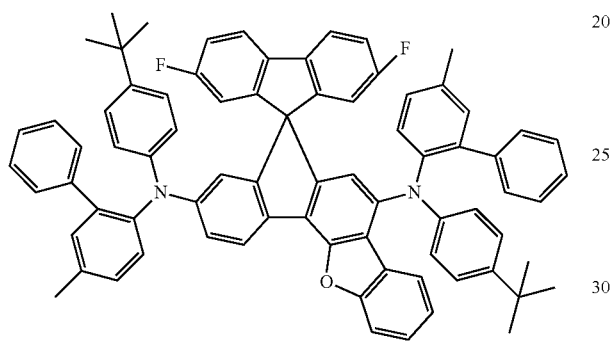
<Compound 16>
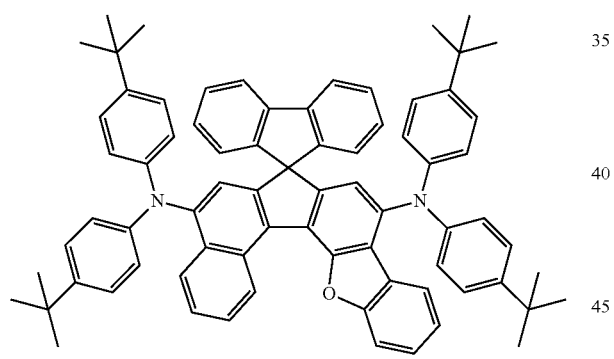
<Compound 17>
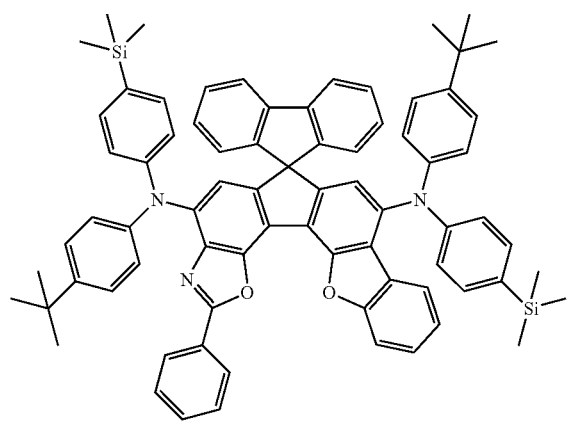
<Compound 18>
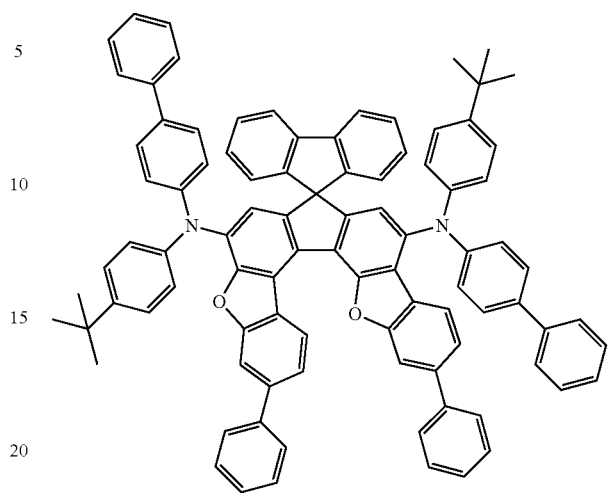
<Compound 19>
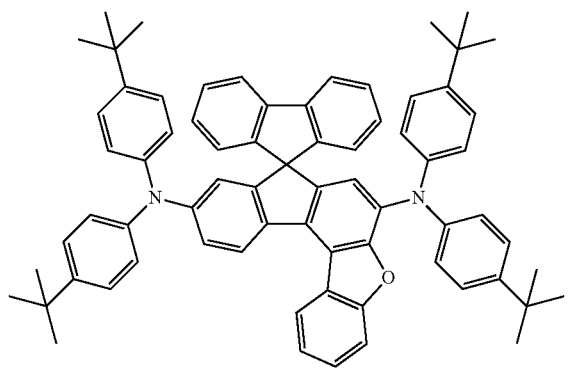
<Compound 20>
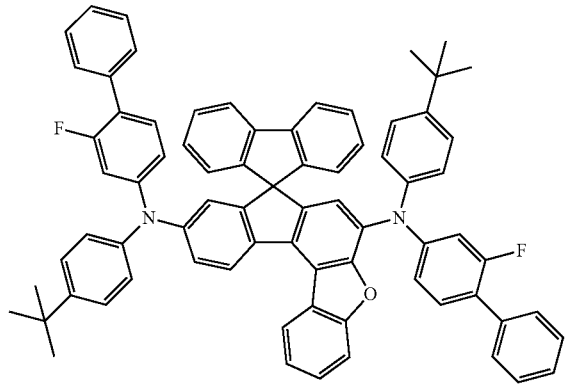

-continued
<Compound 21>
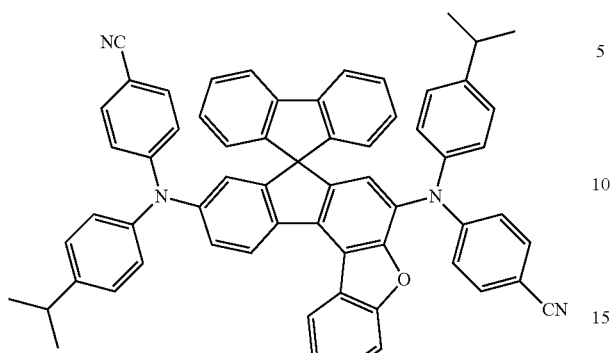
<Compound 22>
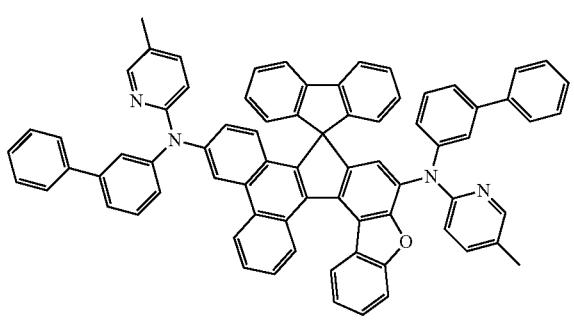
<Compound 23>
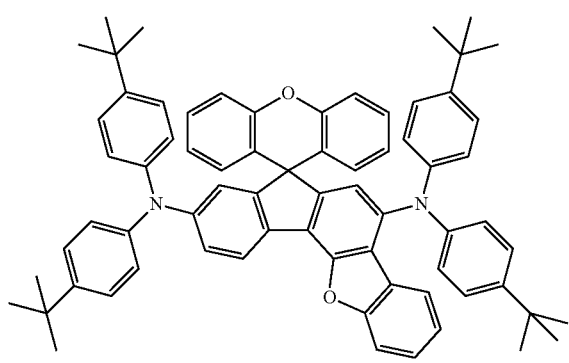
<Compound 24>
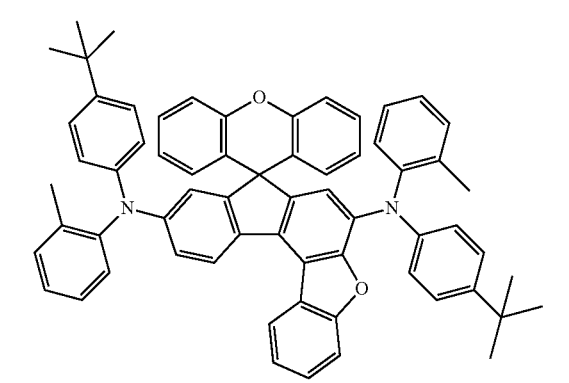
<Compound 25>
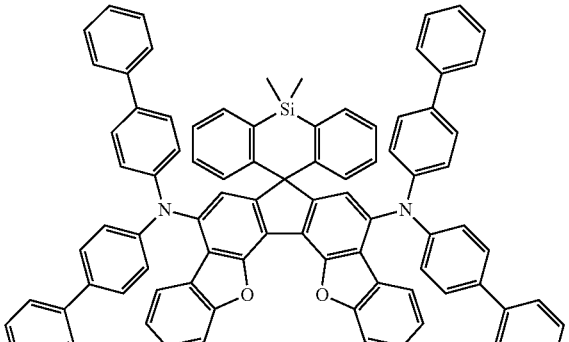
<Compound 26>
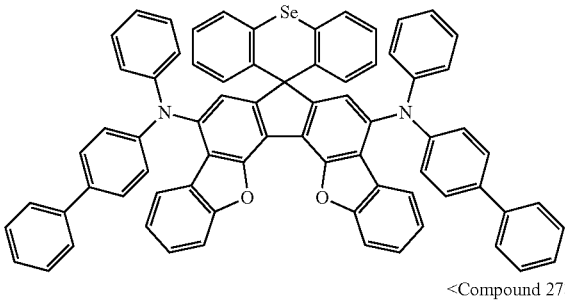
<Compound 27>
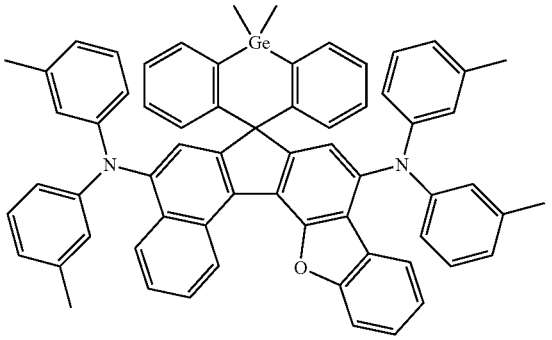
<Compound 28>
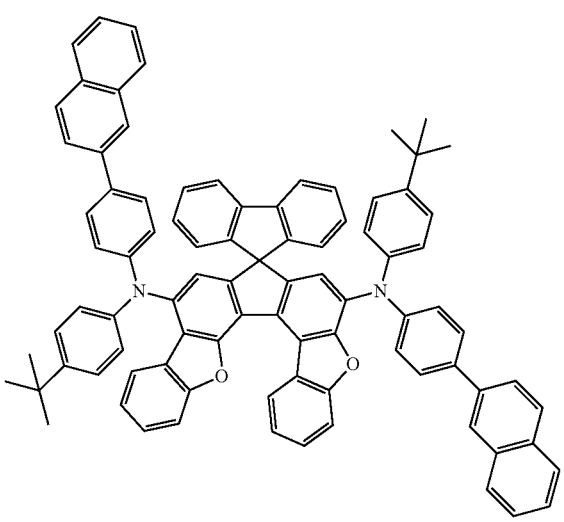

<Compound 29>
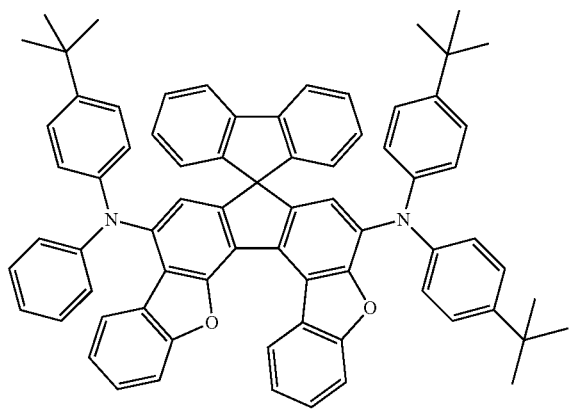
<Compound 30>
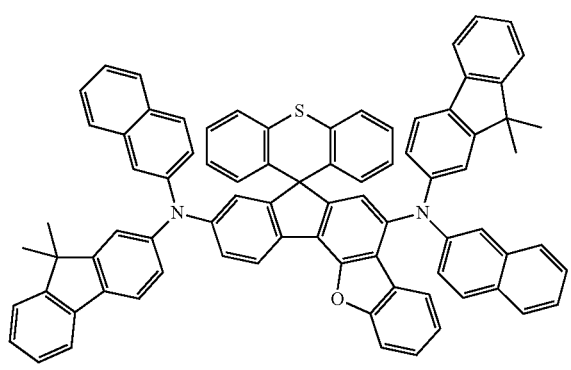
<Compound 31>
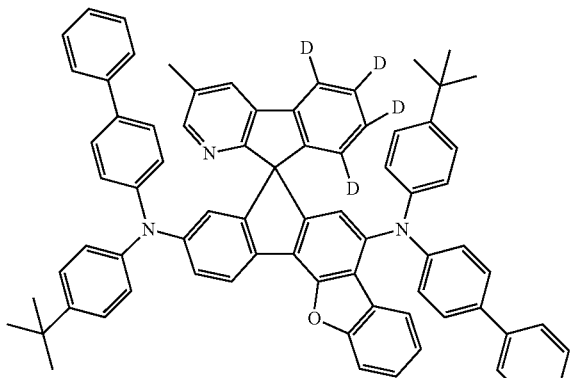
<Compound 32>
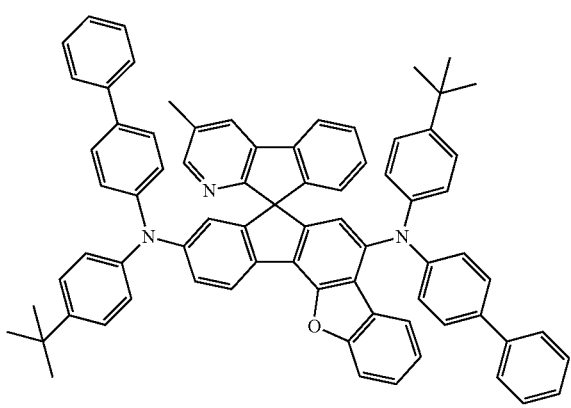
<Compound 33>
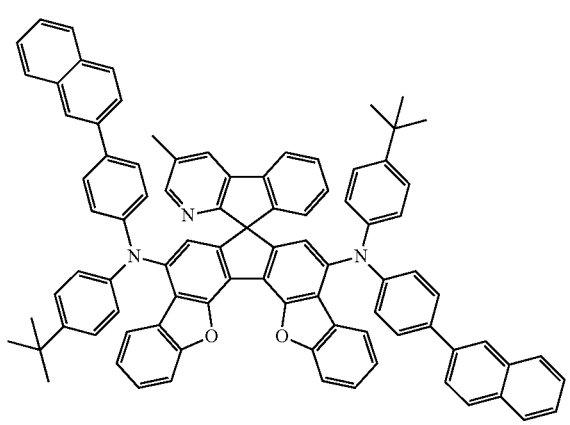
<Compound 34>
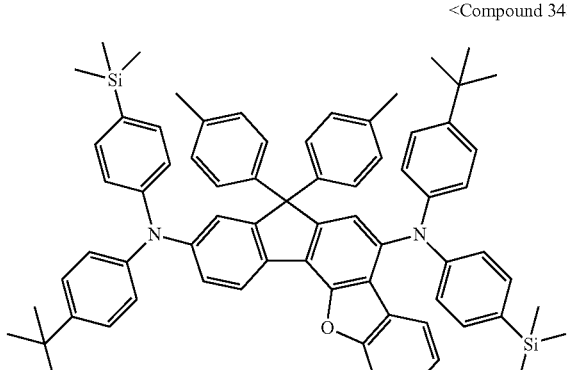
<Compound 35>
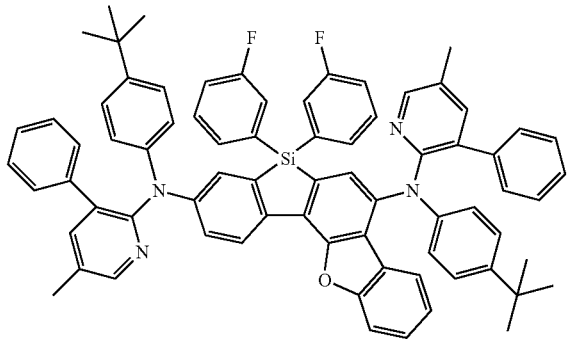
<Compound 36>
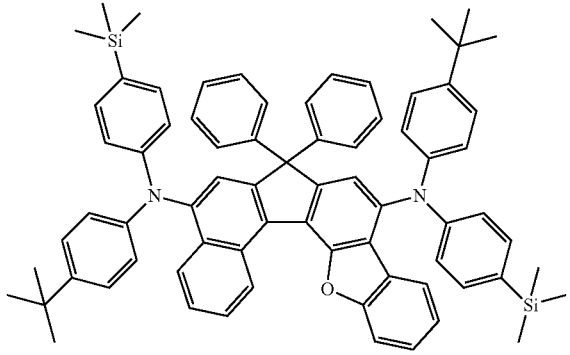

<Compound 37>
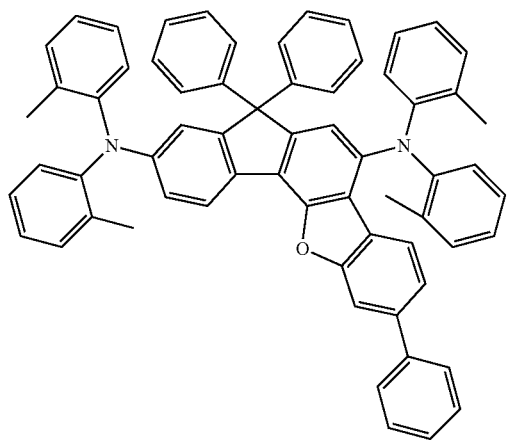
<Compound 40>
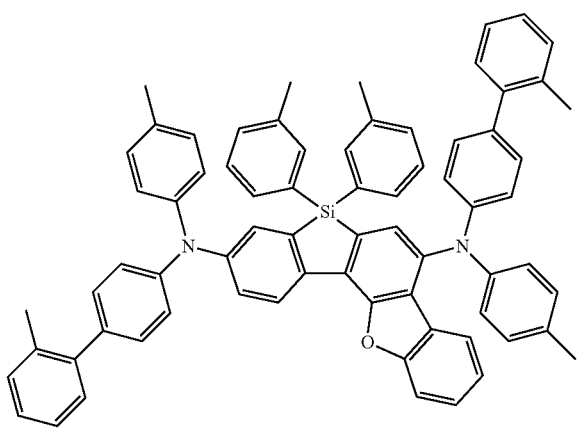
<Compound 38>
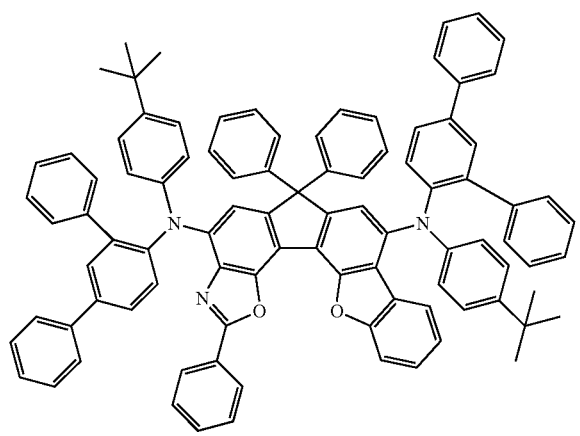
<Compound 41>
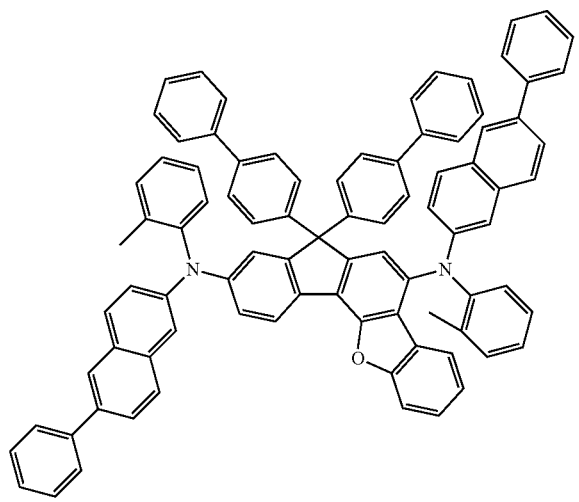
<Compound 39>
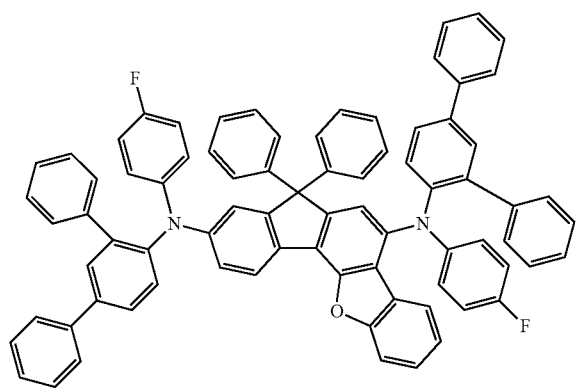
<Compound 42>
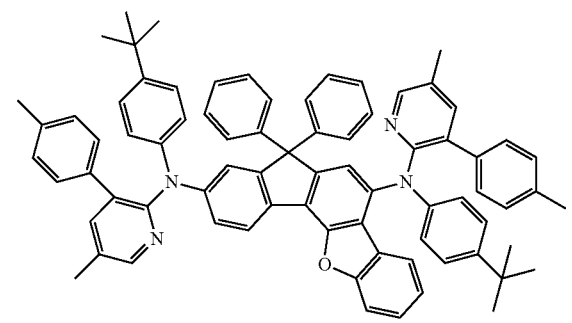

<Compound 43>
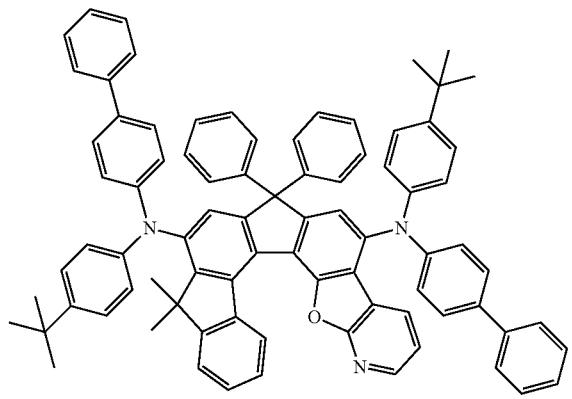
<Compound 44>
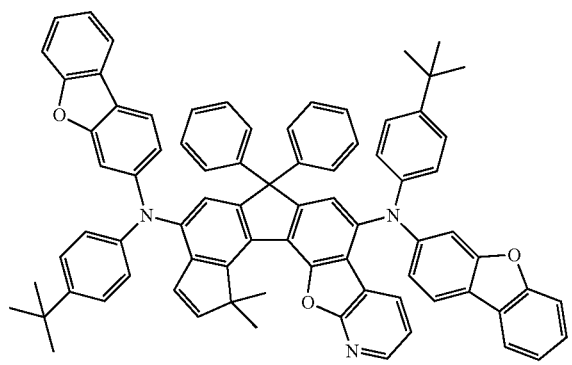
<Compound 45>
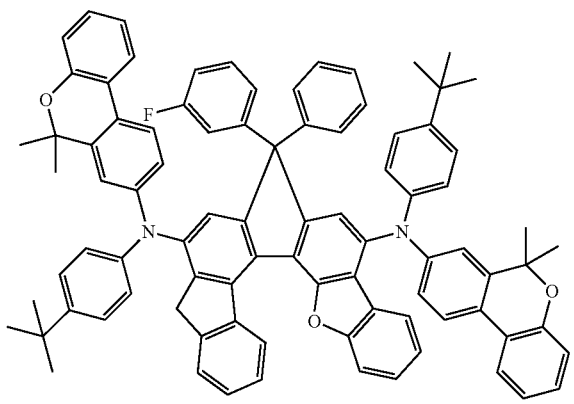
<Compound 46>
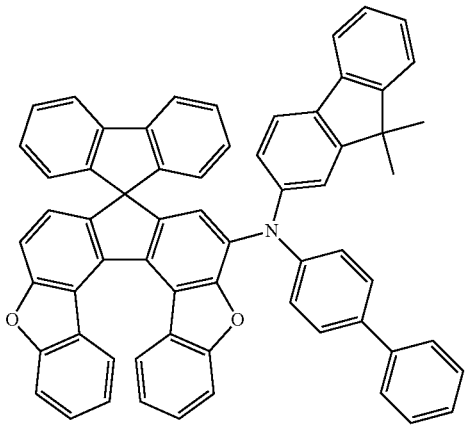
<Compound 47>
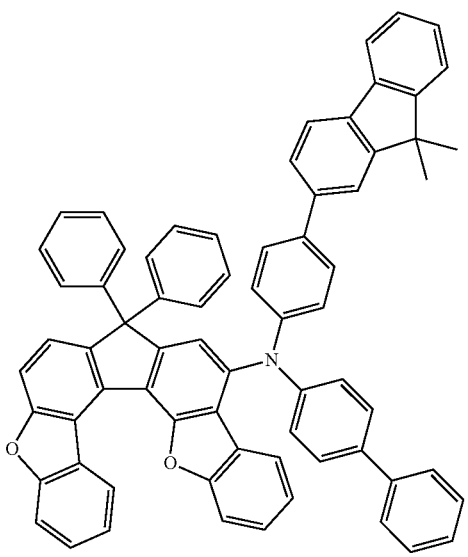
<Compound 48>
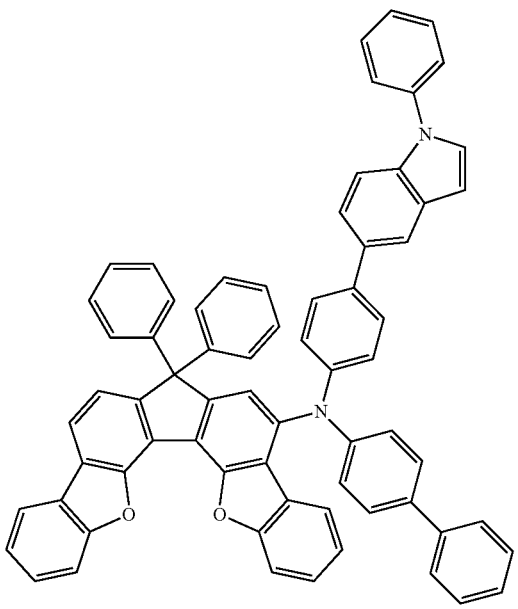

<Compound 49>
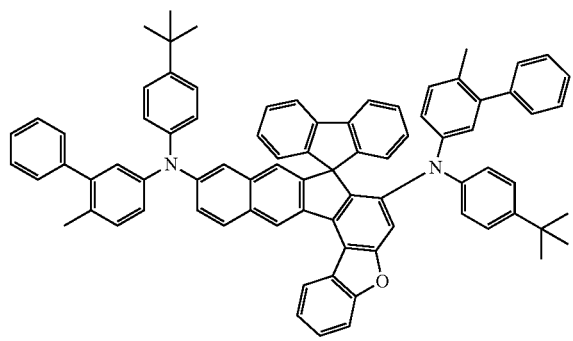
<Compound 50>
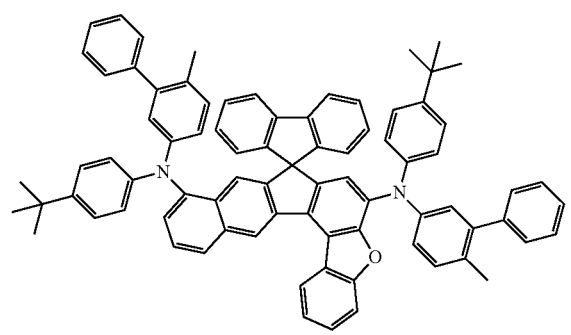
<Compound 51>
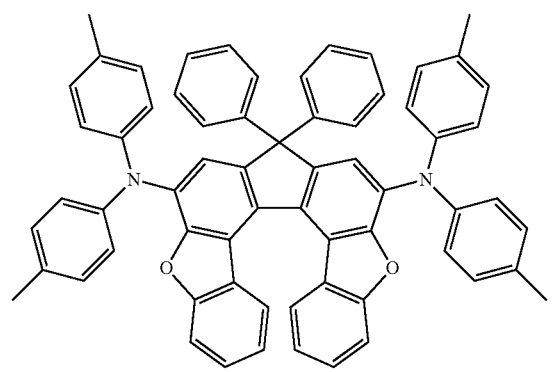
<Compound 52>
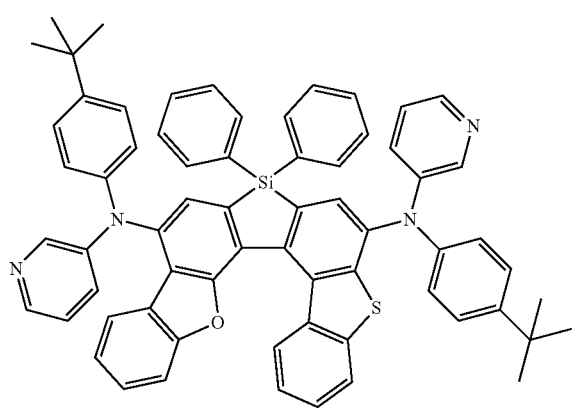
<Compound 53>
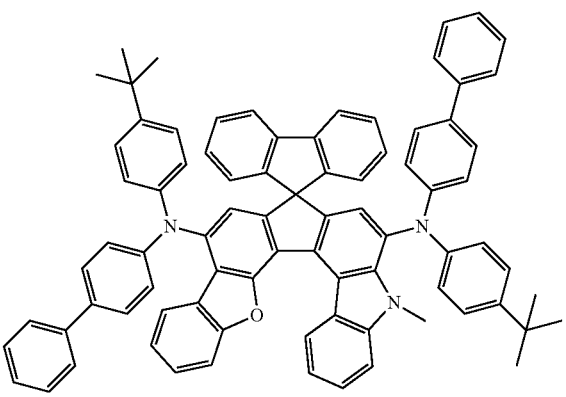
<Compound 54>
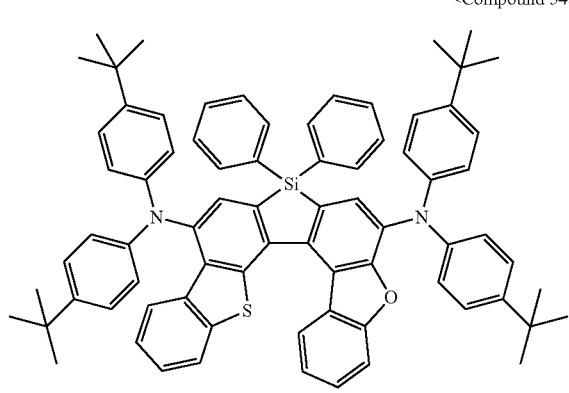
<Compound 55>
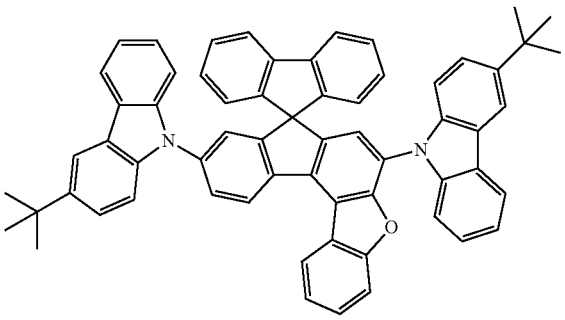
<Compound 56>
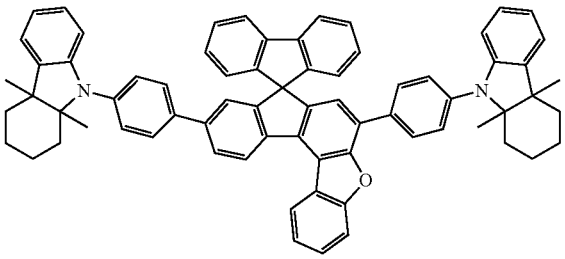

<Compound 57>
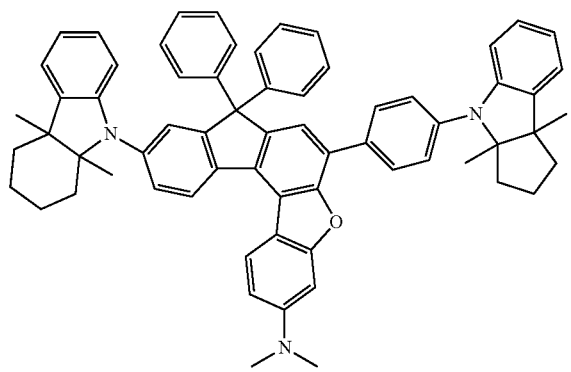

<Compound 60>
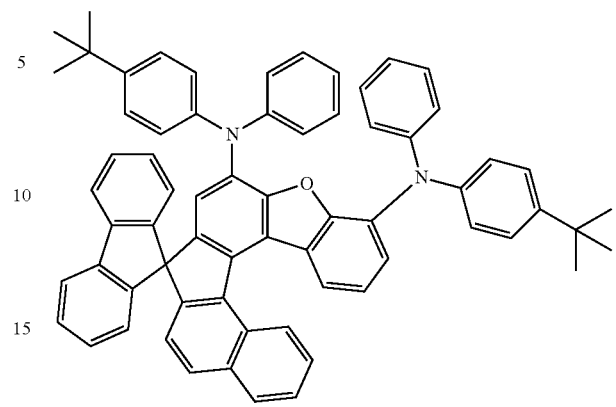

The compound represented by one of Chemical Formula H1 to H7 may be any one organic compound selected from among the following Compounds 101 to 199.

Compounds 101 to 199 are each used as a host in the present disclosure and correspond to those that are known in the art or which can be obtained from known compounds by simply changing substituents.

<Compound 58>
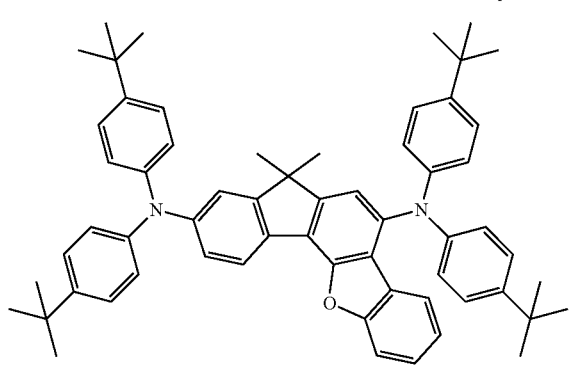

<Compound 101>
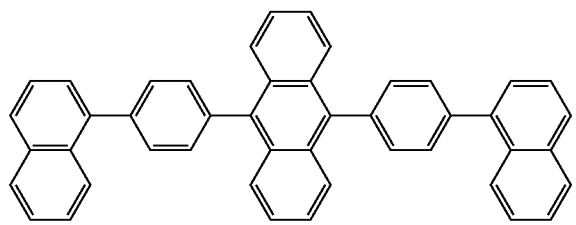

<Compound 102>
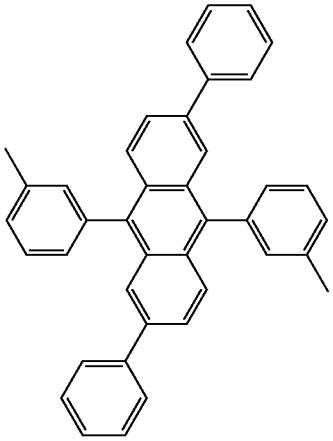

<Compound 59>
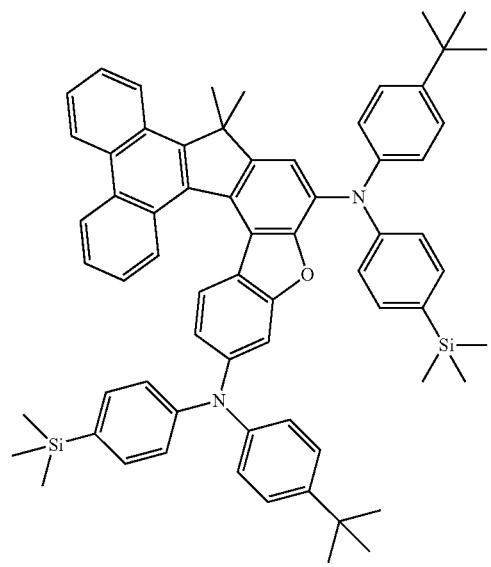

<Compound 103>
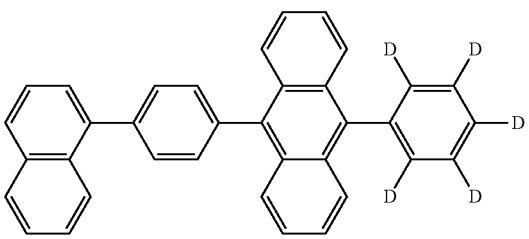

<Compound 104>
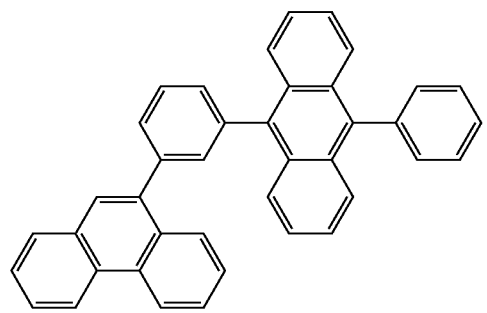
<Compound 105>
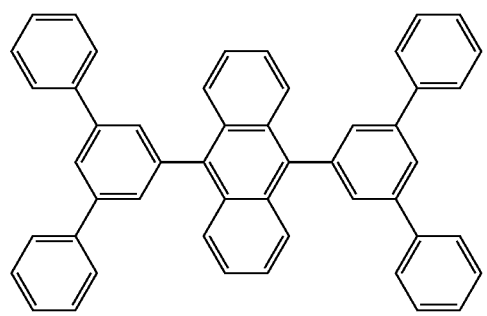
<Compound 106>
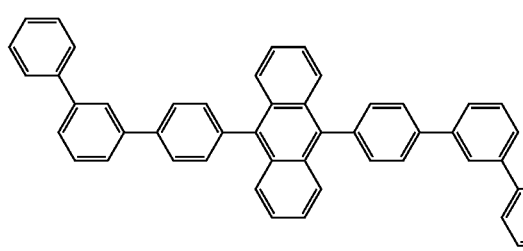
<Compound 107>
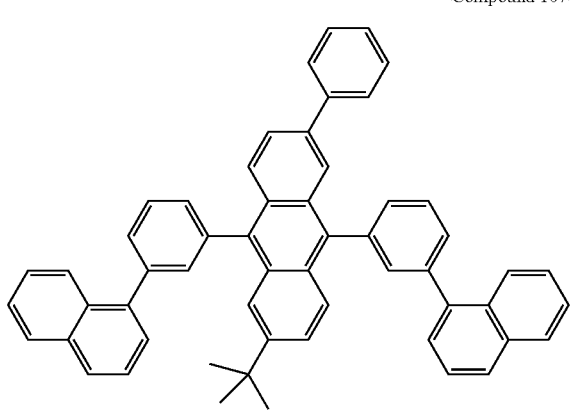
<Compound 108>
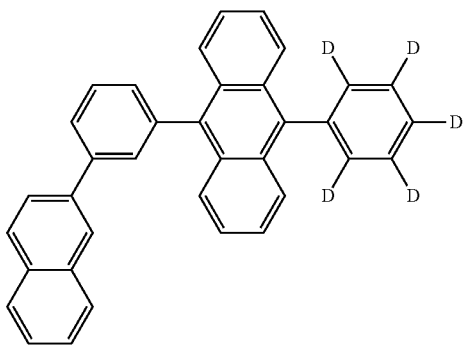
<Compound 109>
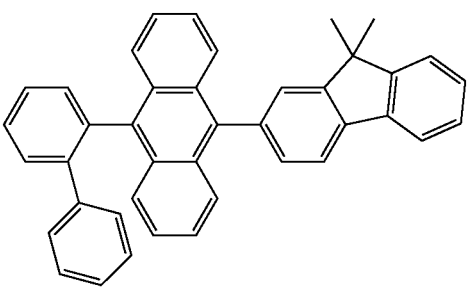
<Compound 110>
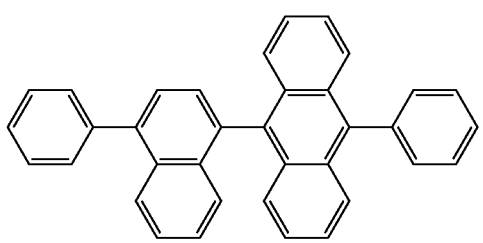
<Compound 111>
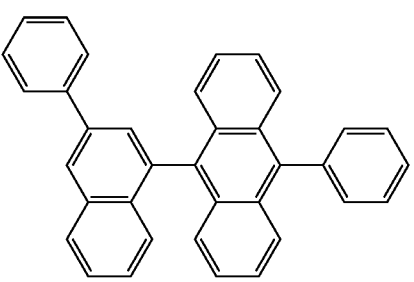
<Compound 112>
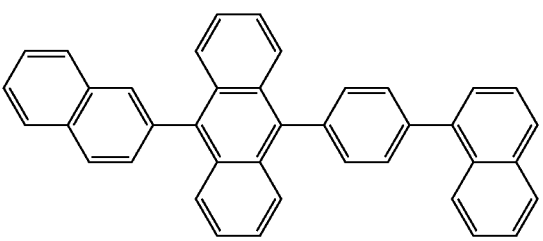

<Compound 113>
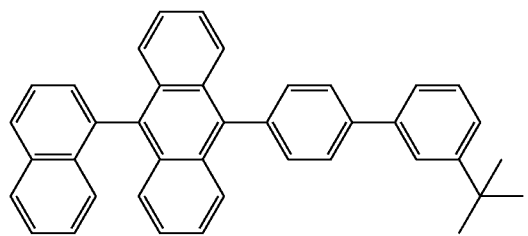
<Compound 114>
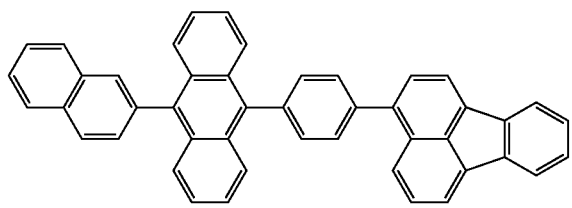
<Compound 115>
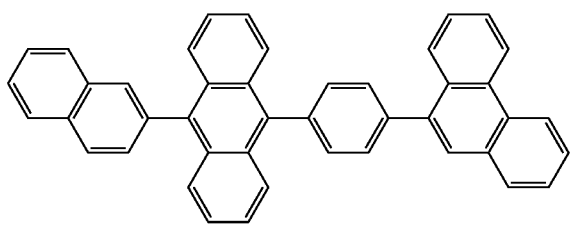
<Compound 116>
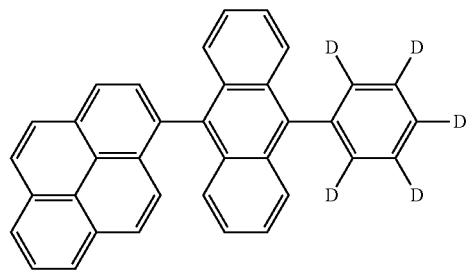
<Compound 117>
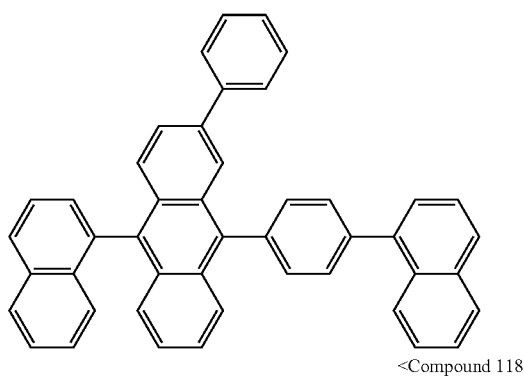
<Compound 119>
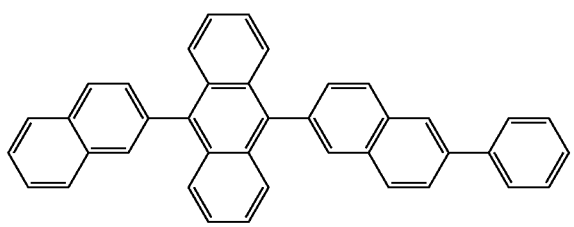
<Compound 120>
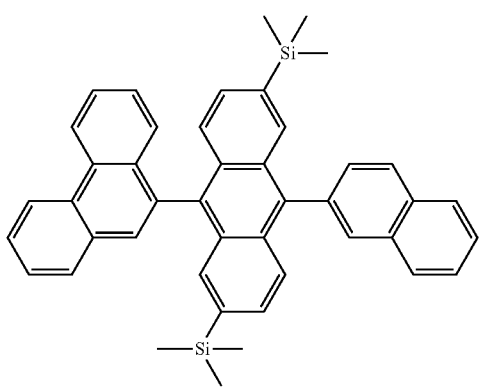
<Compound 121>
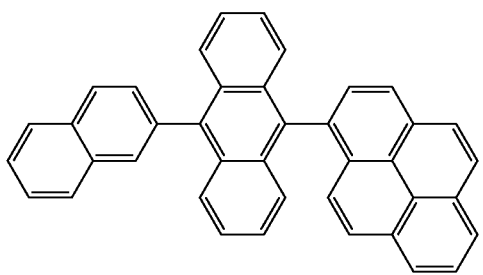
<Compound 122>
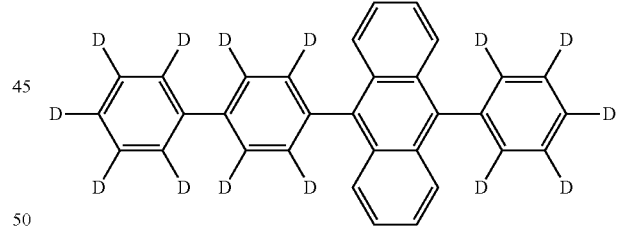
<Compound 123>
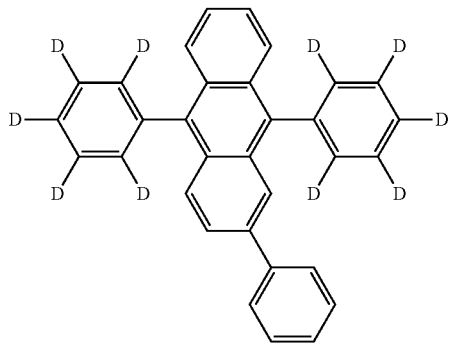

<Compound 124>
<Compound 125>
<Compound 126>
<Compound 127>
<Compound 128>
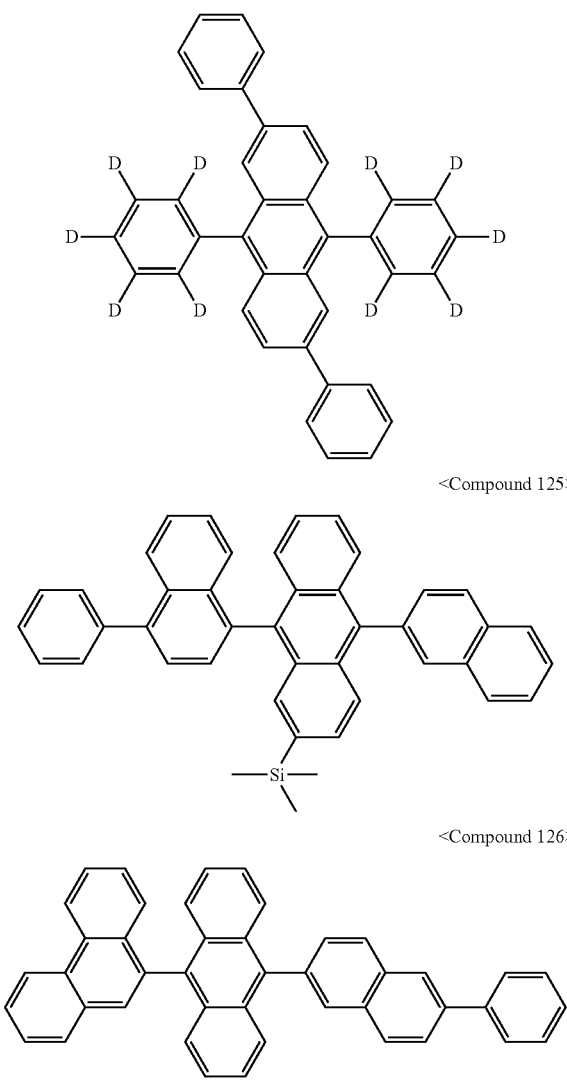
<Compound 129>
<Compound 130>
<Compound 131>
<Compound 132>
<Compound 133>
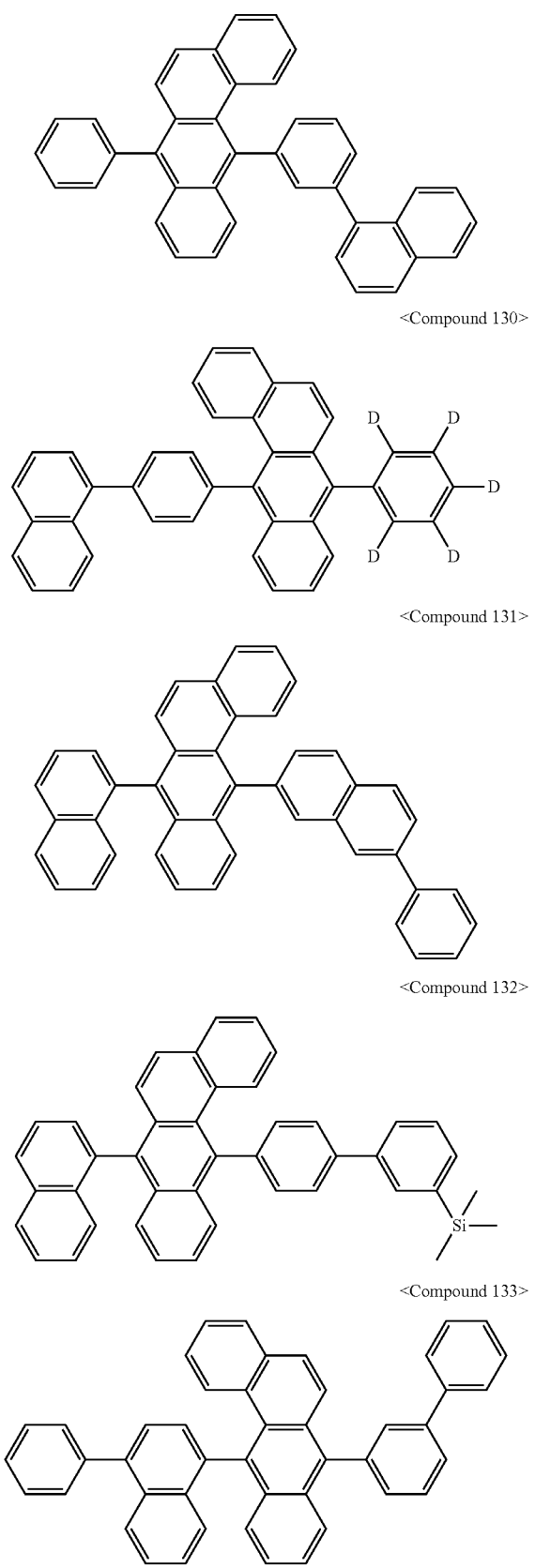

<Compound 134>
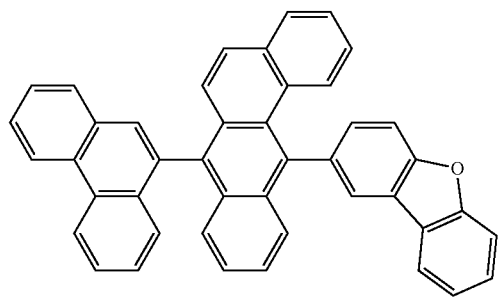
<Compound 135>
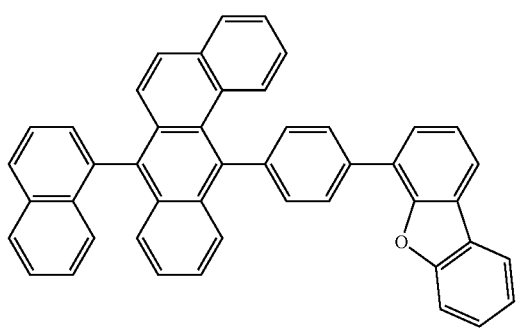
<Compound 136>
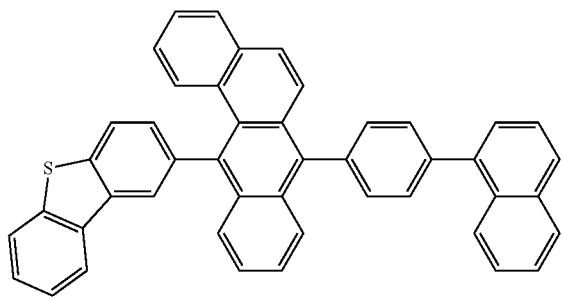
<Compound 137>
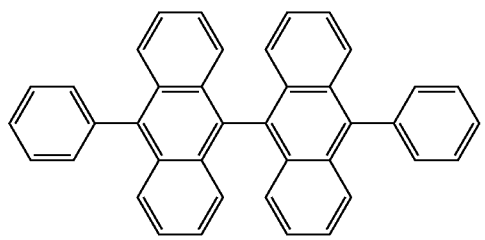
<Compound 138>
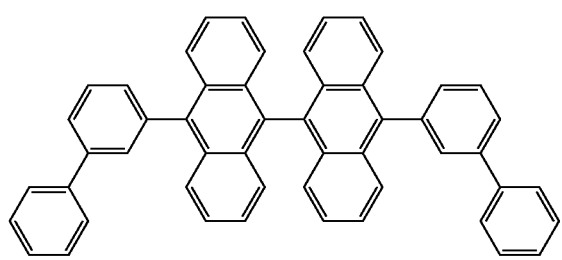
<Compound 139>
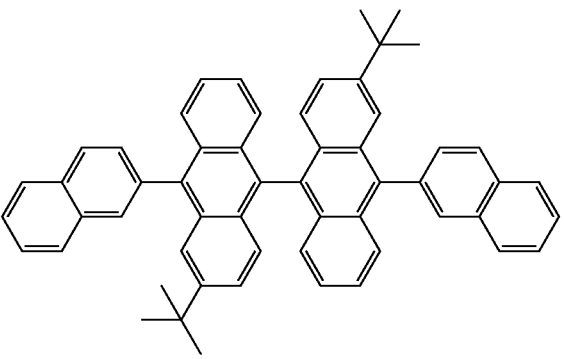
<Compound 140>
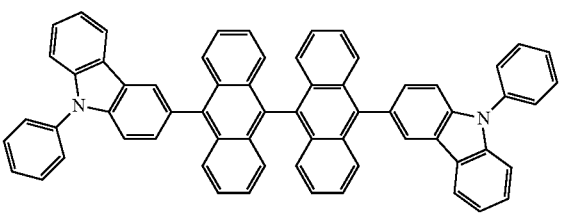
<Compound 141>
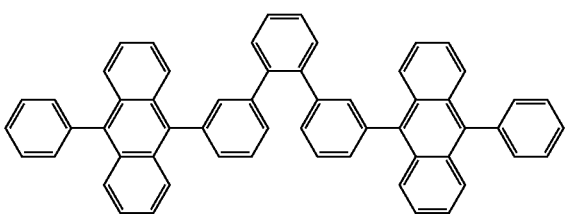
<Compound 142>
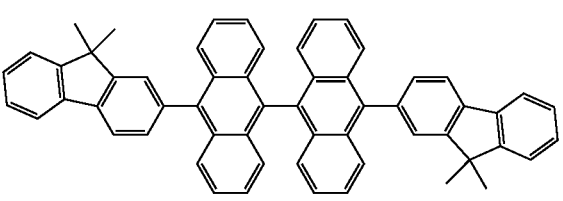
<Compound 143>
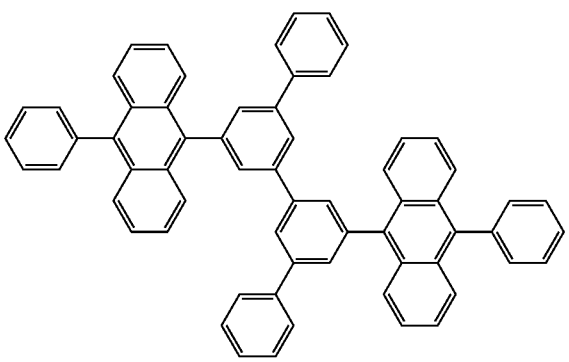

<Compound 144>
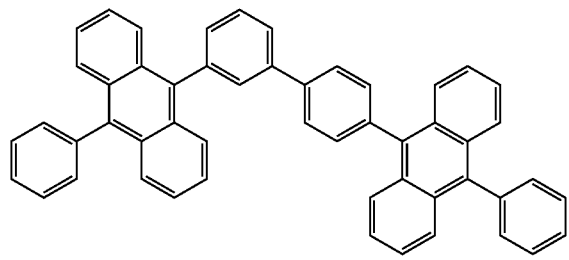
<Compound 145>
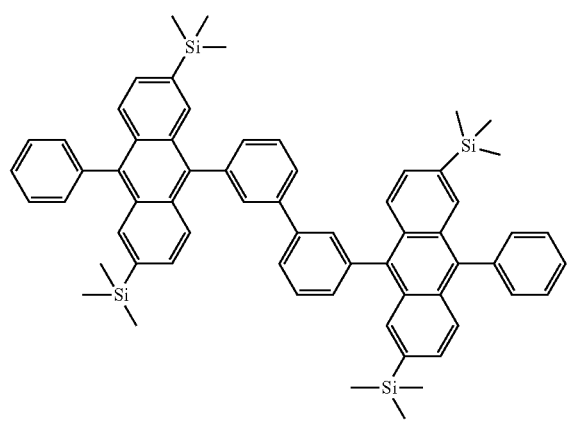
<Compound 146>
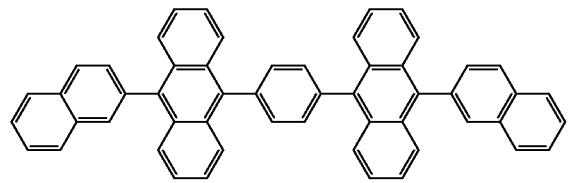
<Compound 147>
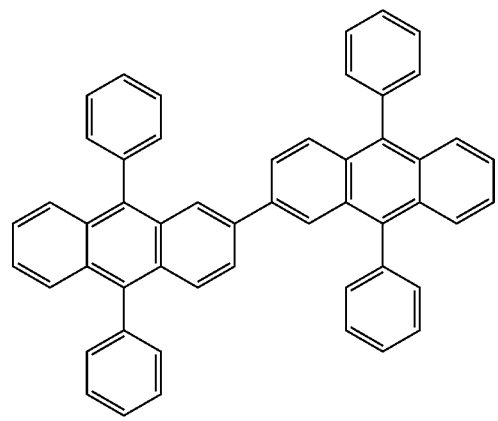
<Compound 148>
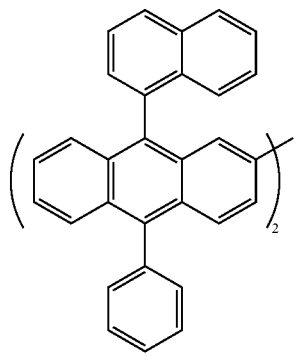
<Compound 149>
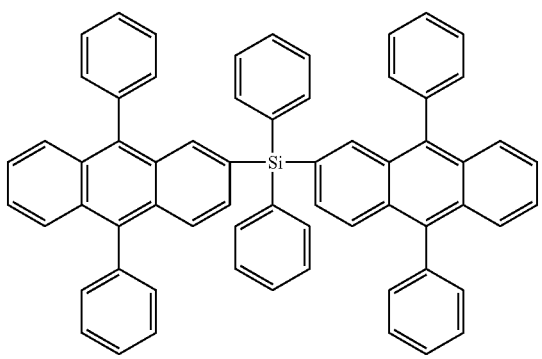
<Compound 150>
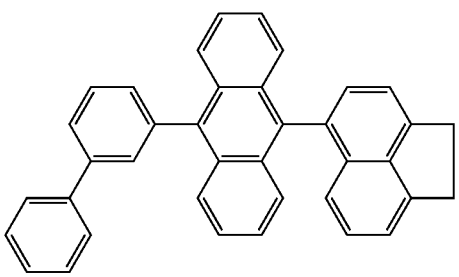
<Compound 151>
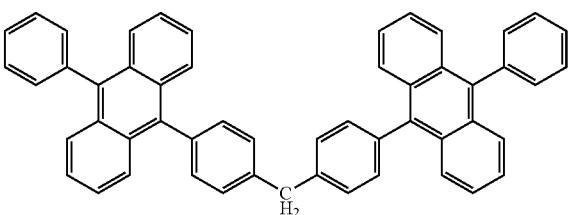
<Compound 152>
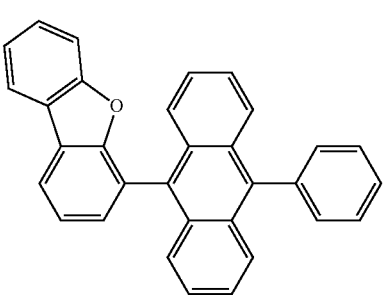

<Compound 153>
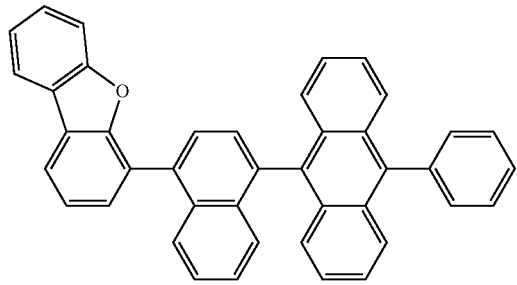
<Compound 154>
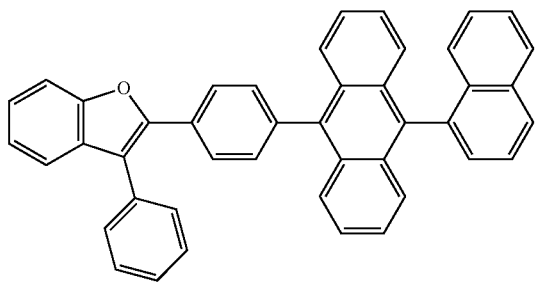
<Compound 155>
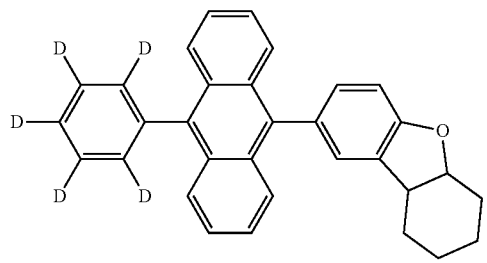
<Compound 156>
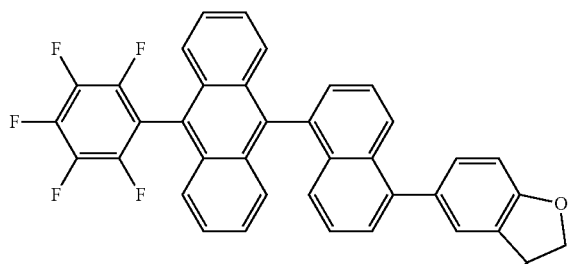
<Compound 157>
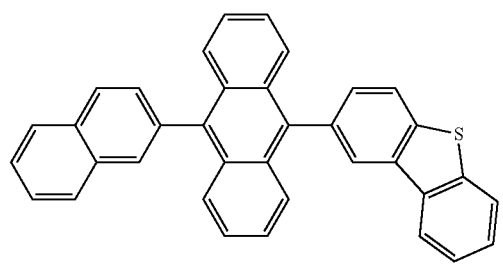
<Compound 158>
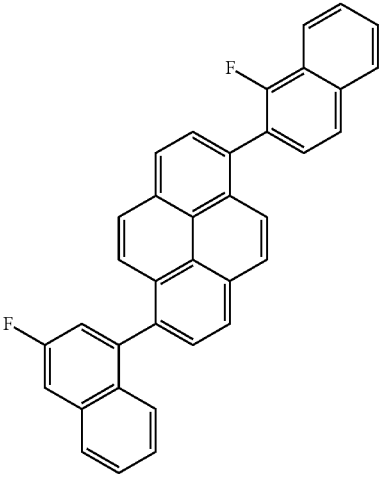
<Compound 159>
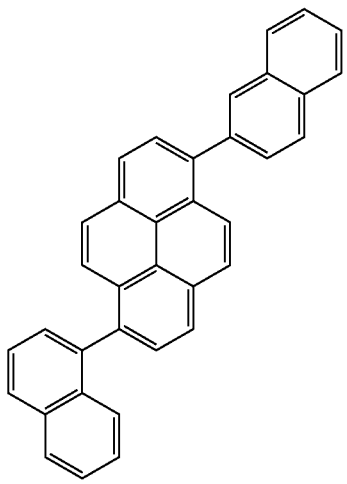
<Compound 160>
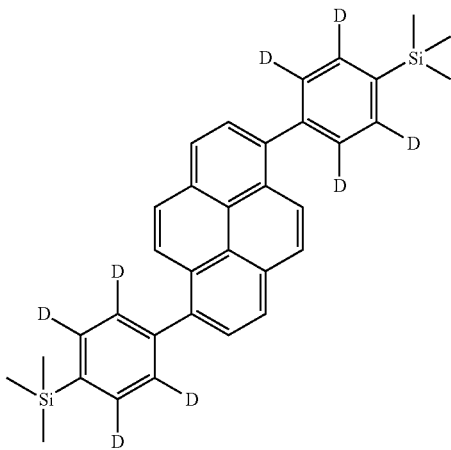

<Compound 161>
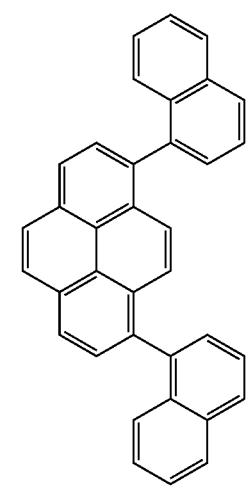
<Compound 162>
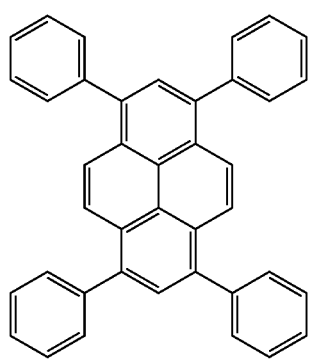
<Compound 163>
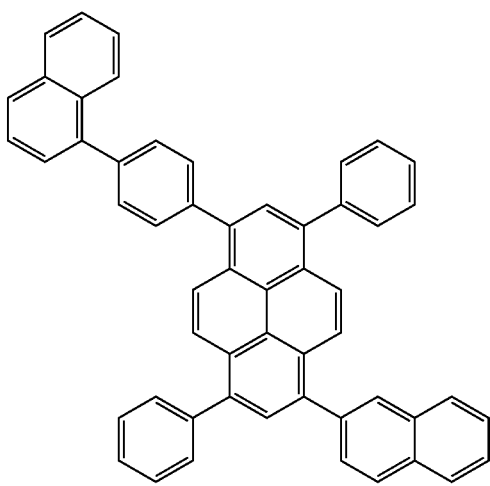
<Compound 164>
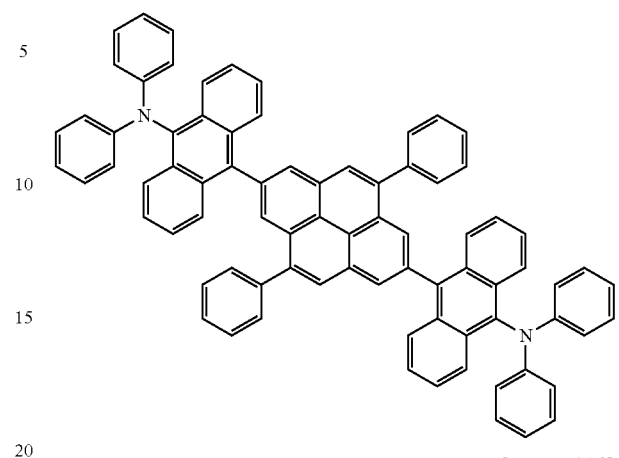
<Compound 165>
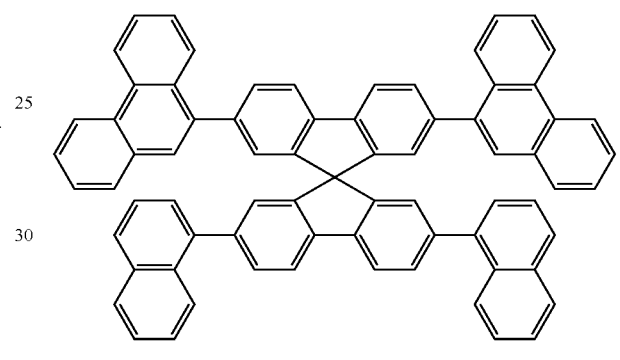
<Compound 166>
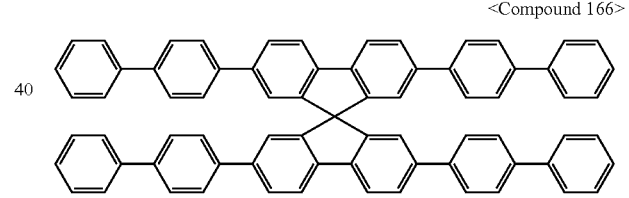
<Compound 167>
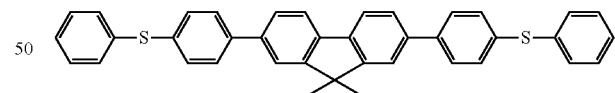
<Compound 168>
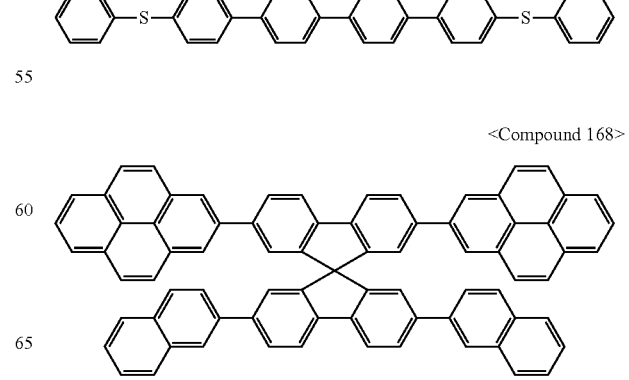

<Compound 169>
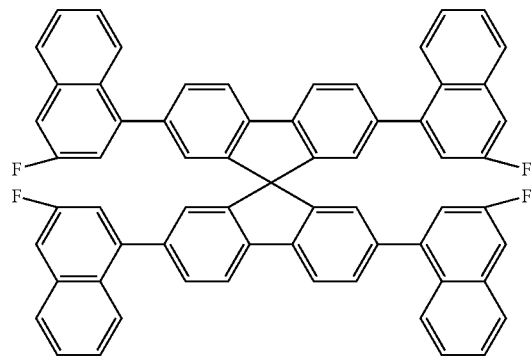
<Compound 170>
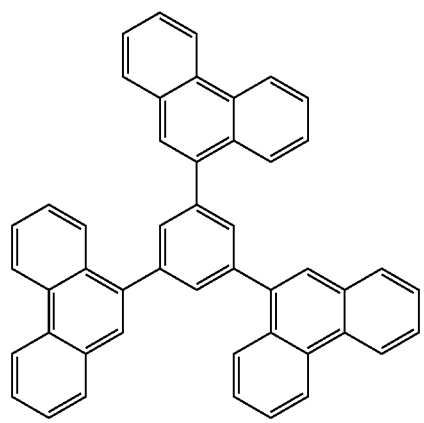
<Compound 171>
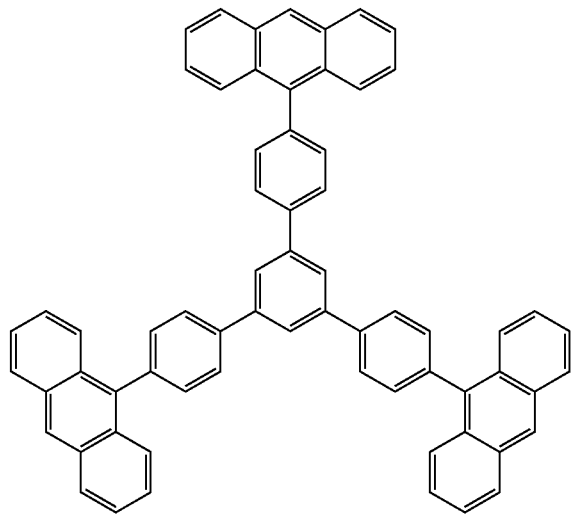
<Compound 172>
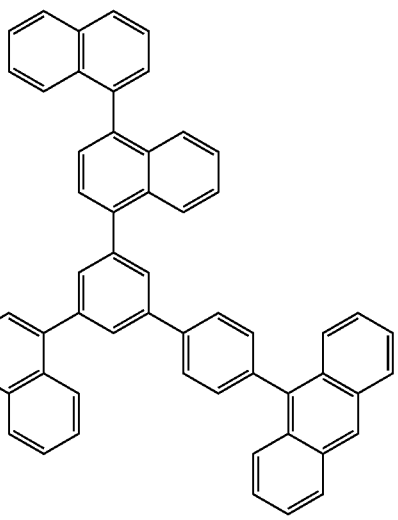
<Compound 173>
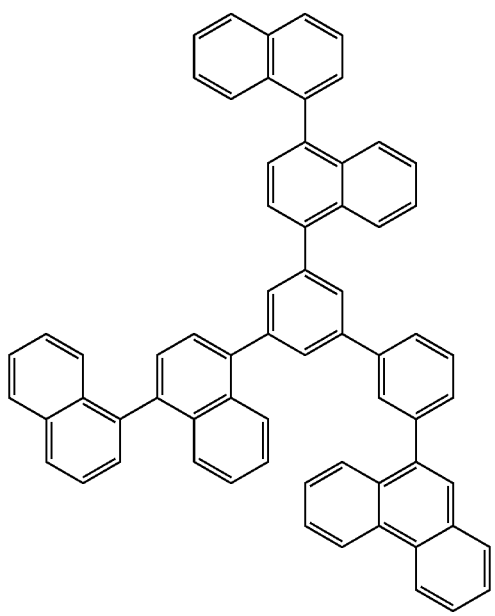

<Compound 174>
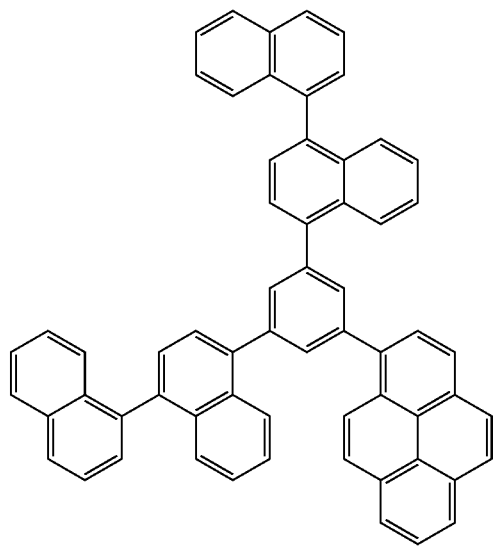
<Compound 175>
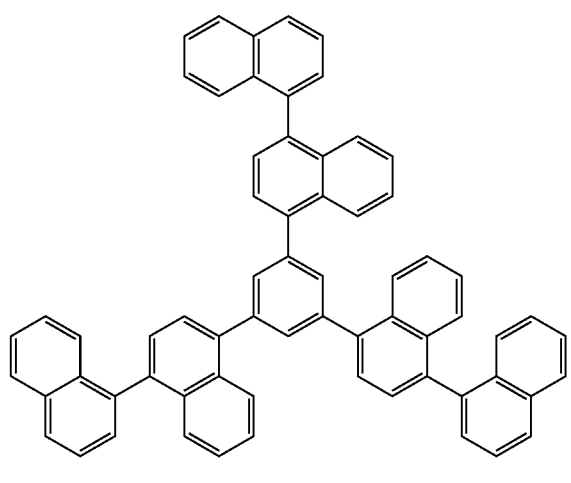
<Compound 176>
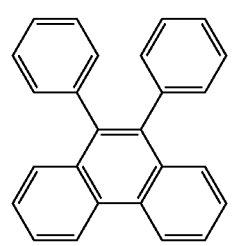
<Compound 177>
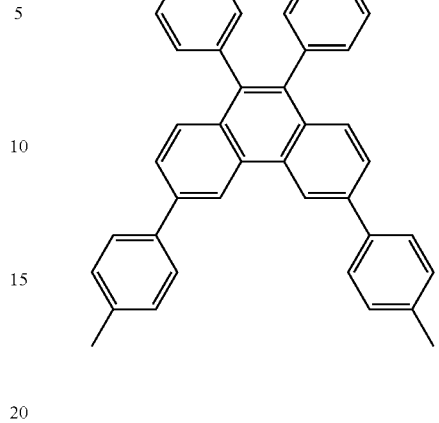
<Compound 178>
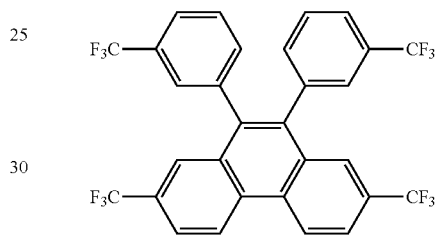
<Compound 179>
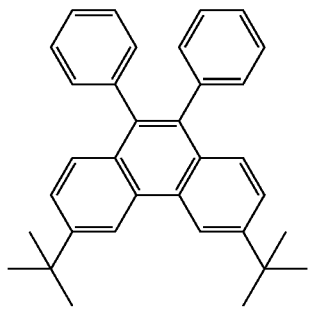
<Compound 180>
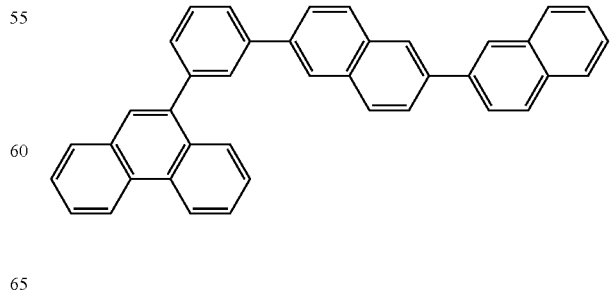

<Compound 181>
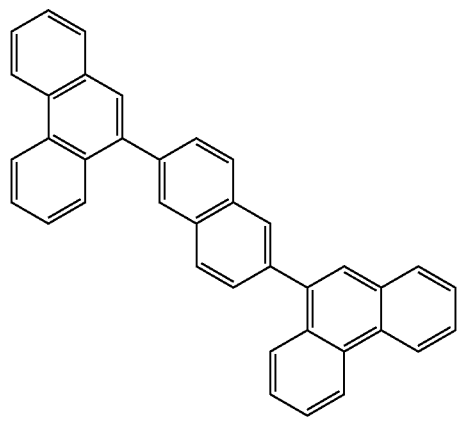
<Compound 182>
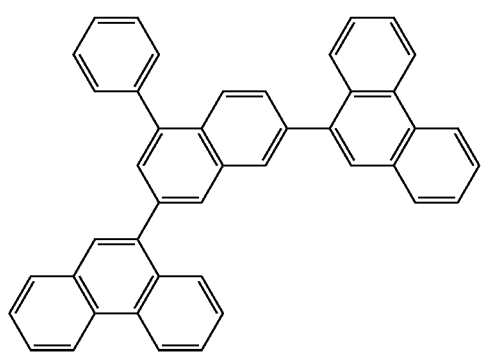
<Compound 183>
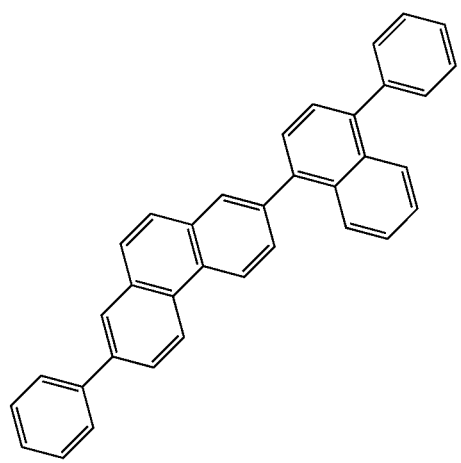
<Compound 184>
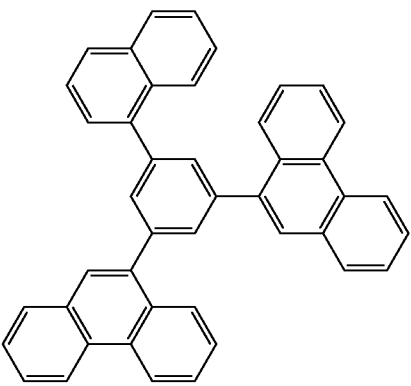
<Compound 185>
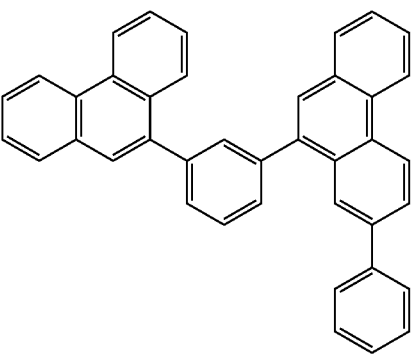
<Compound 186>
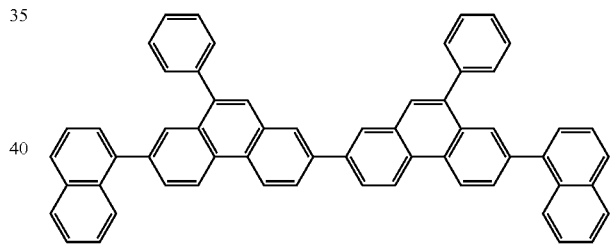
<Compound 187>
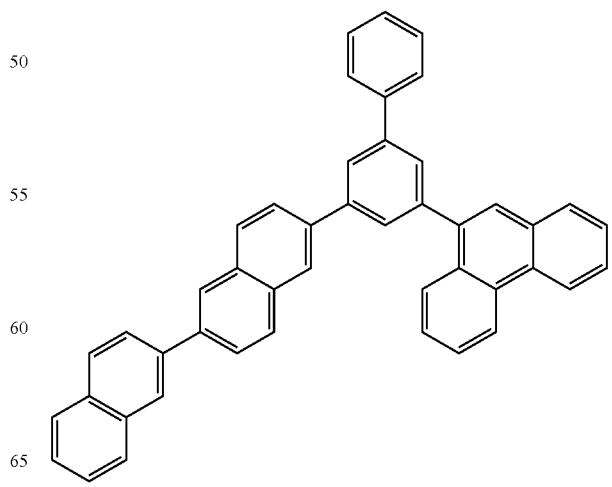

<Compound 188>
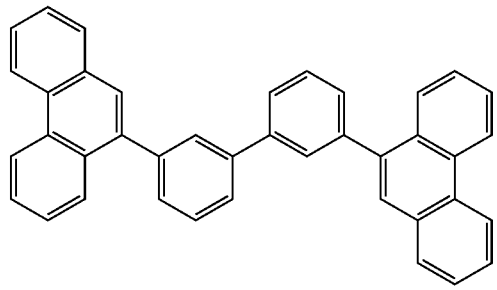
<Compound 189>
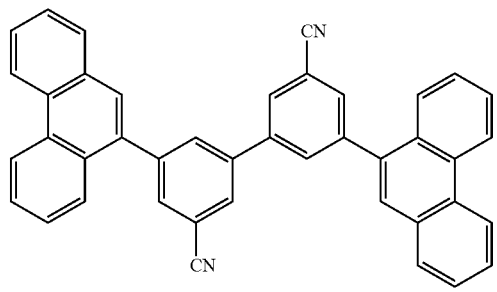
<Compound 190>
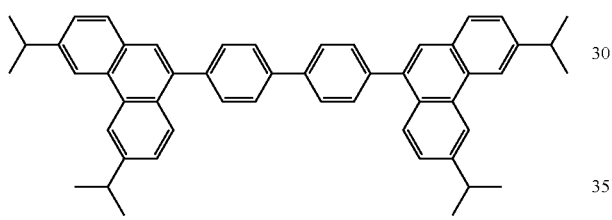
<Compound 191>
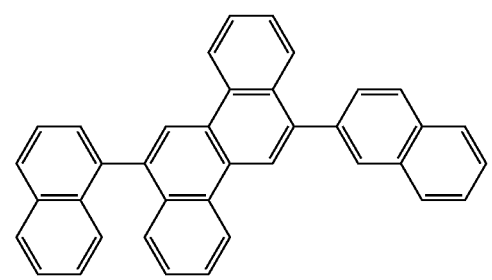
<Compound 192>
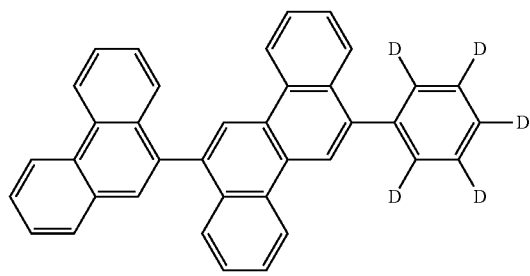
<Compound 193>
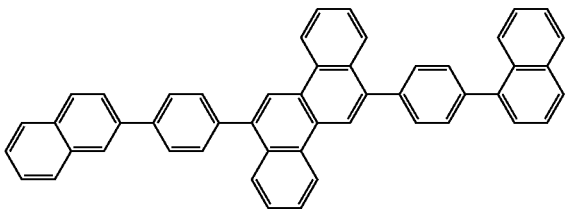
<Compound 194>
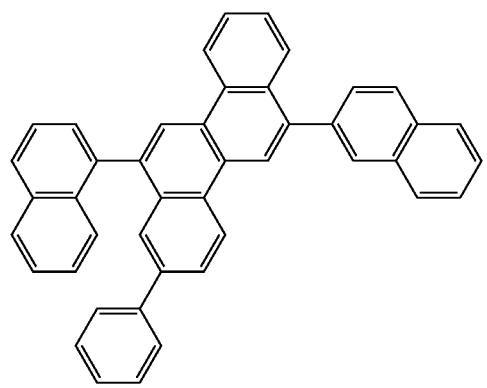
<Compound 195>
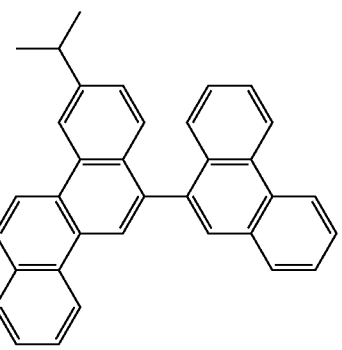
<Compound 196>
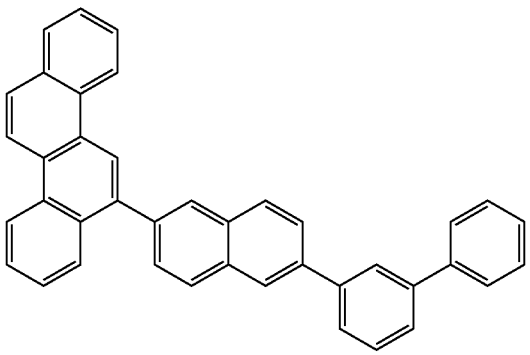

<Compound 197>
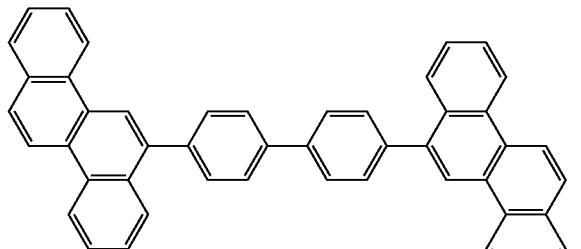

<Compound 198>
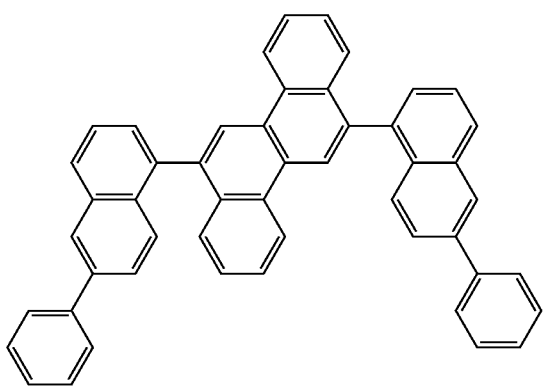

<Compound 199>
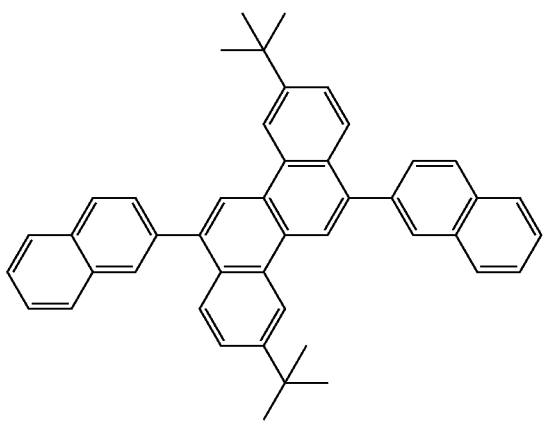

In accordance with more particular embodiments thereof, the present disclosure addresses an organic light-emitting diode, comprising a first electrode, a second electrode facing the first electrode, and an organic layer interposed therebetween, wherein the organic layer includes a light emitting layer containing as a host at least one of the amine compounds represented by Chemical Formula A or B and as a dopant at least one of the compounds represented by Chemical Formulas H1 to H7.

As used herein, the expression "(the organic layer) . . . comprising at least one organic compound" is construed to mean that the organic layer may comprise one organic compound falling within the scope of the present disclosure or two or more different compounds falling within the scope of the present disclosure.

The amount of the dopant in the light emitting layer may range from about 0.01 to about 20 weight parts, based on 100 weight parts of the host, but is not limited thereto.

In addition to the above-mentioned dopants and hosts, the light-emitting layer may further include various hosts and dopant materials.

Selection of an appropriate amine compound represented by Chemical Formula A or B as a dopant and an appropriate compound represented by one of Chemical Formulas H1 to H7 as a host in the light-emitting layer can impart high light emission efficiency and longevity to the light-emitting diode of the present disclosure, and can control color coordinate CIEy values of the light emitted from the light-emitting layer.

In some embodiments of the present disclosure, the organic light-emitting diode may comprise two or more light-emitting layers which include at least one layer employing a phosphorescent material and at least one layer employing as a dopant the compound represented by Chemical Formula A or B and as a host at least one selected from among the compounds of Chemical Formulas H1 to H7.

According to some particular embodiments of the present disclosure, the organic light-emitting diode may comprise at least one of a hole injection layer, a hole transport layer, a functional layer capable of both hole injection and hole transport, an electron transport layer, and an electron injection layer, in addition to the light-emitting layer.

A material for use in the electron transport layer functions to stably carry the electrons injected from the electron injection electrode (cathode), and may be an electron transport material known in the art. Examples of the electron transport material known in the art include quinoline derivatives, particularly, tris(8-quinolinorate)aluminum (Alq3), TAZ, Balq, beryllium bis(benzoquinolin-10-olate) (Bebq2), ADN, Compound 201, Compound 202, BCP, and oxadiazole derivatives such as PBD, BMD, BND, etc., but are not limited thereto.

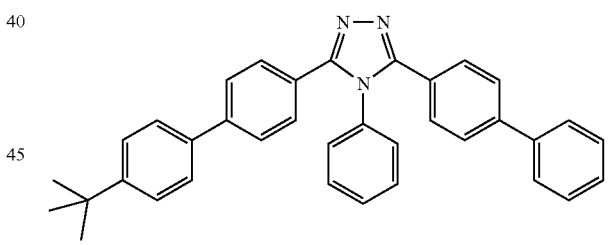

TAZ

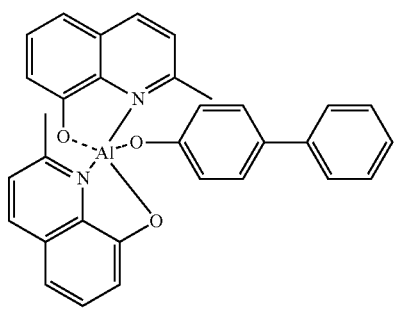

BAlq

-continued

<Compound 201>

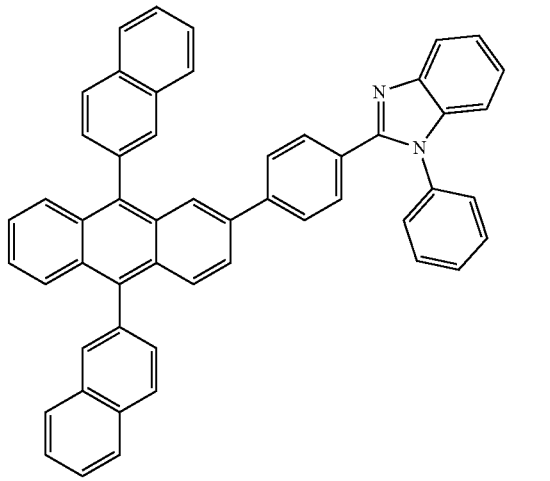

<Compound 202>

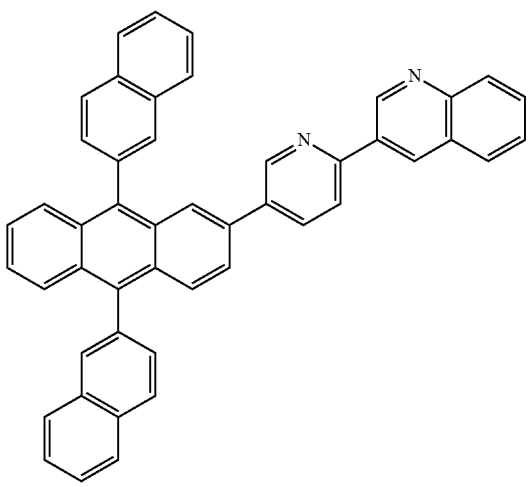

BCP

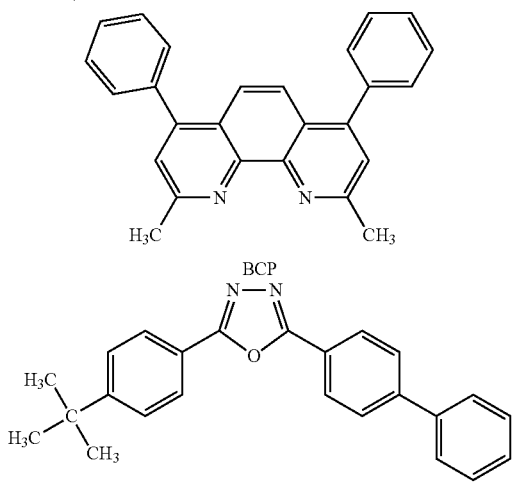

PBD

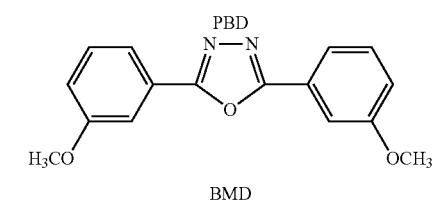

BMD

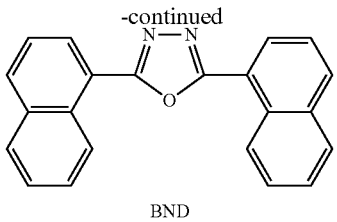

BND

Below, the organic light-emitting diode of the present disclosure is explained with reference to FIG. 1.

FIG. 1 is a schematic cross-sectional view of the structure of an organic light-emitting diode according to some embodiments of the present disclosure. The organic light-emitting diode comprises an anode 20, a hole transport layer 40, an organic light-emitting layer 50, an electron transport layer 60, and a cathode 80, and optionally a hole injection layer 30 and an electron injection layer 70. In addition, one or two intermediate layers may be further formed in the organic light-emitting diode, or a hole barrier layer or an electron barrier layer may also be employed.

Reference is made to FIG. 1 with regard to the fabrication of the organic light-emitting diode of the present disclosure. First, a substrate 10 is coated with an anode electrode material to form an anode 20. So long as it is used in a typical organic EL device, any substrate may be used as the substrate 10. Preferable is an organic substrate or transparent plastic substrate that exhibits excellent transparency, surface smoothness, and ease of handling. As the anode electrode material, indium tin oxide (ITO), indium zinc oxide (IZO), tin oxide ($SnO_2$), or zinc oxide (ZnO), which are transparent and superior in terms of conductivity, may be used.

A hole injection layer material is applied on the anode electrode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

No particular limitations are imposed on the hole injection layer material, as long as it is one that is typically used in the art. For example, mention may be made of 2-TNATA [4,4',4"-tris(2-naphthylphenyl-phenylamino)-triphenylamine], NPD [N,N'-di(1-naphthyl)-N,N'-diphenylbenzidine], TPD [N,N'-diphenyl-N,N'-bis(3-methylphenyl)-1,1'-biphenyl-4,4'-diamine], or DNTPD [N,N'-diphenyl-N,N'-bis-[4-(phenyl-m-tolyl-amino)-phenyl]-biphenyl-4,4'-diamine].

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenylbenzidine (a-NPD).

Then, an organic light-emitting layer 50 is deposited on the hole transport layer 40, optionally followed by the formation of a hole barrier layer (not shown) on the organic light-emitting layer 50 by deposition in a vacuum or by spin coating. When holes traverse the organic light-emitting layer and are introduced into the cathode, the efficiency and lifetime of the diode are deteriorated. Formed of a material with a low HOMO (Highest Occupied Molecular Orbital) level, the hole barrier layer serves to prevent the introduction of holes into the cathode. Any material that has a higher ionization potential than the light-emitting compound and which is also able to carry electrons may be used for the hole barrier layer without limitation. Representative among hole barrier materials are BAlq, BCP, and TPBI.

Using a vacuum deposition method or a spin-coating method, an electron transport layer 60 may be deposited on the hole barrier layer and may then be overlaid with an electron injection layer 70. A cathode metal is deposited on the electron injection layer 70 by thermal deposition in a vacuum to form a cathode 80, thus obtaining an organic EL diode. Here, the cathode may be made of lithium (Li), magnesium (Mg), aluminum (Al), aluminum-lithium (Al—Li), calcium (Ca), magnesium-indium (Mg—In), or magnesium-silver (Mg—Ag). For a top-emitting OLED, a transparent cathode made of ITO or IZO may be employed.

In some embodiments of the present disclosure, the light-emitting layer particularly ranges in thickness from 50 to 2,000 Å.

Further, one or more layers selected from among a hole injection layer, a hole transport layer, a functional layer capable of both hole injection and hole transport, an electron barrier layer, a light-emitting layer, a hole barrier layer, an electron transport layer, and an electron injection layer may be deposited using a single-molecule deposition process or a solution process. Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, and monochrome or grayscale flexible illumination devices.

A better understanding of the present disclosure may be obtained through the following examples which are set forth to illustrate, but are not to be construed as limiting the present disclosure.

EXAMPLES

Synthesis Example 1: Synthesis of Compound 1

Synthesis Example 1-(1): Synthesis of [Intermediate 1-a]

Intermediate 1-a was synthesized as illustrated in the following Reaction Scheme 1.

<Reaction Scheme 1>

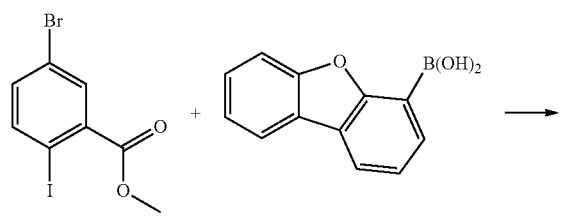

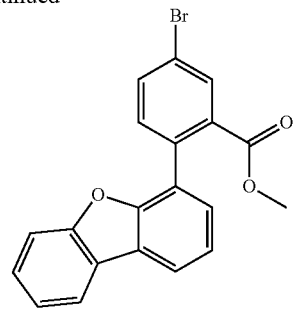

<Intermediate 1-a>

In a 500-mL round-bottom flask reactor, methyl 5-bromo-2-iodobenzoate (25.0 g, 73 mmol), 4-dibenzofuran boronic acid (18.7 g, 88 mmol), tetrakis (triphenylphosphine)palladium (1.7 g, 0.15 mmol), and potassium carbonate (20.2 g, 146.7 mmol) were stirred together with toluene (125 mL), tetrahydrofuran (125 mL), and water (50 mL) for 10 hrs at 80° C. After completion of the reaction, the reaction mixture was cooled to room temperature and extracted with ethyl acetate. The organic layer thus formed was separated, concentrated in a vacuum, and purified by column chromatography to afford <Intermediate 1-a>. (75.0 g, 60.1%).

Synthesis Example 1-(2): Synthesis of Intermediate 1-b

Intermediate 1-b was synthesized as illustrated in the following Reaction Scheme 2:

<Reaction Scheme 2>

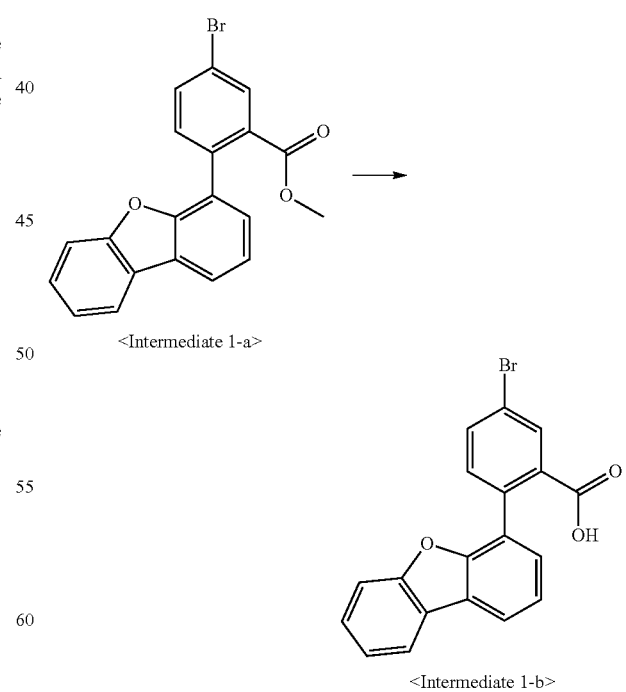

In a 500 mL round bottom flask reactor, <Intermediate 1-a> (17.0 g, 45 mmol), sodium hydroxide (2.14 g, 54 mmol) and ethanol (170 ml) were stirred together for 48 hrs under reflux. After the completion of the reaction was confirmed using thin layer chromatography, the reaction mixture was cooled to room temperature. The chilled solution was acidified with drops of 2 N HCl, followed by stirring for 30 min. The solid thus formed was filtered and then recrystallized in dichloromethane and n hexane to afford <Intermediate 1-b>. (14.5 g, 88.6%)

Synthesis Example 1-(3): Synthesis of Intermediate 1-c

Intermediate 1-c was synthesized as illustrated in the following Reaction Scheme 3:

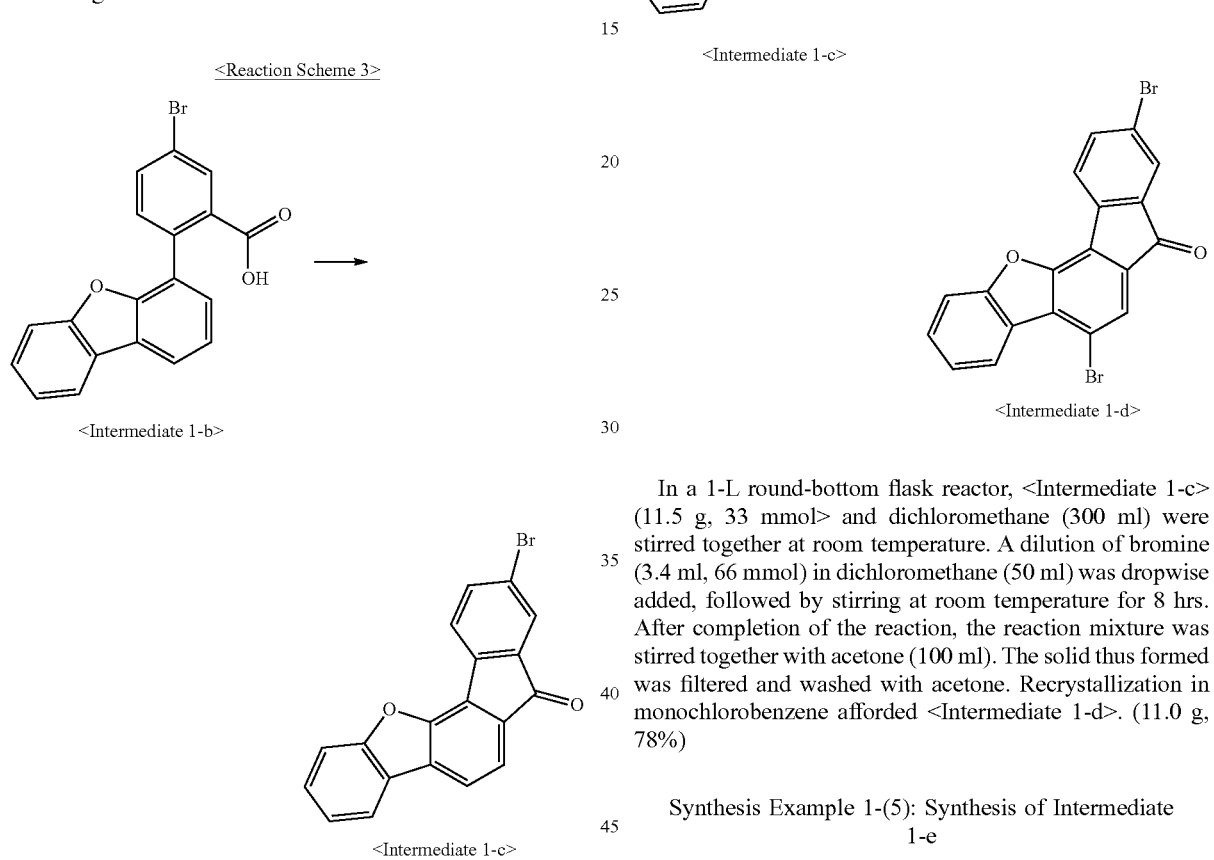

In a 250 mL round bottom flask reactor, <Intermediate 1-b> (14.5 g, 39 mmol) and methanesulfonic acid (145 ml) were stirred together for 3 hrs at 80° C. After the completion of the reaction was confirmed using thin layer chromatography, the reaction mixture was cooled to room temperature and dropwise added to ice water (150 ml). After stirring for 30 min, the solid thus formed was filtered and washed with water and methanol to afford <Intermediate 1-c>. (11.50 g, 83.4%)

Synthesis Example 1-(4): Synthesis of Intermediate 1-d

Intermediate 1-d was synthesized as illustrated in the following Reaction Scheme 4:

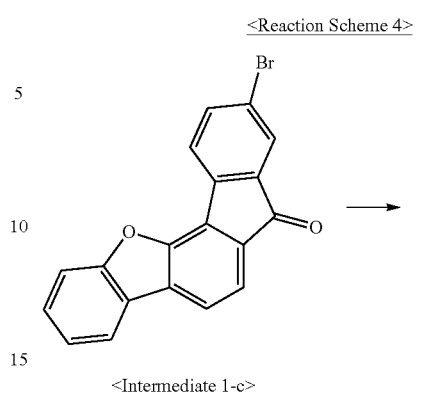

In a 1-L round-bottom flask reactor, <Intermediate 1-c> (11.5 g, 33 mmol> and dichloromethane (300 ml) were stirred together at room temperature. A dilution of bromine (3.4 ml, 66 mmol) in dichloromethane (50 ml) was dropwise added, followed by stirring at room temperature for 8 hrs. After completion of the reaction, the reaction mixture was stirred together with acetone (100 ml). The solid thus formed was filtered and washed with acetone. Recrystallization in monochlorobenzene afforded <Intermediate 1-d>. (11.0 g, 78%)

Synthesis Example 1-(5): Synthesis of Intermediate 1-e

Intermediate 1-e was synthesized as illustrated in the following Reaction Scheme 5:

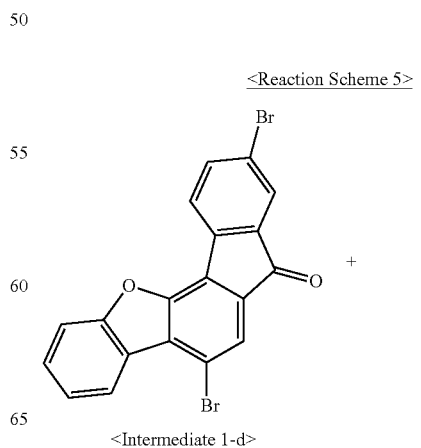

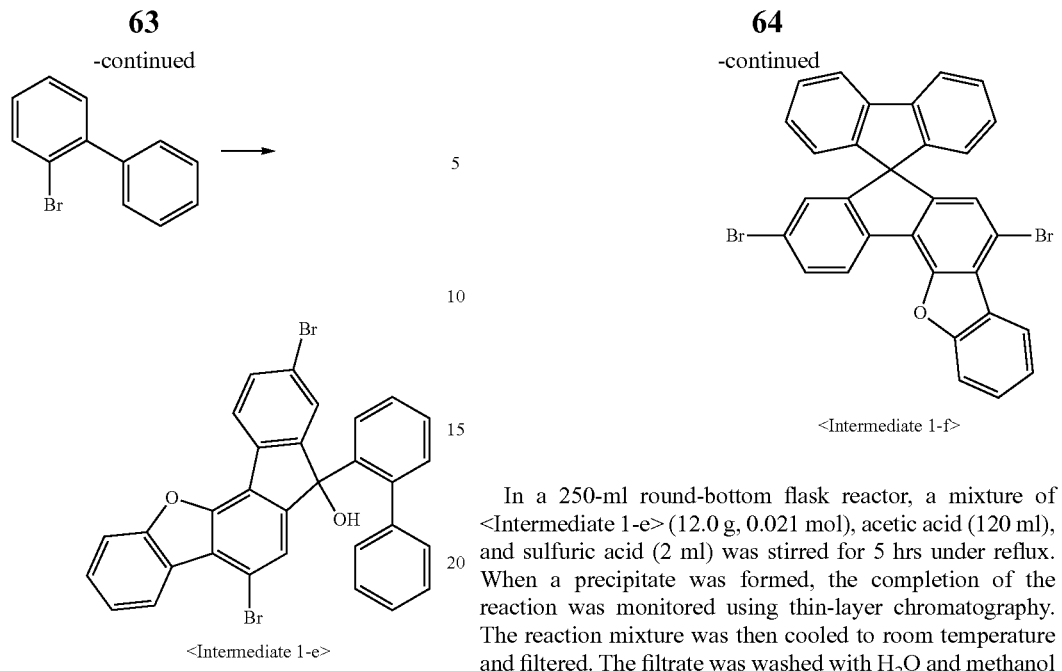

<Intermediate 1-f>

In a 250-ml round-bottom flask reactor, a mixture of <Intermediate 1-e> (12.0 g, 0.021 mol), acetic acid (120 ml), and sulfuric acid (2 ml) was stirred for 5 hrs under reflux. When a precipitate was formed, the completion of the reaction was monitored using thin-layer chromatography. The reaction mixture was then cooled to room temperature and filtered. The filtrate was washed with $H_2O$ and methanol and dissolved in monochlorobenzene. Following silica gel chromatography, the fraction was concentrated and cooled to room temperature to give <Intermediate 1-f>. (10.7 g, 90%>

Synthesis Example 1-(7): Synthesis of Compound 1

The Compound 1 was synthesized as illustrated in the following Reaction Scheme 7:

<Reaction Schme 7>

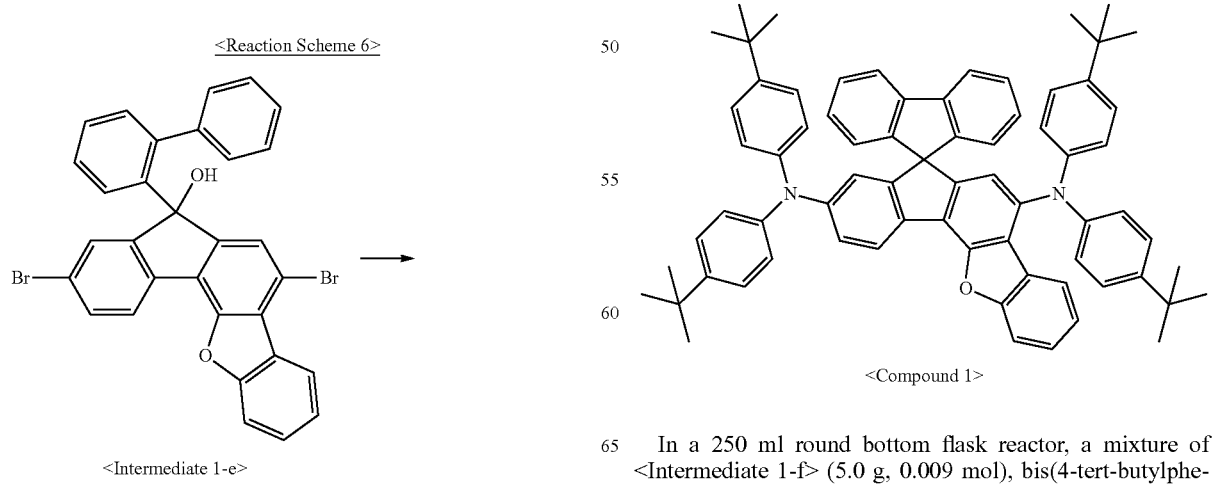

<Compound 1>

In a 250 ml round bottom flask reactor, a mixture of <Intermediate 1-f> (5.0 g, 0.009 mol), bis(4-tert-butylphenyl)amine (6.0 g, 0.021 mol), palladium (II) acetate (0.08 g, In a 250-ml round-bottom flask reactor, 2-bromobiphenyl (8.4 g, 0.036 mol) and tetrahydrofuran (110 ml) were frozen at −78° C. in a nitrogen atmosphere. At the same temperature, n-butyl lithium (19.3 ml, 0.031 mol) was dropwise added to the reaction solution, which was then stirred for 2 hrs. Thereafter, <Intermediate 1-d> (11.0 g, 0.026 mol) was added little by little to the reaction solution and stirred at room temperature. When the reaction mixture started to change color, the reaction was monitored via TLC. After the reaction was stopped with $H_2O$ (50 ml), extraction was conducted with ethyl acetate and water. The organic layer was separated, concentrated in a vacuum, and recrystallized in acetonirile to afford <Intermediate 1-e> as a solid. (12.2 g, 81.5%)

Synthesis Example 1-(6): Synthesis of Intermediate 1-f

Intermediate 1-f was synthesized as illustrated in the following Reaction Scheme 6:

<Reaction Scheme 6>

0.4 mmol), sodium tert-butoxide (3.4 g, 0.035 mol), tri tert-butyl phosphine (0.07 g, 0.4 mmol), and toluene (60 ml) was stirred for 2 hrs under reflux. After completion of the reaction, the reaction mixture was cooled to room temperature and then extracted with dichloromethane and water. The organic layer thus formed was separated, dried over magnesium sulfate, and concentrated in a vacuum. The concentrate was purified by column chromatography and recrystallized in dichloromethane and acetone to yield the Compound 1 as a solid (3.1 g, 38%).

MS (MALDI TOF): m/z 964.5 [M+]

Synthesis Example 2: Synthesis of Compound 9

Synthesis Example 2 (1): Synthesis of Intermediate 2-a

Intermediate 2-a was synthesized as illustrated in the following Reaction Scheme 8:

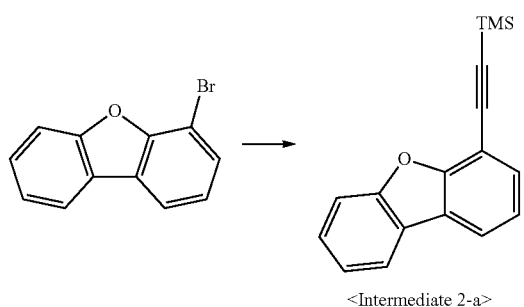

<Reaction Scheme 8>

<Intermediate 2-a>

In a 2 L round bottom flask, 4-bromodibenzofuran (100.0 g, 0.405 mol), ethynyl trimethylsilane (47.7 g, 0.486 mol), [1,1'-bis(diphenylphosphino)ferrocene]dichloropalladium (9.92 g, 0.012 mol), copper iodide (2.31 g, 0.012 mol), triphenylphosphine (10.6 g, 0.040 mol), and triethylamine (700 ml) were stirred for 5 hrs under reflux in a nitrogen atmosphere. After completion of the reaction, the reaction mixture was cooled to room temperature and added with heptane (500 ml) to terminate the reaction. Filtration was conducted through a silica gel pad topped with celite. The filtrate was concentrated in a vacuum to afford <Intermediate 2-a> (130 g, 84%).

Synthesis Example 2-(2): Synthesis of Intermediate 2-b

Intermediate 2-b was synthesized as illustrated in the following Reaction Scheme 9:

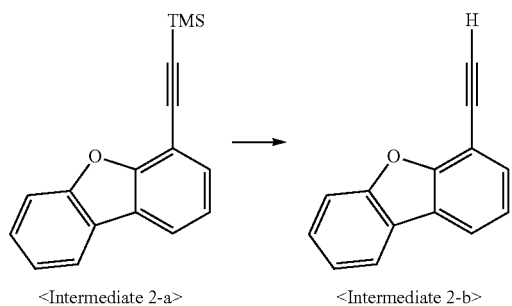

<Reaction Scheme 9>

<Intermediate 2-a>    <Intermediate 2-b>

In a 2-L round-bottom flask reactor, <Intermediate 2-a> (130 g, 0.492 mol), potassium carbonate (101.9 g, 0.738 mol), methanol (650 ml), and tetrahydrofuran (650 ml) were stirred together for 2 hrs at room temperature. After completion of the reaction, heptane (500 ml) was added to terminate the reaction. The reaction mixture was filtered and the filtrate was extracted with ethyl acetate and water. The organic layer thus formed was isolated and dried over magnesium sulfate. Filtration and vacuum concentration afforded <Intermediate 2-b> as an oil (82 g, 84%).

Synthesis Example 2-(3): Synthesis of Intermediate 2-c

Intermediate 2-c was synthesized as illustrated in the following Reaction Scheme 10:

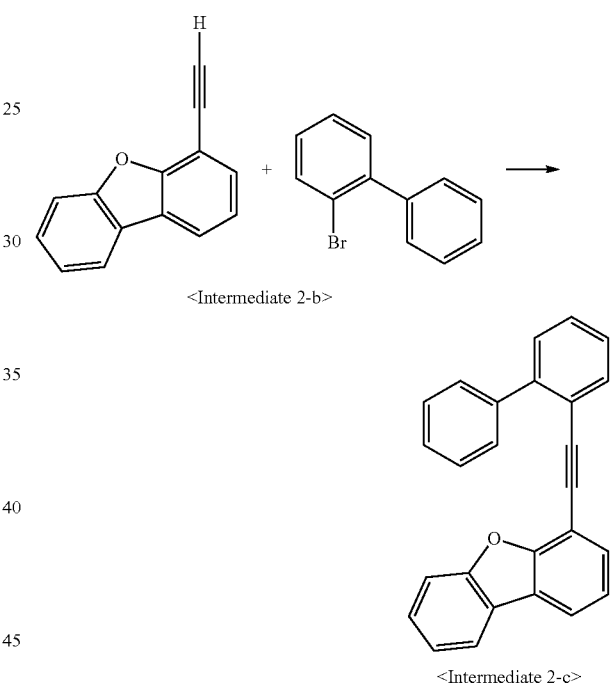

<Reaction Scheme 10>

<Intermediate 2-b>

<Intermediate 2-c>

In a 2 L round bottom flask reactor, 2-bromobiphenyl (66.0 g, 0.283 mol), <Intermediate 2-b> (65.3 g, 0.340 mol), [1,1'-bis(diphenylphosphino)ferrocene]dichloropalladium (6.94 g, 0.008 mol), copper iodide (1.62 g, 0.008 mol), triphenylphosphine (7.4 g, 0.028 mol), and triethylamine (500 ml) were stirred for 5 hrs under reflux in a nitrogen atmosphere. After completion of the reaction, the reaction mixture was cooled to room temperature and added with heptane (500 ml) to terminate the reaction. Filtration was conducted through a silica gel pad topped with celite. The filtrate was concentrated in a vacuum to afford <Intermediate 2-c> (80 g, 82%).

Synthesis Example 2 (4): Synthesis of Intermediate 2-d

Intermediate 2-d was synthesized as illustrated in the following Reaction Scheme 11:

Reaction Scheme 11

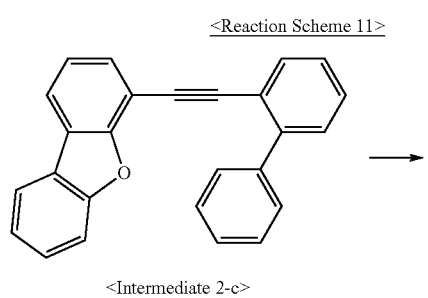

<Intermediate 2-c>

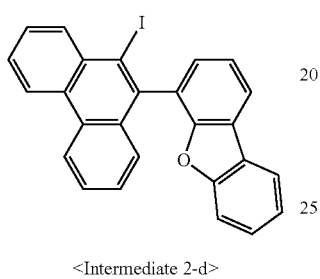

<Intermediate 2-d>

In a 2 L round bottom flask reactor, a solution of <Intermediate 2-c> (80.0 g, 0.232 mol) in dichloromethane (960 ml) was cooled to 78° C. under a nitrogen atmosphere. Iodine monochloride (278.4 ml, 0.279 mol) was dropwise added to the chilled solution, which was then stirred at room temperature for 12 hrs. After completion of the reaction, the reaction mixture was stirred together with an aqueous saturated sodium thiosulfate solution. Following extraction with dichloromethane and water, the organic layer was isolated, concentrated in a vacuum, and washed with methanol to afford <Intermediate 2-d> as a crystal (67 g, 61.3%).

Synthesis Example 2-(5): Synthesis of Intermediate 2-e

Intermediate 2-e was synthesized as illustrated in the following Reaction Scheme 12:

Reaction Scheme 12

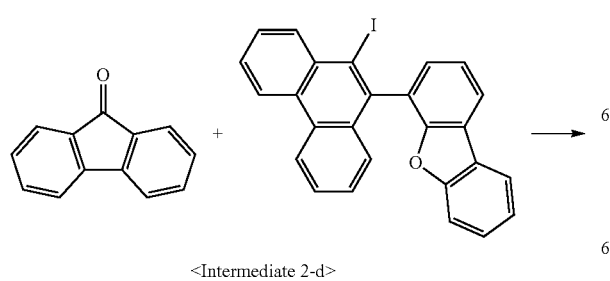

<Intermediate 2-d>

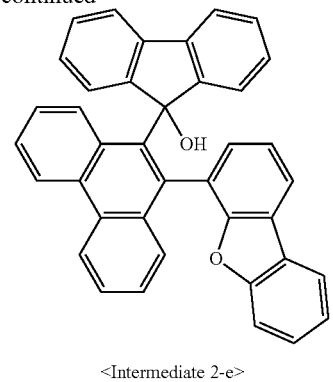

<Intermediate 2-e>

In a 500-mL round-bottom flask reactor, a solution of <Intermediate 2-d>(54.8 g, 0.117 mol) in tetrahydrofuran (150 ml) was cooled to −78° C. under a nitrogen atmosphere. At the same temperature, 1.6 M n-butyl lithium (62.4 ml, 0.1 mol) was dropwise added to the chilled solution and stirred for 1 hr. Then, a solution of 9-fluorenone (15.0 g, 0.083 mol) in tetrahydrofuran (50 ml) was dropwise added before stirring at room temperature for 8 hrs. After completion of the reaction, extraction was performed with ethyl acetate and water. The organic layer thus formed was isolated and dried over magnesium sulfate. Vacuum concentration subsequent to filtration afforded <Intermediate 2-e> as an oil (33.2 g, 76%).

Synthesis Example 2-(6): Synthesis of Intermediate 2-f

Intermediate 2-f was synthesized as illustrated in the following Reaction Scheme 13:

Reaction Scheme 13

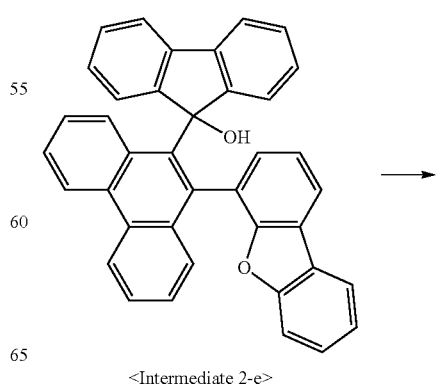

<Intermediate 2-e>

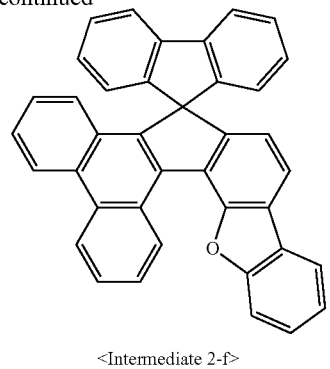

<Intermediate 2-f>

In a 1 L round bottom flask reactor, <Intermediate 2-e> (33.3 g, 0.063 mol), acetic acid (330 ml), and sulfuric acid (3 ml) were stirred together for 3 hrs under reflux. After the completion of the reaction was confirmed using thin layer chromatography, the reaction mixture was cooled to room temperature. The precipitates thus formed were filtered and washed with $H_2O$ and methanol to afford <Intermediate 2-f> (28.6 g, 88%>.

Synthesis Example 2 (7): Synthesis of Intermediate 2-g

Intermediate 2-g was synthesized as illustrated in the following Reaction Scheme 14:

<Reaction Scheme 14>

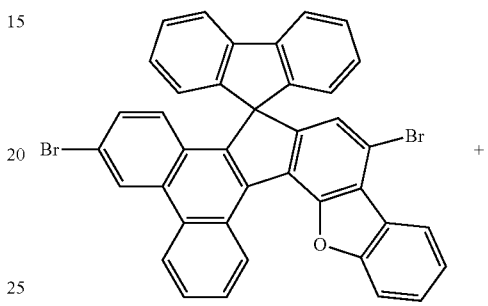

<Intermediate 2-f>

<Intermediate 2-g>

In a 1 L round bottom flask reactor, a solution of <Intermediate 2-f> (20.0 g, 0.039 mol) in dichloromethane (200 ml) was added with drops of a dilution of bromine (6 ml, 0.118 mol) in dichloromethane (40 ml) while stirring. After completion of the reaction for 12 hrs of stirring at room temperature, the addition of methanol (100 ml) produced precipitates which were then washed with methanol. Recrystallization in 1,2-dichlorobenzene and acetone afforded <Intermediate 2-g> (16 g, 60%).

Synthesis Example 2 (8): Synthesis of Compound 9

The compound 9 was synthesized as illustrated in the following Reaction Scheme 15:

<Reaction Scheme 15>

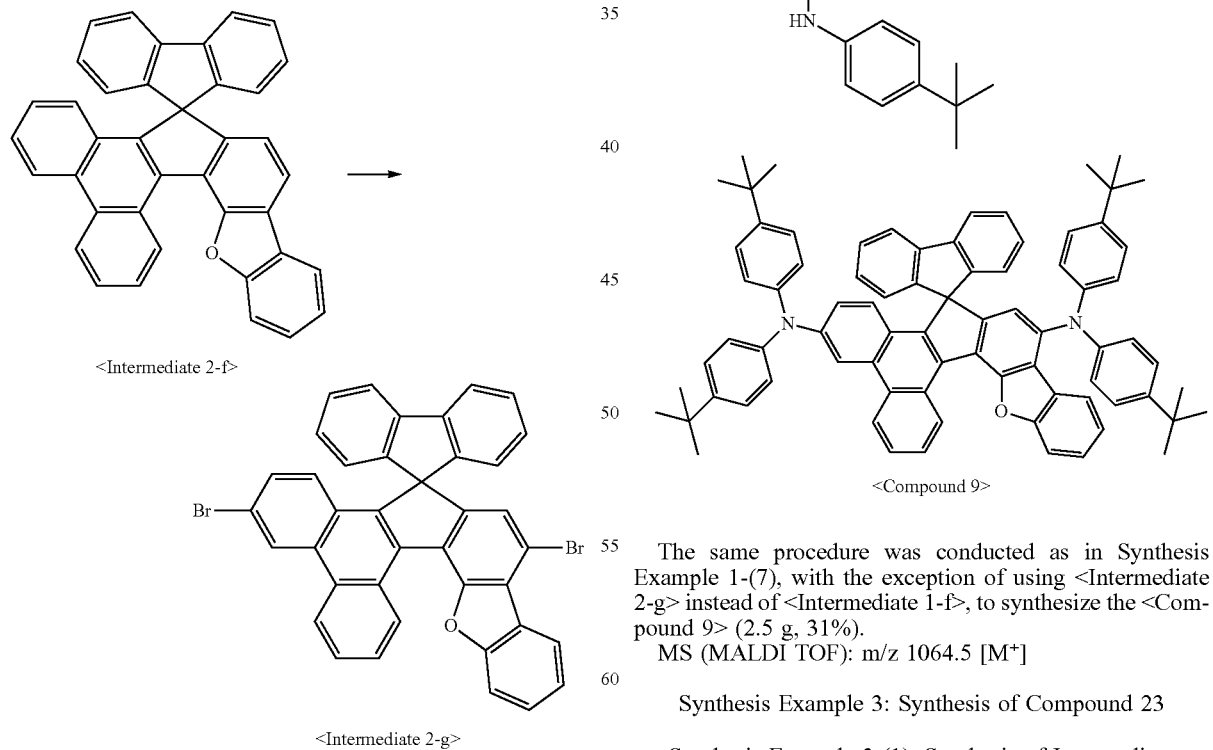

<Intermediate 2-g>

<Compound 9>

The same procedure was conducted as in Synthesis Example 1-(7), with the exception of using <Intermediate 2-g> instead of <Intermediate 1-f>, to synthesize the <Compound 9> (2.5 g, 31%).

MS (MALDI TOF): m/z 1064.5 [M⁺]

Synthesis Example 3: Synthesis of Compound 23

Synthesis Example 3 (1): Synthesis of Intermediate 3-a

Intermediate 3-a was synthesized as illustrated in the following Reaction Scheme 16:

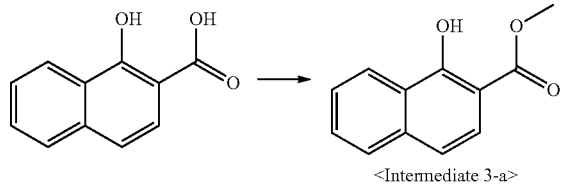

In a 2 L round bottom flask reactor, 1 hydroxy 2 naphthalic acid (50 g, 266 mmol), methanol (1000 ml), and sulfuric acid (100 ml) were stirred together for 100 hrs under reflux. The completion of the reaction was confirmed by TLC before the reaction mixture was cooled to room temperature. The mixture was concentrated in a vacuum and extracted with dichloromethane and water. The organic layer was isolated, dried over magnesium sulfate, and filtered. The filtrate was concentrated at a reduced pressure and crystallized in an excess of heptane to afford <Intermediate 3-a> (39 g, 72.6%).

Synthesis Example 3 (2): Synthesis of Intermediate 3-b

Intermediate 3-b was synthesized as illustrated in the following Reaction Scheme 17:

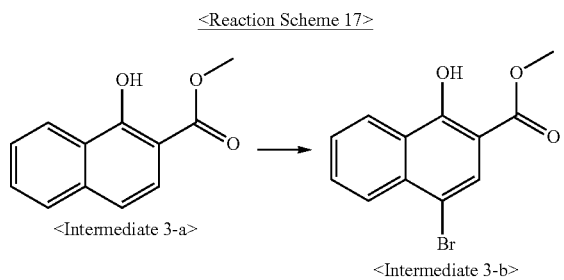 [SMILES: COC(=O)c1ccc2ccccc2c1O ; COC(=O)c1cc(Br)c2ccccc2c1O]

In a 1-L round-bottom flask reactor, <Intermediate 3-a> (39.0 g, 193 mmol) was stirred together with acetic acid (390 ml) at room temperature. A dilution of acetic acid (80 ml) in bromine (11.8 ml, 231 mmol) was added dropwise thereto. The resulting reaction solution was stirred for 5 hrs at room temperature. After completion of the reaction, the precipitates thus formed were filtered and slurried in heptane to afford <Intermediate 3-b> (50 g, 90%).

Synthesis Example 3-(3): Synthesis of Intermediate 3-c

Intermediate 3-c was synthesized as illustrated in the following Reaction Scheme 18:

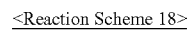

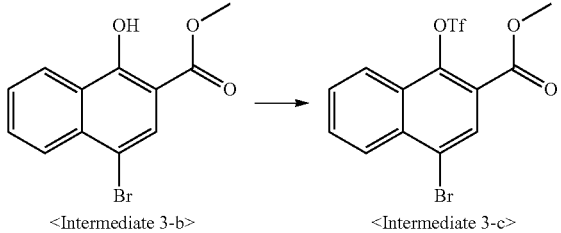

In a 2-L round-bottom flask reactor, <Intermediate 3-b> (50 g, 178 mmol) was stirred together with dichloromethane. Under a nitrogen atmosphere, pyridine (28.1 g, 356 mmol) was added and stirred at room temperature for 20 min. The resulting solution was cooled to 0° C. and then added with drops of trifluoromethanesulfonic anhydride (65.24 g, 231 mmol) under a nitrogen atmosphere. After 3 hrs of stirring, the completion of the reaction was confirmed by TLC. Water (20 ml) was added, and the mixture was stirred for 10 min. The reaction mixture was concentrated in a vacuum, followed by purification through column chromatography to afford <Intermediate 3-c> (45 g, 61%).

Synthesis Example 3-(4): Synthesis of Intermediate 3-d

Intermediate 3-d was synthesized as illustrated in the following Reaction Scheme 19:

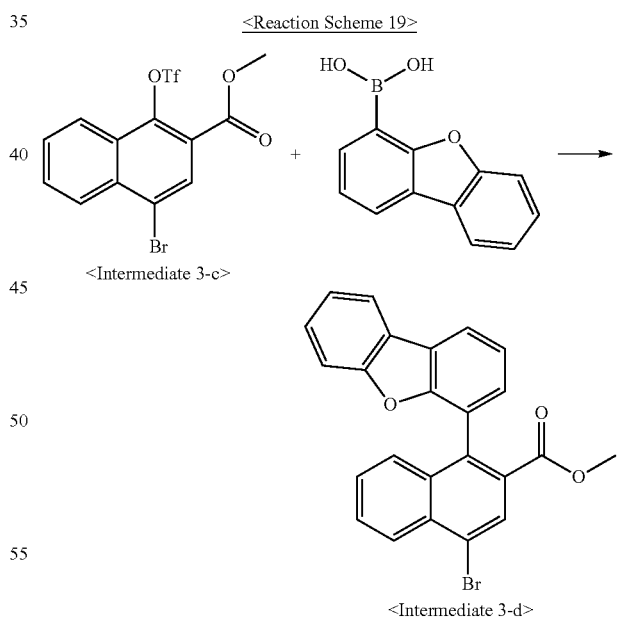

In a 1-L round-bottom flask reactor, a mixture of <Intermediate 3-c> (45.0 g, 0.109 mol), 4-dibenzoboronic acid (25.4 g, 0.120 mol), tetrakis (triphenylphosphine)palladium (2.5 g, 0.22 mmol), and potassium carbonate (30.1 g, 0.218 mol) was stirred together with toluene (300 mL), ethanol (130 mL) and water (90 mL) at 80° C. for 5 hrs. After completion of the reaction, the reaction mixture was cooled to room temperature and extracted with ethyl acetate. The organic layer was isolated and concentrated in a vacuum. Purification through column chromatography afforded Intermediate 3-d. (22.0 g, 46.1%)

Synthesis Example 3-(5): Synthesis of Intermediate 3-e

Intermediate 3-e was synthesized as illustrated in the following Reaction Scheme 20:

<Reaction Scheme 20>

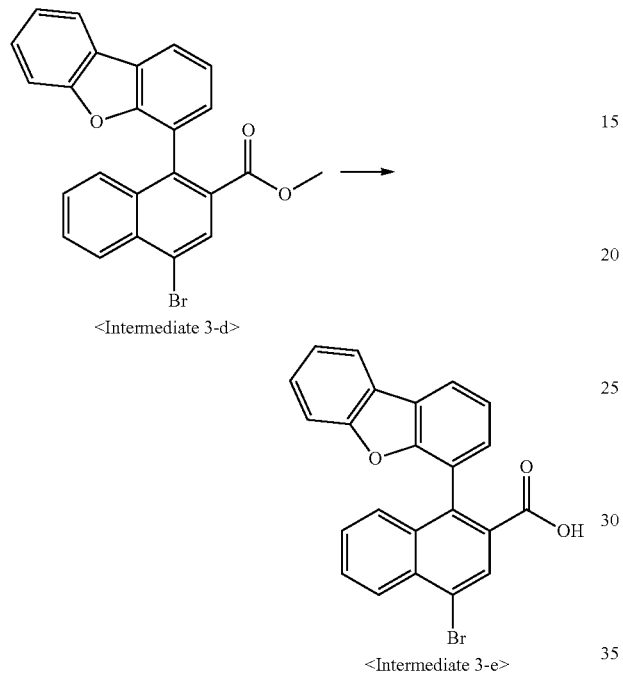

<Intermediate 3-d>

<Intermediate 3-e>

In a 1-L round-bottom flask reactor, <Intermediate 3-d> (22.0, 0.051 mol) was stirred together with sodium hydroxide (2.65 g, 0.066 mol) for 48 hrs under reflux. After completion of the reaction, the reaction mixture was cooled to room temperature. The chilled solution was acidified with drops of 2-N HCl, followed by stirring for 30 min. The solid thus formed was filtered and recrystallized in dichloromethane and n-hexane to afford Intermediate 3-e. (17.6 g, 82.7%)

Synthesis Example 3-(6): Synthesis of Intermediate 3-f

Intermediate 3-f was synthesized as illustrated in the following Reaction Scheme 21:

<Reaction Scheme 21>

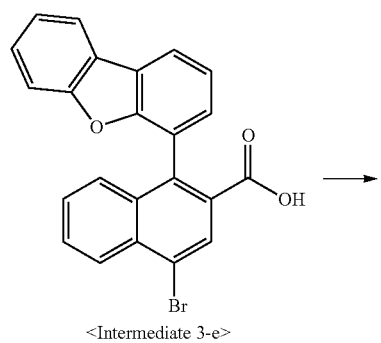

<Intermediate 3-e>

-continued

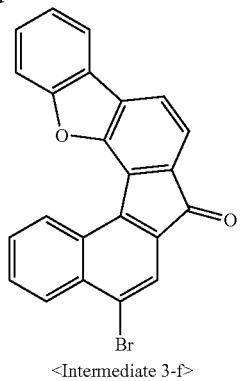

<Intermediate 3-f>

In a 500-mL round-bottom flask reactor, <Intermediate 3-e> (17.6 g, 0.042 mol) and methanesulfonic acid (170 ml) were stirred together for 3 hrs at 80° C. After the completion of the reaction was confirmed using thin-layer chromatography, the reaction mixture was cooled to room temperature and dropwise added to ice water (150 ml). After stirring for 30 min, the precipitates thus formed were filtered and washed with water and methanol. They were dissolved in monochlorobenzene and filtered through a silica gel pad. The filtrate was concentrated by heating and recrystallized in acetone to afford Intermediate 3-f. (12 g, 71%)

Synthesis Example 3-(7): Synthesis of Intermediate 3-g

Intermediate 3-g was synthesized as illustrated in the following Reaction Scheme 22:

<Reaction Scheme 22>

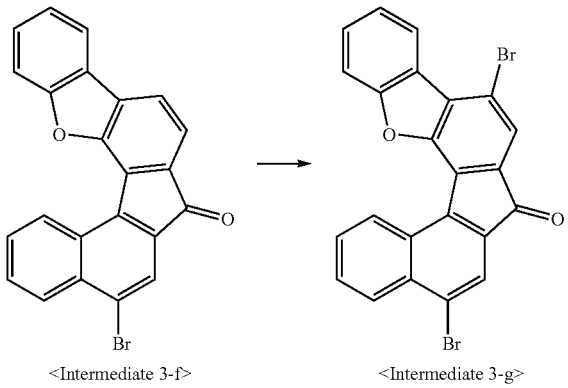

<Intermediate 3-f>     <Intermediate 3-g>

In a 1 L round bottom flask reactor, Intermediate 3-f (12.0 g, 0.030 mol) and dichloromethane (360 ml) were stirred together at room temperature. A dilution of bromine (3.1 ml, 0.06 mol) in dichloromethane (40 ml) was dropwise added, followed by stirring at room temperature for 12 hrs. After completion of the reaction, methanol (100 ml) was added to induce the formation of precipitates. They were then filtered and washed with methanol. Recrystallization in 1,2-dichlorobenzene and acetone afforded Intermediate 3-g (10.3 g, 71.7%).

Synthesis Example 3 (8): Synthesis of Intermediate 3-h

Intermediate 3-h was synthesized as illustrated in the following Reaction Scheme 23:

75

<Reaction Scheme 34>

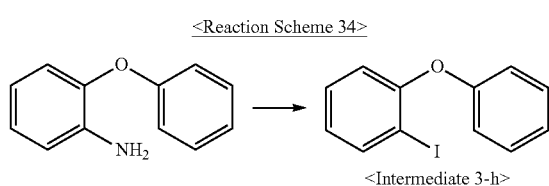 [SMILES: Nc1ccccc1Oc1ccccc1 ; Ic1ccccc1Oc1ccccc1]

<Intermediate 3-h>

In a 1 L round bottom flask reactor, a mixture of 2 phenoxyaniline (25.0, 0.135 mol), HCl (30 ml), and water (150 ml) was cooled to 0° C. and stirred for 1 hr. At the same temperature, an aqueous solution (75 ml) of sodium nitrite (11.2 g, 0.162 mol) was added and then stirred for 1 hr. An aqueous solution (75 ml) of potassium iodide (44.8 g, 0.270 mol) was dropwise added, taking care not to increase the temperature of the reaction solution above 5° C. Stirring was continued for 5 hrs at room temperature, and after completion of the reaction, the reaction mixture was washed with an aqueous sodium thiosulfate solution and extracted with ethyl acetate and water. The organic layer was separated and concentrated in a vacuum. Purification through column chromatography gave Intermediate 5-a (22.6 g, 56.5%).

Synthesis Example 3-(9): Synthesis of Intermediate 3-i

Intermediate 3-i was synthesized as illustrated in the following Reaction Scheme 24:

<Reaction Scheme 24>

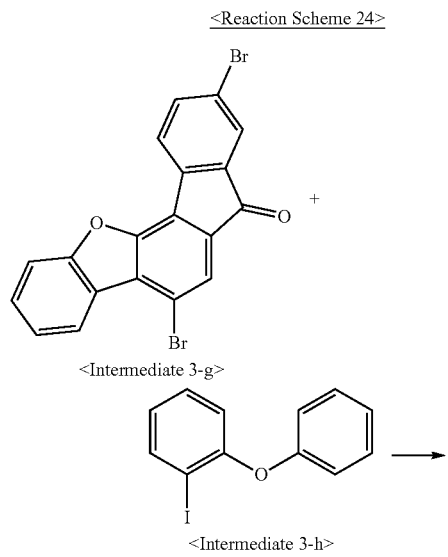

The same procedure was conducted as in Synthesis Example 1-(5), with the exception that Intermediate 3-g and Intermediate 3-h were used respectively instead of Intermediate 1-d and 2-bromobiphenyl, to synthesize Intermediate 3-i (19.6 g, 70.4%).

Synthesis Example 3-(10): Synthesis of Intermediate 3-j

Intermediate 3-j was synthesized as illustrated in the following Reaction Scheme 25:

<Reaction Scheme 25>

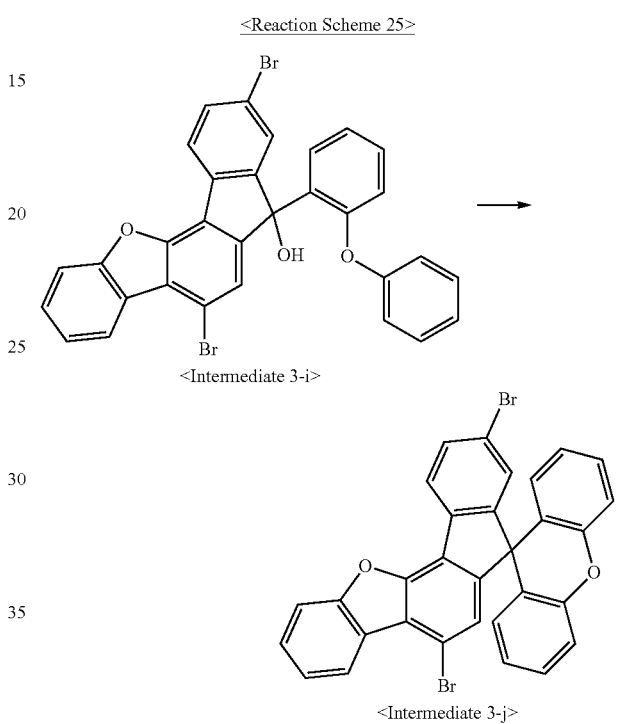

The same procedure was conducted as in Synthesis Example 1-(6), with the exception that Intermediate 3-i was used instead of Intermediate 1-e, to synthesize Intermediate 3-j (14.2 g, 74.7%).

Synthesis Example 3-(11): Synthesis of Compound 23

The Compound 23 was synthesized as illustrated in the following Reaction Scheme 26:

<Reaction Scheme 26>

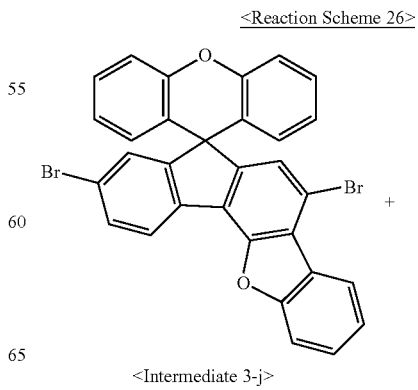

<Intermediate 3-j>

-continued

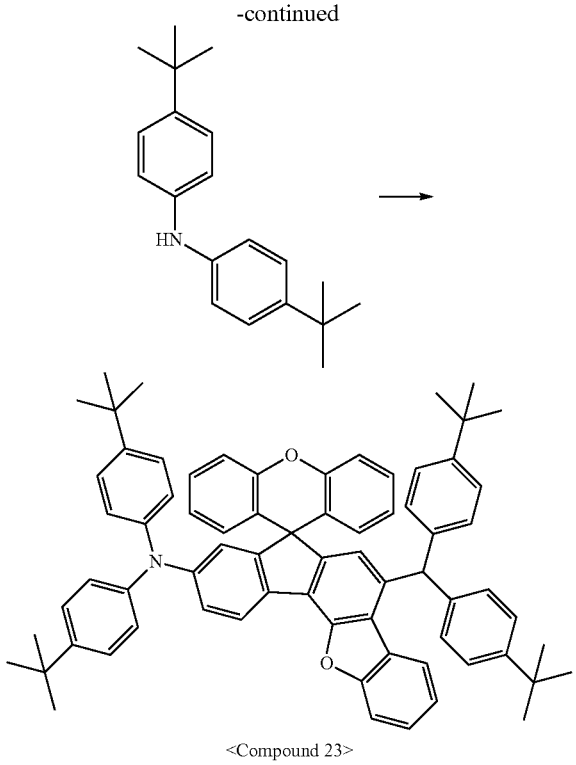

<Compound 23>

The same procedure was conducted as in Synthesis Example 1-(7), with the exception that Intermediate 3-j and 1,1'-(4-methylphenyl-4-tert-butylphenyl)amine were used respectively instead of Intermediate 1-f and bis(4-tert-butylphenyl)amine, to synthesize the Compound 23 (2.4 g, 28%).

MS (MALDI TOF): m/z 980.5 [M⁺]

Synthesis Example 4: Synthesis of Compound 28

Synthesis Example 4 (1): Synthesis of Intermediate 4-a

Intermediate 4-a was synthesized as illustrated in the following Reaction Scheme 27:

<Reaction Scheme 27>

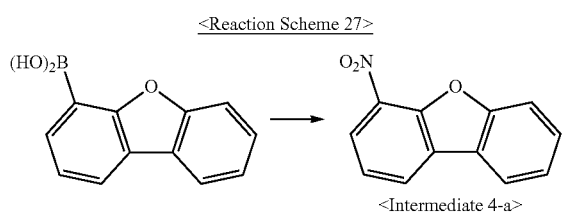 [SMILES: OB(O)c1cccc2c1oc1ccccc12 ; O=[N+]([O-])c1cccc2c1oc1ccccc12]

<Intermediate 4-a>

In a 2 L round bottom flask reactor, 4-dibenzoboronic acid (85.0 g, 0.401 mol), bismuth (III) nitrate pentahydrate (99.2 g, 0.200 mol), and toluene (400 ml) were stirred together at 70° C. for 3 hrs under a nitrogen atmosphere. After completion of the reaction, the reaction mixture was cooled to room temperature, and the precipitates thus formed were filtered and washed with toluene to afford Intermediate 4-a (61.5 g, 72%).

Synthesis Example 4 (2): Synthesis of Intermediate 4-b

Intermediate 4-b was synthesized as illustrated in the following Reaction Scheme 28:

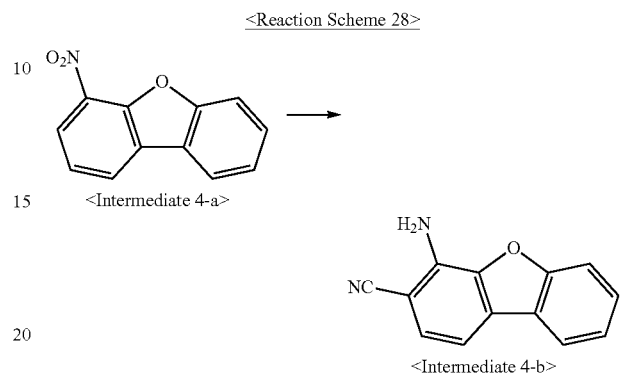

In a 2 L round bottom flask reactor, ethyl cyanoacetate (202.9 g, 1.794 mol) and dimethylformamide (500 ml) were placed. Potassium hydroxide (67.10 g, 1.196 mol) and potassium cyanide (38.95 g, 0.598 mol) were added thereto, followed by dimethyl formamide (200 ml). The reaction solution was stirred at room temperature. Intermediate 4-a (127.5 g, 0.737 mol) was added little by little to the reaction solution, followed by stirring at 50° C. for 72 hrs. After completion of the reaction, an aqueous sodium hydroxide solution (25%, 200 ml) was added to the reaction solution, which was then stirred for 3 hrs under reflux and cooled to room temperature. Extraction was performed using ethyl acetate and water. The organic layer was isolated and concentrated in a vacuum. Purification through column chromatography afforded Intermediate 4-b (20.0 g, 16%).

Synthesis Example 4-(3): Synthesis of Intermediate 4-c

Intermediate 4-c was synthesized as illustrated in the following Reaction Scheme 29:

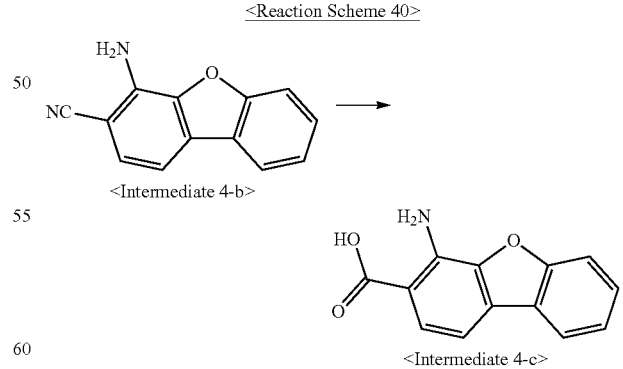

In a 2-L round bottom flask reactor, Intermediate 4-b (20.0 g, 0.096 mol), ethanol (600 ml), and an aqueous potassium hydroxide solution (142.26 g, 2.53 mol, 170 ml) were stirred together for 12 hrs under reflux. After completion of the reaction, the reaction mixture was cooled to room temperature and acidified with 6-N HCl (400 ml). The solid thus formed was stirred for 20 min and filtered. The filtrate was washed with ethanol to afford Intermediate 4-c (17.0 g, 88.5%).

Synthesis Example 4-(4): Synthesis of Intermediate 4-d

Intermediate 4-d was synthesized as illustrated in the following Reaction Scheme 30:

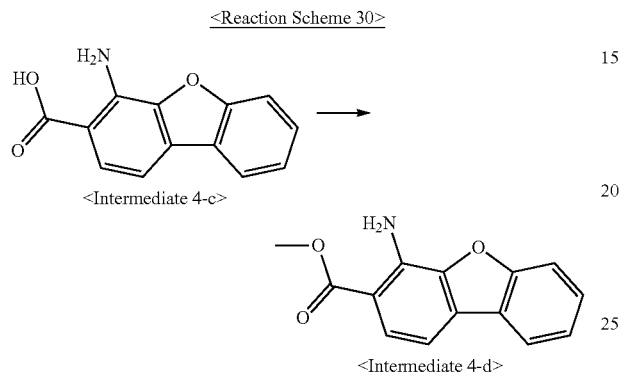

In a 2-L round-bottom flask reactor, Intermediate 4-c (17.0 g, 0.075 mol) and sulfuric acid (15 ml) were stirred together for 72 hrs under reflux. After completion of the reaction, the reaction mixture was cooled to room temperature and then extracted with ethyl acetate and water. The organic layer was isolated and washed with an aqueous sodium hydrogen carbonate, followed by concentration in a vacuum. The concentrate was crystallized in an excess of methanol and filtered to afford Intermediate 4-d (14.0 g, 77.6%).

Synthesis Example 4-(5): Synthesis of Intermediate 4-e

Intermediate 4-e was synthesized as illustrated in the following Reaction Scheme 31:

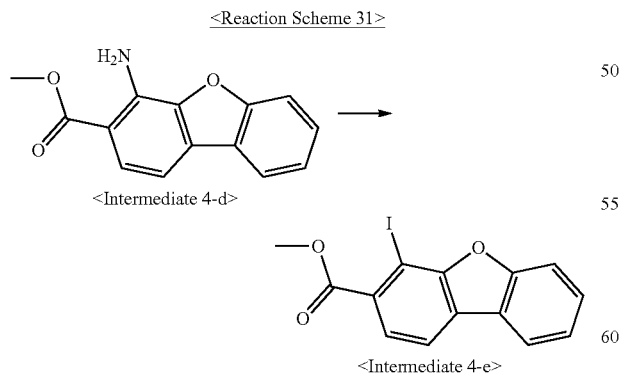

The same procedure was conducted as in Synthesis Example 3-(8), with the exception of using <Intermediate 4-d> instead of 2-phenoxyaniline, to synthesize Intermediate 4-e (9.1 g, 48%).

Synthesis Example 4-(6): Synthesis of Intermediate 4-f

Intermediate 4-f was synthesized as illustrated in the following Reaction Scheme 32:

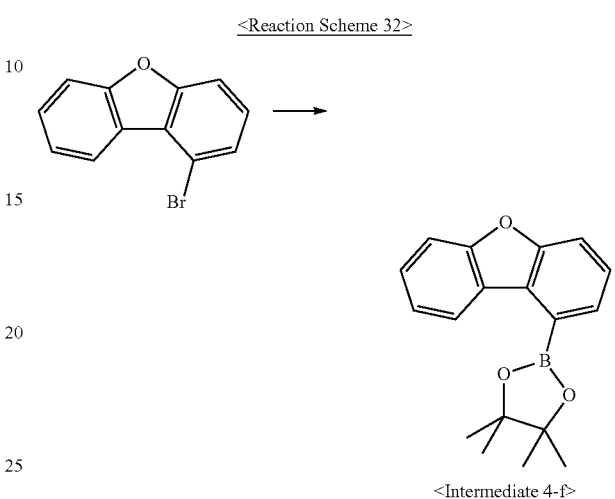

In a 500-mL round bottom flask reactor, 1-bromodibenzofuran (20.0 g, 0.081 mmol), bis(pinacolato)diboron (26.7 g, 0.105 mol), [1,1'-bis(diphenylphosphino) ferrocene]dichloropalladium (1.3 g, 0.002 mol), potassium acetate (19.9 g, 0.202 mol), and 1,4-dioxane (200 ml) were stirred together for 10 hrs under reflux. After completion of the reaction, filtration was performed through a celite pad. The filtrate was concentrated in a vacuum, purified by column chromatography, and recrystallized in dichloromethane and heptane to afford Intermediate 4-f (17.0 g, 70%).

Synthesis Example 4-(7): Synthesis of Intermediate 4-g

Intermediate 4-g was synthesized as illustrated in the following Reaction Scheme 33:

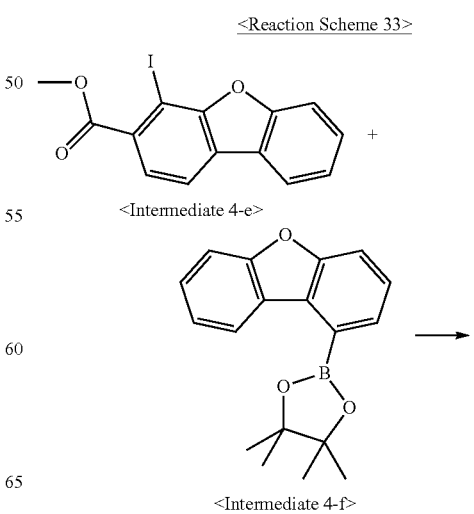

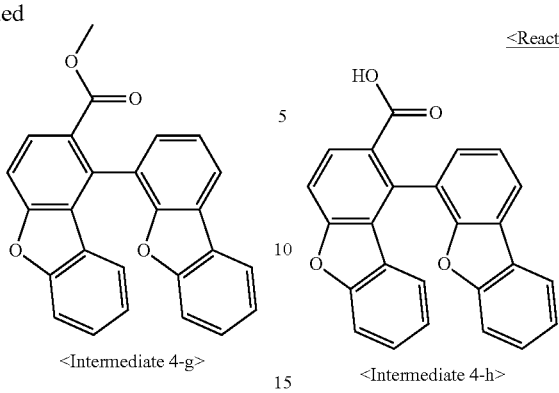

<Intermediate 4-g>

The same procedure was conducted as in Synthesis Example 1-(1), with the exception of using Intermediate 4-e and Intermediate 4-f instead of methyl 5-bromo-2-iodobenzoate and 4-dibenzofuran boronic acid, respectively, to synthesize Intermediate 4-g (5.3 g, 52.3%).

Synthesis Example 4-(8): Synthesis of Intermediate 4-h

Intermediate 4-h was synthesized as illustrated in the following Reaction Scheme 34:

<Reaction Scheme 34>

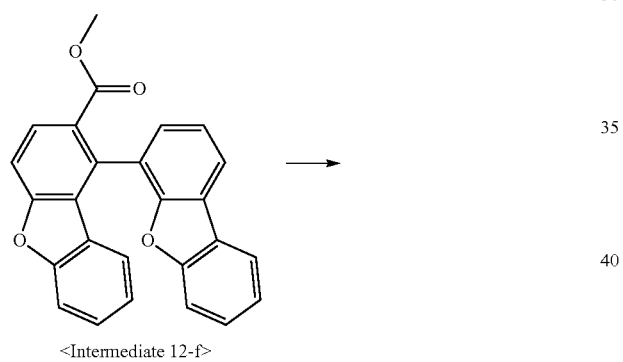

<Intermediate 12-f>

<Reaction Scheme 35>

<Intermediate 4-h>

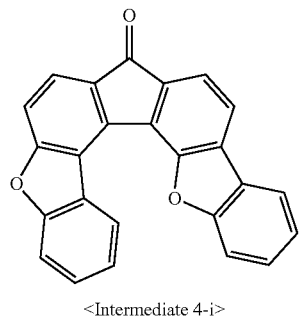

<Intermediate 4-i>

The same procedure was conducted as in Synthesis Example 1-(3), with the exception of using Intermediate 4-h> instead of Intermediate 1-b, to synthesize Intermediate 4-i (3.8 g, 88.8%).

Synthesis Example 4-(10): Synthesis of Intermediate 4-j

Intermediate 4-j was synthesized as illustrated in the following Reaction Scheme 36:

<Reaction Scheme 36>

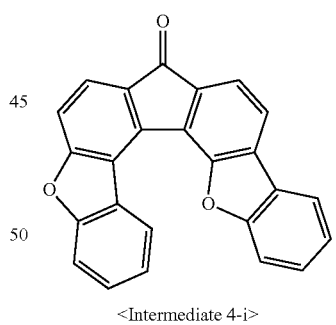

<Intermediate 4-i>

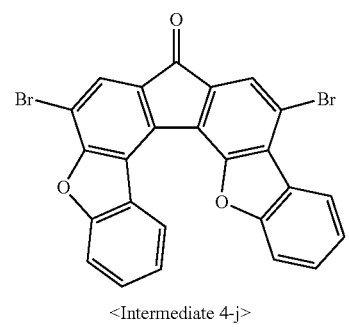

<Intermediate 4-j>

<Intermediate 12-g>

The same procedure was conducted as in Synthesis Example 1-(2), with the exception of using Intermediate 4-g instead of Intermediate 1-a, to synthesize Intermediate 4-h (4.5 g, 88.1%).

Synthesis Example 4-(9): Synthesis of Intermediate 4-i

Intermediate 4-i was synthesized as illustrated in the following Reaction Scheme 35:

The same procedure was conducted as in Synthesis Example 1-(4), with the exception of using <Intermediate 4-i> instead of <Intermediate 1-c>, to synthesize Intermediate 4-j (3 g, 55%).

Synthesis Example 4-(11): Synthesis of Intermediate 4-k

Intermediate 4-k was synthesized as illustrated in the following Reaction Scheme 37:

<Reaction Scheme 37>

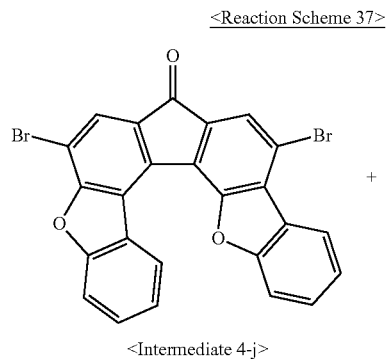

<Intermediate 4-j>

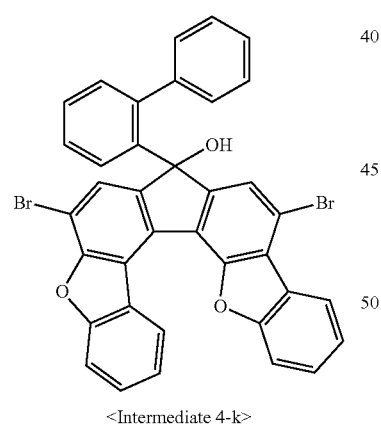

<Intermediate 4-k>

The same procedure was conducted as in Synthesis Example 1-(5), with the exception of using Intermediate 4-j instead of Intermediate 1-d, to synthesize Intermediate 4-k (2.5 g, 64%).

Synthesis Example 4-(12): Synthesis of Intermediate 4-l

Intermediate 4-l was synthesized as illustrated in the following Reaction Scheme 38:

<Reaction Scheme 38>

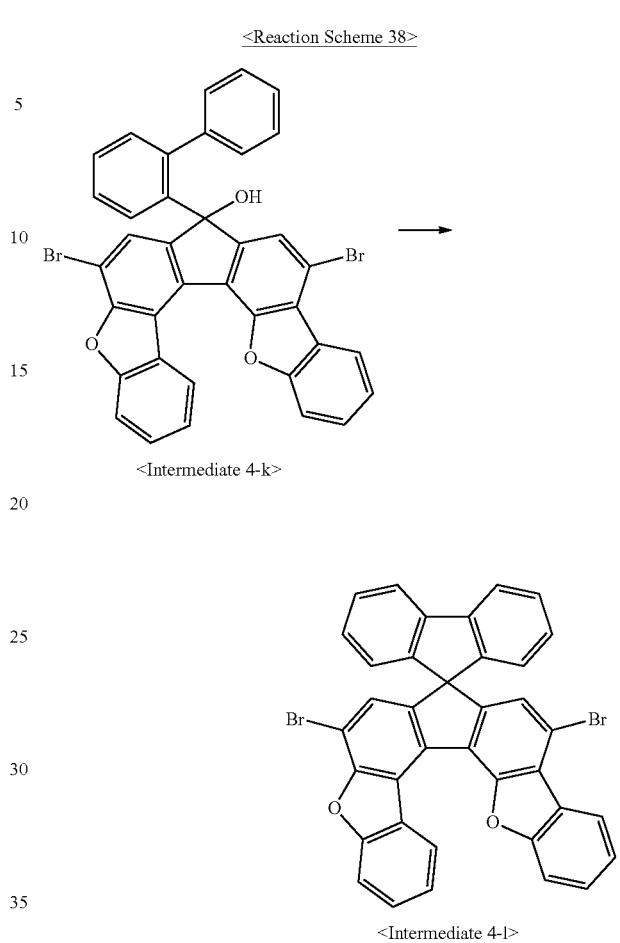

The same procedure was conducted as in Synthesis Example 1-(6), with the exception of using <Intermediate 4-k> instead of <Intermediate 1-e>, to Intermediate 4-l (2.2 g, 90.4%).

Synthesis Example 4-(13): Synthesis of Intermediate 4-m

Intermediate 4-m was synthesized as illustrated in the following Reaction Scheme 39:

<Reaction Scheme 39>

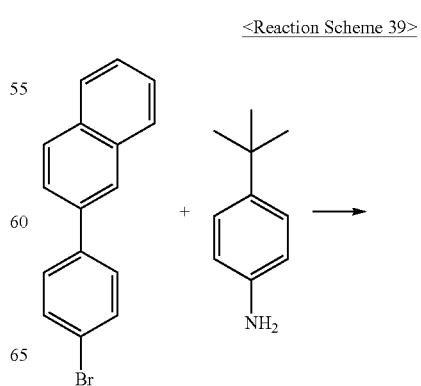

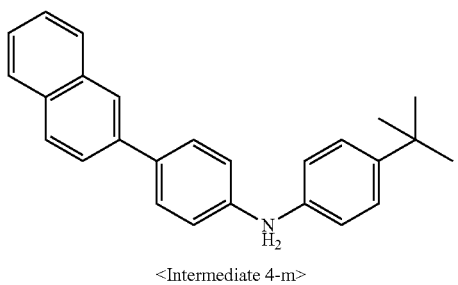

<Intermediate 4-m>

In a 250-ml round-bottom flask reactor, 1-bromo-4-(2-naphthyl)benzene (10.0 g, 0.035 mol), 4-tert-butyl aniline (5.8 g, 0.039 mol), tris(dibenzylidene acetone)dipalladium (0) (0.65 g, 0.0007 mol), sodium tert-butoxide (6.79 g, 0.0706 mol), 2,2'-bis(diphenylphosphino)-1,1'-binaphthalene (0.44 g, 0.0007 mol), and toluene (100 ml) were stirred together for 3 hrs under reflux. After completion of the reaction, the reaction mixture was cooled to room temperature and extracted with ethyl acetate and water. The organic layer was isolated, dried over magnesium sulfate, and concentrated in a vacuum. Purification through column chromatography gave Intermediate 4-m (10 g, 80%).

Synthesis Example 4-(14): Synthesis of Compound 28

The Compound 28 was synthesized as illustrated in the following Reaction Scheme 40:

<Reaction Scheme 40>

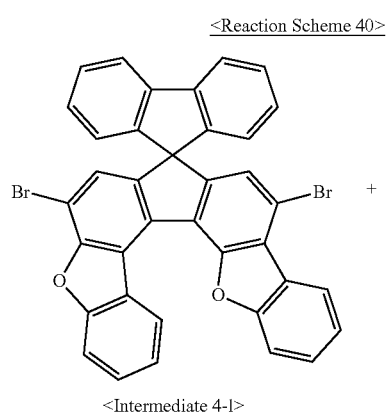

<Intermediate 4-l>

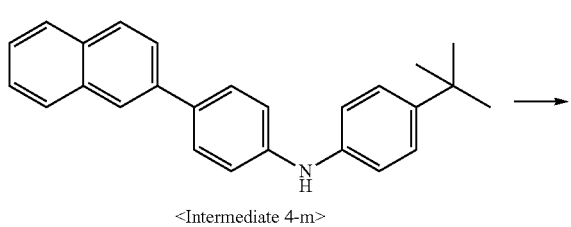

<Intermediate 4-m>

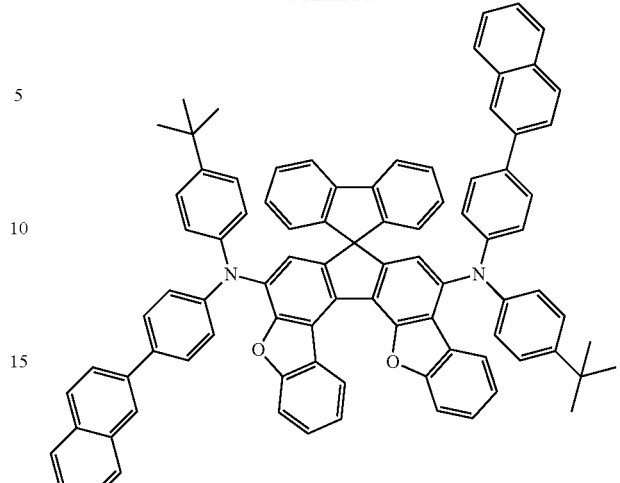

<Compound 28>

The same procedure was conducted as in Synthesis Example 1-(7), with the exception that Intermediate 4-l and Intermediate 4-m were respectively used instead of Intermediate 1-f and bis(4-tert butylphenyl)amine, to synthesize the Compound 28 (1.6 g, 38%).

MS (MALDI-TOF): m/z 1194.5 [M$^+$]

Synthesis Example 5: Synthesis of Compound 36

Synthesis Example 5-(1): Synthesis of Intermediate 5-a

Intermediate 5-a was synthesized as illustrated in the following Reaction Scheme 41:

<Reaction Scheme 41>

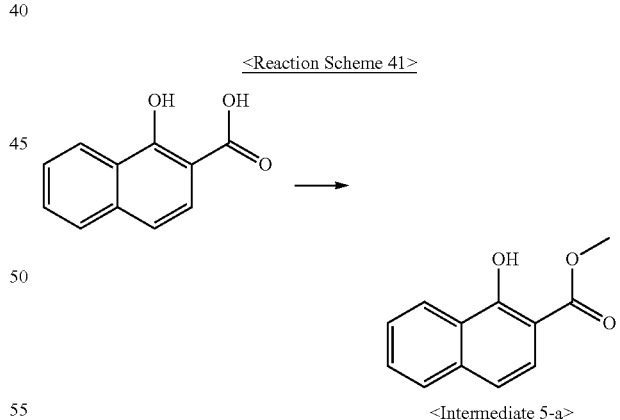

<Intermediate 5-a>

In a 2-L round-bottom flask reactor, 1-hydroxy 2-naphthalic acid (50 g, 266 mmol), methanol (1000 ml), and sulfuric acid (100 ml) were stirred together for 100 hrs under reflux. The completion of the reaction was confirmed by TLC before the reaction mixture was cooled to room temperature. The mixture was concentrated in a vacuum and extracted with dichloromethane and water. The organic layer was isolated, dried over magnesium sulfate, and filtered. The filtrate was concentrated in a vacuum and crystallized in an excess of heptane to afford Intermediate 5-a (39 g, 72.6%).

Synthesis Example 5-(2): Synthesis of Intermediate 5-b

Intermediate 5-b was synthesized as illustrated in the following Reaction Scheme 42:

<Reaction Scheme 42>

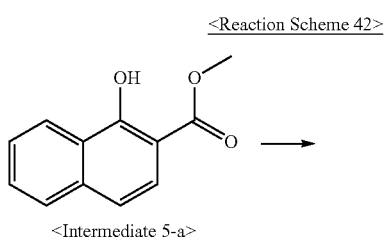

<Intermediate 5-a>

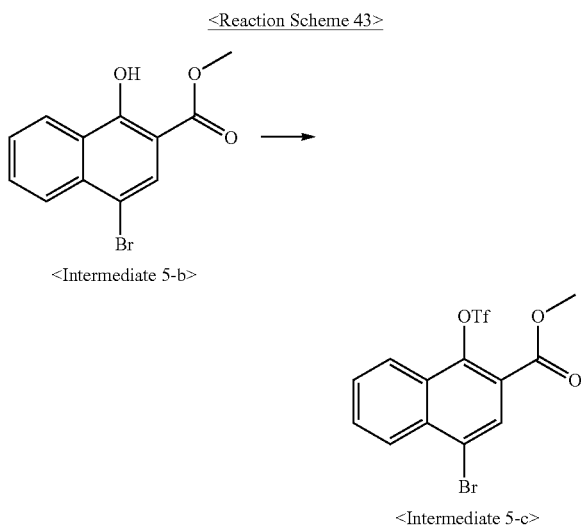

<Intermediate 5-b>

In a 1-L round-bottom flask reactor, Intermediate 5-a (39.0 g, 193 mmol) was stirred together with acetic acid (390 ml) at room temperature. A dilution of acetic acid (80 ml) in bromine (11.8 ml, 231 mmol) was added dropwise thereto. The resulting reaction solution was stirred for 5 hrs at room temperature. After completion of the reaction, the precipitates thus formed were filtered and slurried in heptane to afford Intermediate 5-b (50 g, 90%).

Synthesis Example 5-(3): Synthesis of Intermediate 5-c

Intermediate 7-c was synthesized as illustrated in the following Reaction Scheme 43:

<Reaction Scheme 43>

<Intermediate 5-b>

<Intermediate 5-c>

In a 2-L round-bottom flask reactor, Intermediate 5-b (50 g, 178 mmol) was stirred together with dichloromethane. Under a nitrogen atmosphere, pyridine (28.1 g, 356 mmol) was added and stirred at room temperature for 20 min. The resulting solution was cooled to 0° C. and then added with drops of trifluoromethanesulfonic anhydride (65.24 g, 231 mmol) under a nitrogen atmosphere. After 3 hrs of stirring, the completion of the reaction was confirmed by TLC. Water (20 ml) was added, and the mixture was stirred for 10 min. The reaction mixture was concentrated in a vacuum, followed by purification through column chromatography to afford Intermediate 5-c (45 g, 61%).

Synthesis Example 5-(4): Synthesis of Intermediate 5-d

Intermediate 5-d was synthesized as illustrated in the following Reaction Scheme 44:

<Reaction Scheme 44>

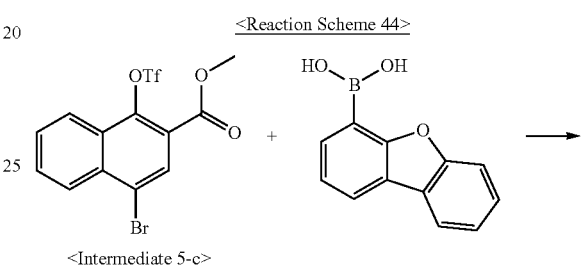

<Intermediate 5-c>

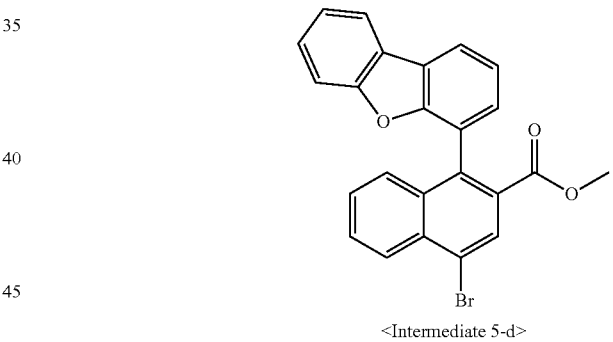

<Intermediate 5-d>

In a 1 L round bottom flask reactor, a mixture of Intermediate 5-c (45.0 g, 0.109 mol), 4-dibenzofuran boronic acid (25.4 g, 0.120 mol), tetrakis (triphenylphosphine)palladium (2.5 g, 0.22 mmol), and potassium carbonate (30.1 g, 0.218 mol) was stirred together with toluene (300 mL), ethanol (130 mL) and water (90 mL) at 80° C. for 5 hrs. After completion of the reaction, the reaction mixture was cooled to room temperature and extracted with ethyl acetate. The organic layer was isolated and concentrated in a vacuum. Purification through column chromatography afforded Intermediate 5-d. (22.0 g, 46.1%)

Synthesis Example 5-(5): Synthesis of Intermediate 5-e

Intermediate 5-e was synthesized as illustrated in the following Reaction Scheme 45:

<Reaction Scheme 45>

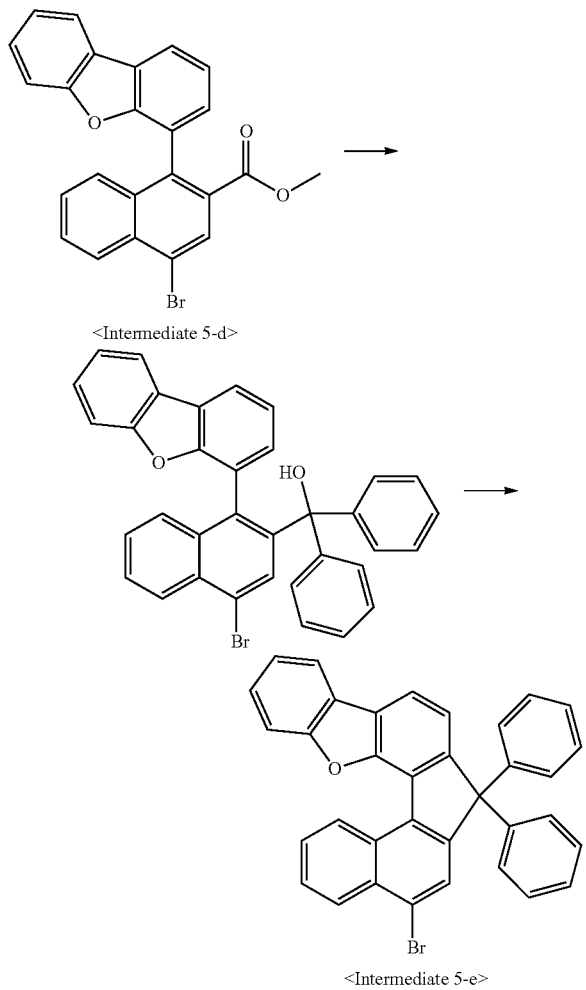

<Intermediate 5-d>

<Intermediate 5-e>

In a 500 mL round bottom flask reactor, a mixture of bromobenzene (25.46 g, 0.163 mol) and tetrahydrofuran (170 ml) was cooled to 78° C. under a nitrogen atmosphere. N butyl lithium (1.6 M) (95.6 ml, 0.153 mol) was dropwise added to the chilled solution, which was then stirred at the same temperature for 1 hr. Intermediate 3-d (22.0 g, 0.051 mol) was added, followed by stirring at room temperature for 3 hrs. After completion of the reaction, the reaction mixture was stirred together with water (50 ml) for 30 min. Extraction was made with ethyl acetate and water. The organic layer was isolated and concentrated in a vacuum. The concentrate was stirred together with acetic acid (200 ml) and HCl (1 ml) at 80° C. After the reaction was completed, the precipitate thus formed was filtered and washed with methanol to afford Intermediate 5-e (20.0 g, 73%).

Synthesis Example 5-(6): Synthesis of Intermediate 5-f

Intermediate 5-f was synthesized as illustrated in the following Reaction Scheme 46:

<Reaction Scheme 46>

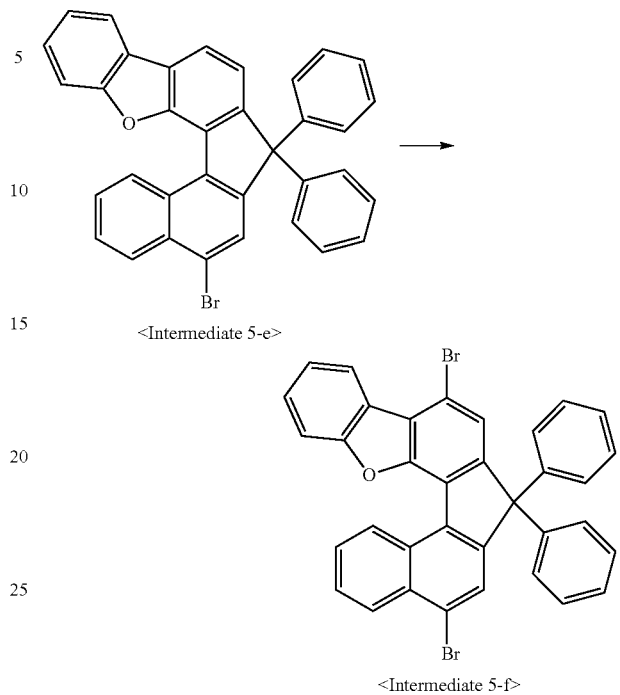

<Intermediate 5-e>

<Intermediate 5-f>

In a 1-L round-bottom flask reactor, a mixture of Intermediate 5-e (20.0 g, 0.037 mol) and chloroform (600 ml) was added with drops of a dilution of bromine (5.7 ml, 0.112 mol) in chloroform (40 ml) while stirring at room temperature for 12 hrs. After completion of the reaction, methanol (100 ml) was added to produce precipitates which were then washed with methanol. They were recrystallized in 1,2-dichlorobenzene and acetone to afford Intermediate 5-f (14.0 g, 61.7%).

Synthesis Example 5-(7): Synthesis of Intermediate 5-g

Intermediate 5-g was synthesized as illustrated in the following Reaction Scheme 47:

<Reaction Scheme 47>

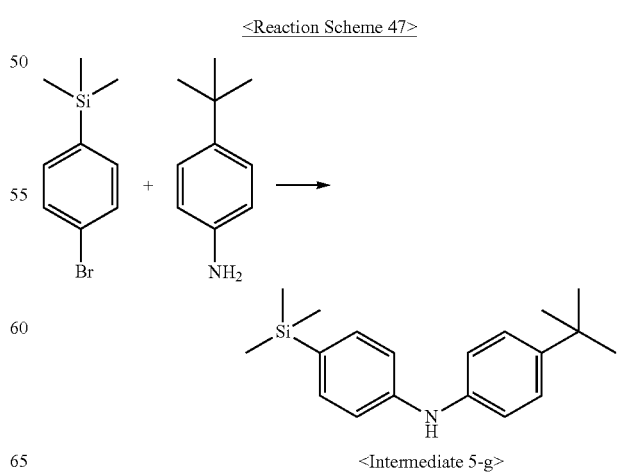

<Intermediate 5-g>

The same procedure was conducted as in Synthesis Example 4-(13), with the exception of using 1-bromo-4-(trimethylsilyl)benzene instead of 1-bromo 4-(2-naphthyl)benzene, to synthesize Intermediate 5-g (13.1 g, 72.1%).

Synthesis Example 5-(8): Synthesis of Compound 36

The Compound 36 was synthesized as illustrated in the following Reaction Scheme 48:

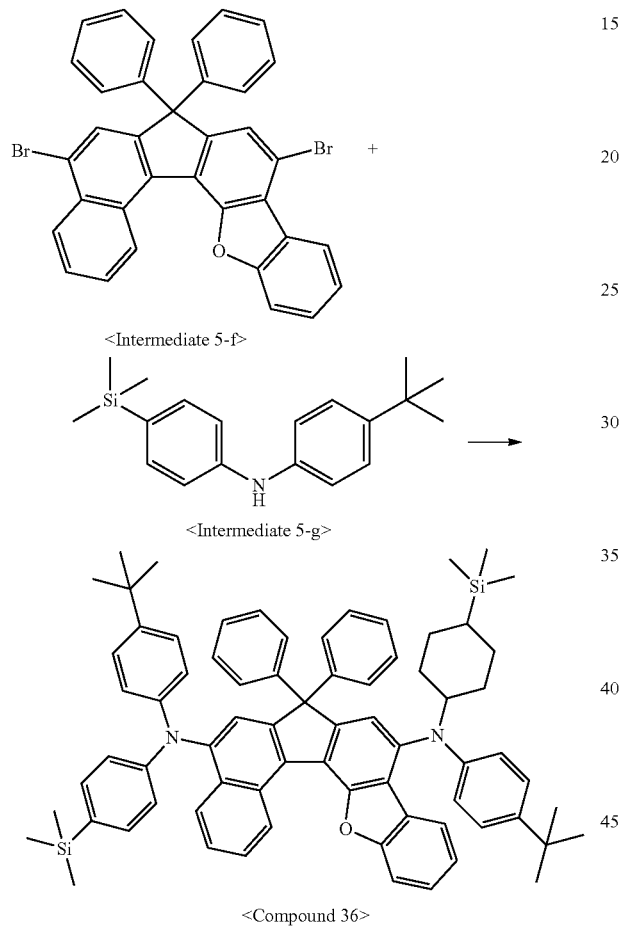

The same procedure was conducted as in Synthesis Example 1-(7), with the exception of using <Intermediate 5-f> and <Intermediate 5-g> respectively instead of Intermediate 1-f and bis(4-tert-butylphenyl)amine, to synthesize the Compound 36 (3.0 g, 35%).

MS (MALDI-TOF): m/z 1048.5 [M$^+$]

Examples 1 to 15: Fabrication of Organic Light-Emitting Diode

An ITO glass substrate was patterned to have a translucent area of 2 mm×2 mm and cleansed. The ITO glass was mounted in a vacuum chamber that was then set to have a base pressure of $1\times10^{-7}$ torr. On the ITO glass substrate, films were formed of DNTPD (700 Å) and α-NPD (300 Å) in that order. A light-emitting layer (250 Å) was formed of a mixture of a host and a dopant (weight ratio 97:3) as shown in Table 1, below. Then, [Chemical Formula E-1] and [Chemical Formula E-2] were deposited at a ratio of 1:1 to form an electron transport layer 300 Å thick, on which an electron injection layer of [Chemical Formula E-1] (5 Å thick) was formed and then covered with an Al layer (1000 Å) to fabricate an organic light-emitting diode. The organic light-emitting diodes thus obtained were measured at 0.4 mA for luminescence properties.

[DNTPD]

[α-NPD]

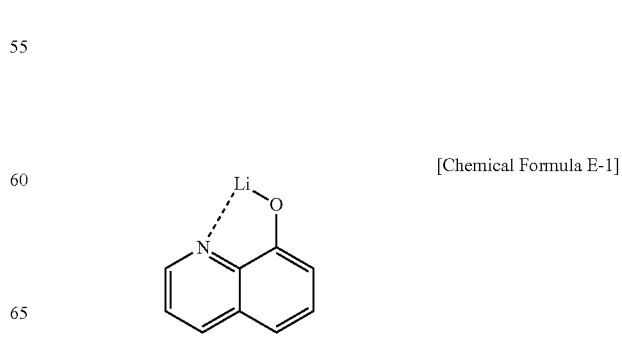

[Chemical Formula E-1]

[Chemical Formula E-2]

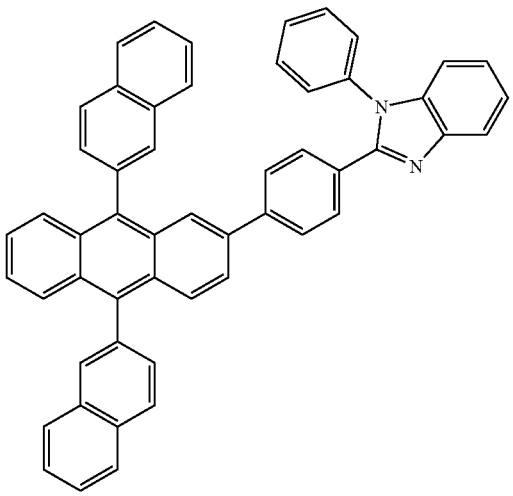

Comparative Examples 1 and 2

Organic light-emitting diodes were fabricated in the same manner as in Examples 1 to 15, with the exception that [BD1] and [BD2] were used, instead of the compounds used in Examples 1 to 15. The luminescence of the organic light-emitting diodes was measured at 0.4 mA. The structures of [BD1] and [BD2] are as follows.

[BD1]

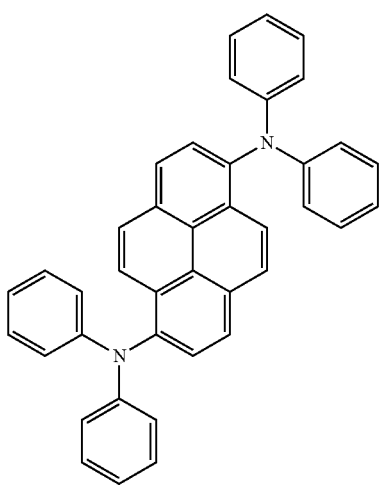

[BD2]

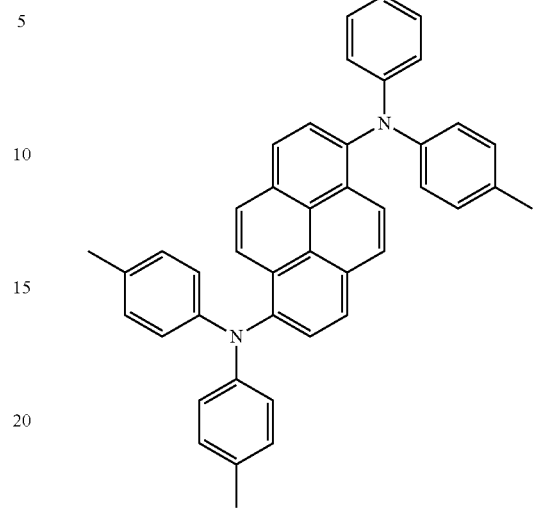

The organic light-emitting diodes fabricated in Examples 1 to 15 and Comparative Examples 1 and 2 were measured for voltage, luminance, color coordinates, and lifetime, and the results are summarized in Table 1, below. In Table 1, T97 refers to the time taken for the initial luminance to decrease by 3%.

TABLE 1

| | Dopant | Host | Volt. | Luminance (cd/m$^2$) | CIEx | CIEy | T97 |
|---|---|---|---|---|---|---|---|
| C. Ex. 1 | BD1 | Cpd. 127 | 4.1 | 515 | 0.143 | 0.150 | 42 |
| C. Ex. 2 | BD2 | Cpd. 127 | 4.0 | 550 | 0.141 | 0.154 | 40 |
| Ex. 1 | Cpd. 1 | Cpd. 127 | 3.8 | 750 | 0.130 | 0.133 | 98 |
| Ex. 2 | Cpd. 1 | Cpd. 153 | 3.8 | 760 | 0.135 | 0.113 | 87 |
| Ex. 3 | Cpd. 1 | Cpd. 191 | 3.8 | 744 | 0.135 | 0.112 | 101 |
| Ex. 4 | Cpd. 9 | Cpd. 137 | 3.8 | 786 | 0.134 | 0.115 | 92 |
| Ex. 5 | Cpd. 9 | Cpd. 110 | 3.8 | 764 | 0.135 | 0.111 | 99 |
| Ex. 6 | Cpd. 9 | Cpd. 191 | 3.8 | 740 | 0.134 | 0.114 | 85 |
| Ex. 7 | Cpd. 23 | Cpd. 103 | 3.8 | 743 | 0.138 | 0.108 | 103 |
| Ex. 8 | Cpd. 23 | Cpd. 110 | 3.8 | 746 | 0.138 | 0.110 | 101 |
| Ex. 9 | Cpd. 23 | Cpd. 137 | 3.8 | 753 | 0.137 | 0.112 | 96 |
| Ex. 10 | Cpd. 28 | Cpd. 108 | 3.8 | 806 | 0.135 | 0.121 | 132 |
| Ex. 11 | Cpd. 28 | Cpd. 127 | 3.8 | 816 | 0.134 | 0.121 | 120 |
| Ex. 12 | Cpd. 28 | Cpd. 153 | 3.8 | 817 | 0.135 | 0.122 | 112 |
| Ex. 13 | Cpd. 36 | Cpd. 103 | 3.8 | 757 | 0.137 | 0.120 | 84 |
| Ex. 14 | Cpd. 36 | Cpd. 108 | 3.8 | 761 | 0.137 | 0.119 | 95 |
| Ex. 15 | Cpd. 36 | Cpd. 135 | 3.8 | 778 | 0.137 | 0.120 | 88 |

As is understood from the data of Table 1, the organic light emitting diodes according to the present disclosure exhibited far higher luminance and light emission efficiency and a longer lifetime than those employing the compounds of Comparative Examples 1 and 2, thereby demonstrating their high applicability to organic electroluminescence devices.

INDUSTRIAL APPLICABILITY

Available for use in organic light emitting devices having excellent properties, such as high luminance, high light emission efficiency, and long lifetime, the present disclosure is industrially applicable.

The invention claimed is:
1. An organic light-emitting diode, comprising:
   a first electrode;
   a second electrode facing the first electrode; and
   a light-emitting layer interposed therebetween,
   wherein the light-emitting layer contains at least one of the amine compounds represented by Chemical Formula A or Chemical Formula B and at least one of the compounds represented by Chemical Formulas H1 to H7:

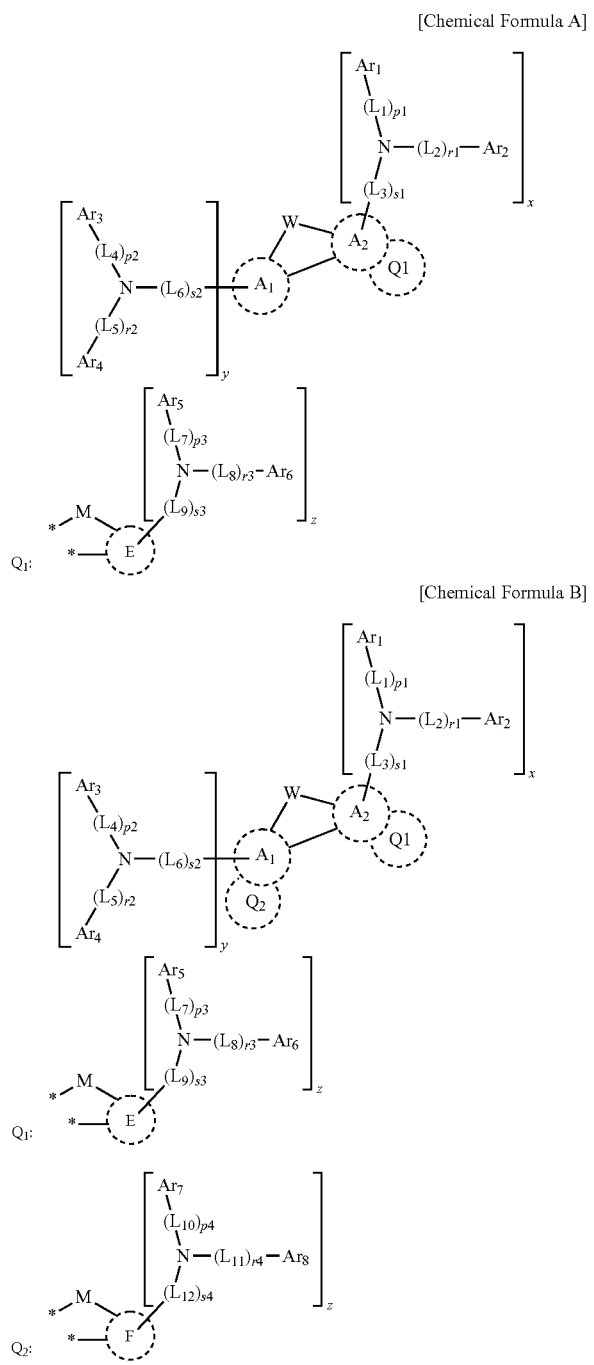

wherein,
$A_1$, $A_2$, E, and F are the same or different, and are each independently a substituted or unsubstituted aromatic hydrocarbon ring of 6 to 50 carbon atoms, or a substituted or unsubstituted heteroaromatic ring of 2 to 40 carbon atoms, wherein two adjacent carbon atoms of the aromatic ring $A_1$ and two adjacent carbon atoms of the aromatic ring $A_2$ form a 5-membered fused ring together with W;
linkers $L_1$ to $L_{12}$ are the same or different, and are each independently selected from among a direct bond, a substituted or unsubstituted arylene of 6 to 60 carbon atoms, and a substituted or unsubstituted heteroarylene of 2 to 60 carbon atoms;
W is selected from among $CR_1R_2$, O, and S;
in Chemical Formula A, M is any one selected from among $CR_4R_5$, O, and S;
in Chemical Formula B, M is any one selected from among N—$R_3$, $CR_4R_5$, O, and S;
$R_1$ to $R_2$, and $Ar_1$ to $Ar_2$ are the same or different, and are each independently any one selected from among hydrogen, deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkylsilyl of 1 to 30 carbon atoms, a substituted or unsubstituted arylsilyl of 5 to 30 carbon atoms, a cyano, a nitro, and a halogen, with the proviso that $R_1$ and $R_2$ may be bonded to each other to form a mono- or polycyclic aliphatic or aromatic ring;
$R_3$ to $R_5$ are the same or different, and are each independently any one selected from among hydrogen, deuterium, a substituted or unsubstituted alkyl of 1 to 30 carbon atoms, a substituted or unsubstituted cycloalkyl of 3 to 30 carbon atoms, a substituted or unsubstituted aryl of 6 to 50 carbon atoms;
p1 to p4, $r_1$ to $r_4$, and s1 to s4 are each independently an integer of 1 to 3, with the proviso that when any of them is 2 or greater, the corresponding linkers may be the same or different,
in Chemical Formula A, x is 1, y is 0 or 1, and z is 0 or 1, wherein y and z are not 0 at the same time;
in Chemical Formula B, x is 1, y is 0 or 1, and z is 0 or 1; and
$Ar_1$ may form a ring with Are, Ara may form a ring with $Ar_4$, $Ar_5$ may form a ring with $Ar_6$, and $Ar_7$ may form a ring with $Ar_8$,
two adjacent carbon atoms of the $A_2$ ring moiety of Chemical Formula A may occupy respective positions * of Structural Formula $Q_1$ to form a fused ring, and
two adjacent carbon atoms of the $A_1$ ring moiety of Chemical Formula B may occupy respective positions * of structural Formula $Q_2$ to form a fused ring, and two adjacent carbon atoms of the $A_2$ ring moiety of Chemical Formula B may occupy respective positions * of Structural Formula $Q_1$ to form a fused ring,

[Chemical Formula H1]

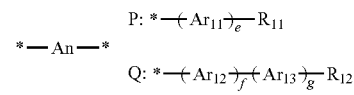

wherein,
an is a substituted or unsubstituted anthracene or a substituted or unsubstituted benzanthracene; $Ar_{11}$ to $Ar_{13}$ are the same or different and are each independently a single bond, a substituted or unsubstituted aromatic linking group of 5 to 50 carbon atoms, or a substituted or unsubstituted heteroaromatic linking group of 2 to 60 carbon atoms, two sites of An represented by * are positions at which P and Q are respectively bonded to An, $R_{11}$ and $R_{12}$ are the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, and e, f, and g are the same or different and are each independently an integer of 0 to 2,

[Chemical Formula H2]

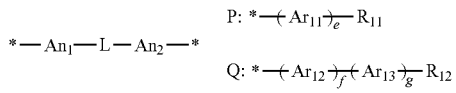

$P: *\!\!-\!\!(Ar_{11})_e\!\!-\!\!R_{11}$ $Q: *\!\!-\!\!(Ar_{12})_f\!\!-\!\!(Ar_{13})_g\!\!-\!\!R_{12}$ wherein $An_1$ and $An_2$ are the same or different and are each independently a substituted or unsubstituted anthracene or a substituted or unsubstituted benzanthracene, two sites of An represented by * are positions at which P and Q are respectively bonded to $An_1$ and $A_2$, L, $Ar_{11}$, $Ar_{12}$, and $Ar_{13}$ are the same or different and are each independently a single bond, a substituted or unsubstituted aromatic linking group of 5 to 50 carbon atoms, or a substituted or unsubstituted heteroaromatic linking group of 2 to 60 carbon atoms; and $R_{11}$ and $R_{12}$, e, f, and g are as defined in [Chemical Formula H1],

[Chemical Formula H3]

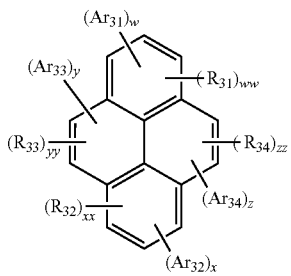

wherein, $Ar_{31}$ to $Ar_{34}$, and $R_{31}$ to $R_{34}$ are the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, w and ww are the same or different, satisfying the relationship that w+ww is an integer of 0 to 3, and x and xx may be the same or different, satisfying the relationship that x+xx is an integer of 0 to 3; and y and yy are the same or different, satisfying the relationship that y+yy is an integer of 0 to 2, and z and zz are the same or different, satisfying the relationship that z+zz is an integer of 0 to 2,

[Chemical Formula H4]

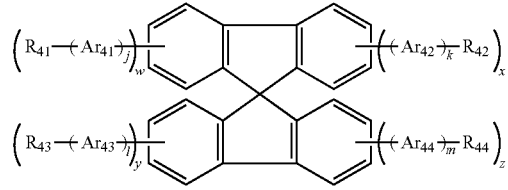

wherein, $Ar_{41}$ to $Ar_{44}$ are the same or different and are each independently a single bond, a substituted or unsubstituted aromatic linking group of 5 to 60 carbon atoms, or a substituted or unsubstituted heteroaromatic linking group of 5 to 60 carbon atoms, $R_{41}$ to $R_{44}$ are the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, j to m are the same or different and are each independently an integer of 0 to 2, and w to z are the same or different and are each independently an integer of 0 to 4,

[Chemical Formula H5]

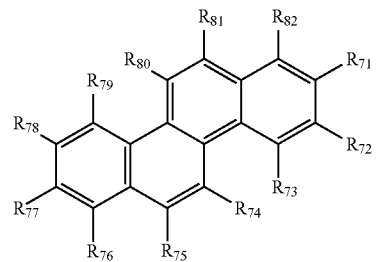

wherein, $Ar_{51}$ to $Ar_{53}$ are the same or different and are each independently a single bond, a substituted or unsubstituted aromatic linking group of 5 to 60 carbon atoms, or a substituted or unsubstituted heteroaromatic linking group of 5 to 60 carbon atoms, $R_{51}$ to $R_{56}$ are the same or different and are each independently selected from hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, and p to r are the same or different and are each independently an integer of 0 to 3,

[Chemical Formula H6]

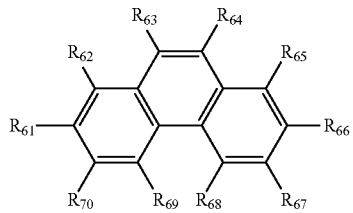

wherein, $R_{61}$ to $R_{70}$ are the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen,

[Chemical Formula H7]

wherein, $R_{71}$ to $R_{82}$ are the same or different, and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, wherein the term 'substituted' in the expression 'substituted or unsubstituted' used in Chemical Formulas A, B, and H1 to H7 means having at least one substituent selected from the group consisting of a deuterium, a cyano, a halogen, an alkyl of 1 to 24 carbon atoms, a halogenated alkyl of 1 to 24 carbon atoms, an aryl of 6 to 24 carbon atoms, an arylalkyl of 7 to 24 carbon atoms, a heteroaryl of 2 to 24 carbon atoms, an alkylsilyl of 1 to 24 carbon atoms, and an arylsilyl of 6 to 24 carbon atoms.

2. The organic light-emitting diode of claim 1, wherein the light-emitting layer of the organic light-emitting diode comprises a host and a dopant, wherein the dopant is selected from among the amine compounds represented by Chemical Formulas A and B and the host is selected from among the compounds represented by Chemical Formulas H1 to H7.

3. The organic light-emitting diode of claim 2, wherein the anthracene derivative of Chemical Formula H1 may be a compound represented by the following Chemical Formula C:

[Chemical Formula C]

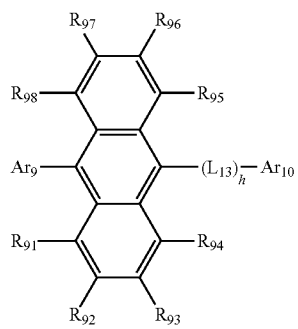

wherein
$R_{91}$ to $R_{98}$ may be the same or different and are each as defined for $R_1$ to $R_9$;
$Ar_9$ and $Ar_{10}$ may be the same or different and are each independently selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, and a substituted or unsubstituted arylsilyl of 5 to 30 carbon atoms;

$L_{13}$ is a single bond or is selected from among a substituted or unsubstituted arylene of 6 to 20 carbon atoms and a substituted or unsubstituted heteroarylene of 2 to 20 carbon atoms; and h is an integer of 1 to 3, with the proviso that when h is 2 or greater, corresponding $L_{13}$'s may be the same or different.

4. The organic light-emitting diode of claim 1, wherein A1, A2, E and F in Chemical Formula A or B may be the same or different and are each independently substituted or unsubstituted aromatic hydrocarbon rings of 6 to 50 carbon atoms.

5. The organic light-emitting diode of claim 4, wherein the substituted or unsubstituted aromatic hydrocarbon rings of 6 to 50 carbon atoms are the same or different and are each independently selected from among compounds represented by Structural Formulas 10 to 21,

[Structural Formula 10]

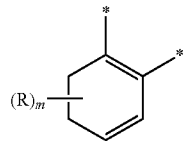

[Structural Formula 11]

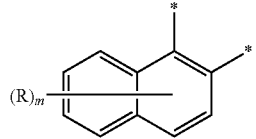

[Structural Formula 12]

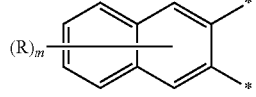

[Structural Formula 13]

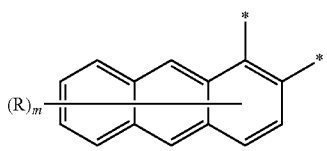

[Structural Formula 14]

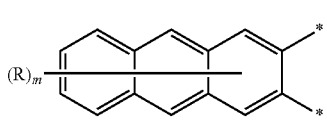

[Structural Formula 15]

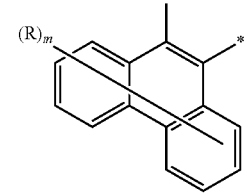

-continued

[Structural Formula 16]
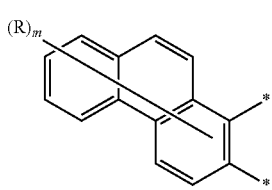

[Structural Formula 17]
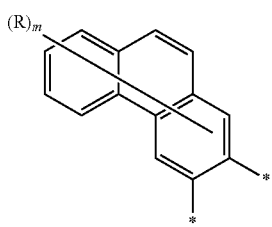

[Structural Formula 18]
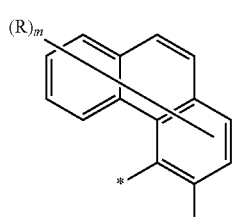

[Structural Formula 19]
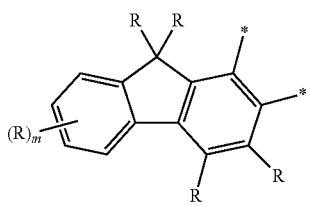

[Structural Formula 20]
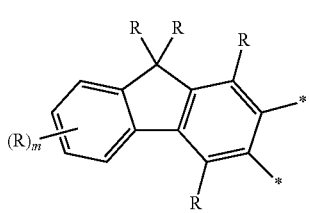

[Structural Formula 21]
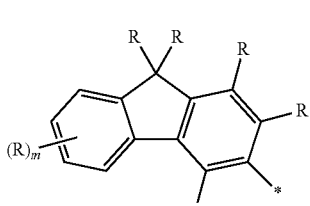

wherein

"-*" denotes a bonding site for forming a 5-membered ring containing W or a bonding site for forming a 5-membered ring containing M of the structural Formula $Q_1$ and $Q_2$;

when one of the aromatic hydrocarbon rings of [Structural Formula 10] to [Structural Formula 21] for $A_1$ or $A_2$ is bonded to Structural Formula $Q_1$ or Structural Formula $Q_2$, two adjacent carbon atoms of the aromatic hydrocarbon ring occupy respective positions * of Structural Formula $Q_1$ or $Q_2$ to form a fused ring;

R's are the same as defined above for $R_1$ and $R_2$, and m is an integer of 1 to 8, with the proviso that when m is 2 or greater or two or more R's exist, the corresponding R's may be the same or different.

6. The organic light-emitting diode of claim 1, wherein the compound of Chemical Formula H1 is that represented by the following Chemical Formula D:

[Chemical Formula D]
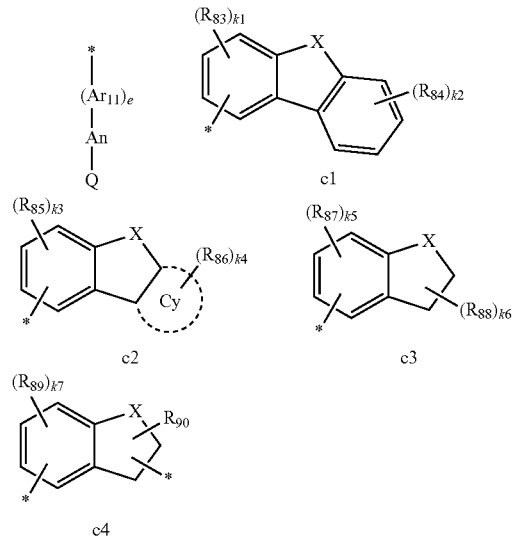

wherein, the site represented by *, connecting to $Ar_{11}$, corresponds to the site represented by * in substituents c1 to c4, X is any one selected from among —O—, —S—, —N($R_{101}$)—, and —C($R_{102}R_{103}$), $R_{83}$ to $R_{90}$, and $R_{101}$ to $R_{103}$ may be the same or different and are each as defined in claim 1 for $R_{11}$ and $R_{12}$, k1 to k7 are each an integer of 1 to 4, with the proviso that when k1 to k7 are each 2 or greater, corresponding $R_{83}$'s to $R_{89}$'s may be the same or different, An, Q, $Ar_{11}$, and e are each as defined in claim 1, and Cy is a substituted or unsubstituted aliphatic cyclic group of 2 to 8 carbon atoms.

7. The organic light-emitting diode of claim 1, wherein the linkers L1 to L12 are each a single bond or any one selected from among the following Structural Formulas 22 to 30, p1 to p4, r1 to r4, and s1 to s4 are each 1 or 2, and x is 1:

[Structural Formula 22]
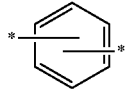

[Structural Formula 23]
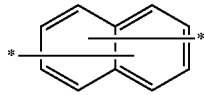

[Structural Formula 24]
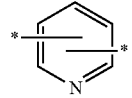

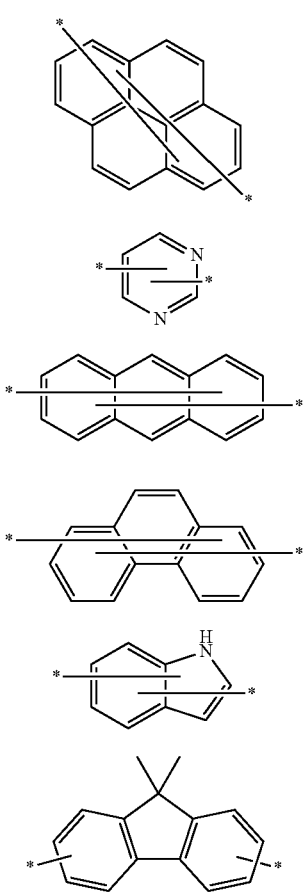

[Structural Formula 25]

[Structural Formula 26]

[Structural Formula 27]

[Structural Formula 28]

[Structural Formula 29]

[Structural Formula 30]

wherein each of the unsubstituted carbon atoms of the aromatic ring moiety in the linkers is bound with a hydrogen atom or a deuterium atom.

8. The organic light-emitting diode of claim 3, wherein $Ar_9$ of Chemical Formula C is a substituent represented by the following Chemical Formula C-1:

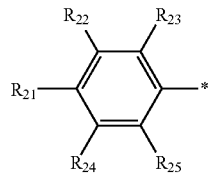

[Chemical Formula C-1]

wherein $R_{21}$ to $R_{25}$ may be the same or different and are each as defined in claim 1 for $R_{11}$ and $R_{12}$, with a proviso that adjacent substituents may form a saturated or unsaturated cyclic ring.

9. The organic light-emitting diode of claim 8, wherein $L_{13}$ is a single bond or a substituted or unsubstituted arylene of 6 to 20 carbon atoms, and h is 1 or 2, with a proviso that when h is 2, corresponding $L_{13}$'s may be the same or different.

10. The organic light-emitting diode of claim 1, wherein W of Chemical Formulas A and B is $CR_1R_2$.

11. The organic light-emitting diode of claim 1, wherein the amine compound is selected from among the following Compounds 1 to 7, 9 to 22, 28, 29, 31 to 34, 36 to 39, 41 to 51, 53, 55 to 60:

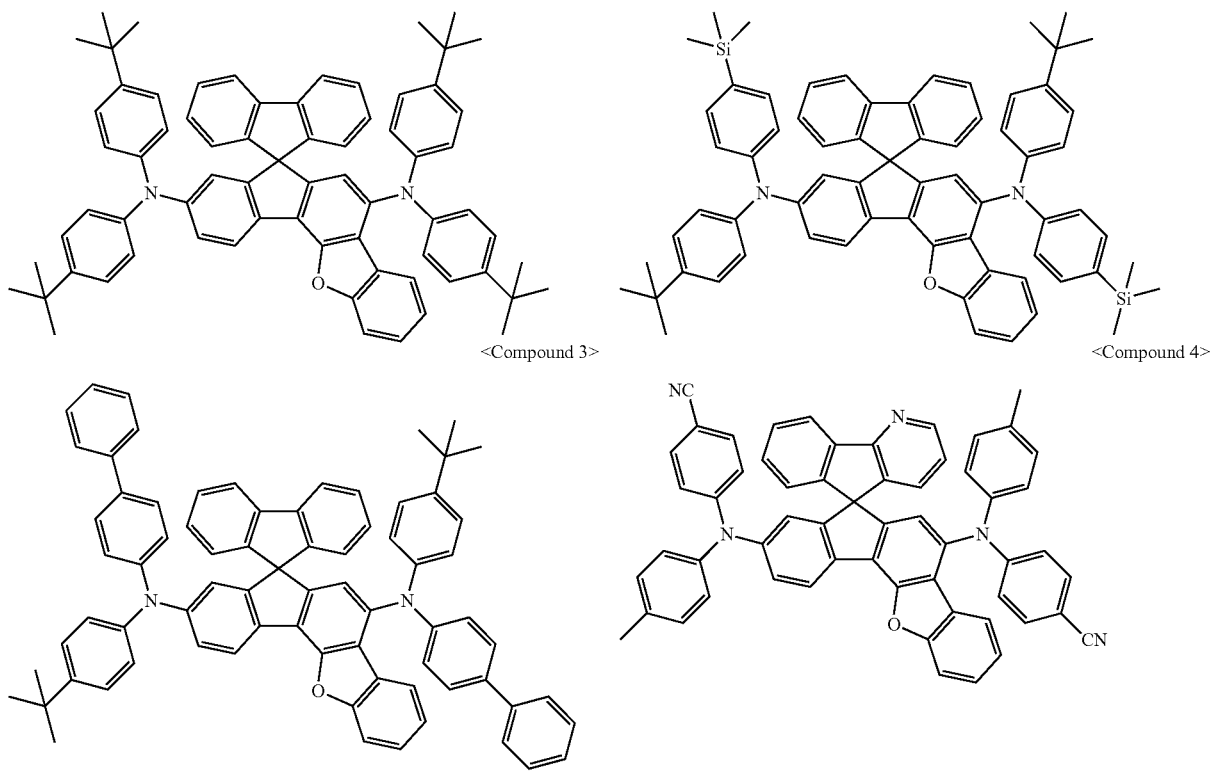

-continued
<Compound 5>
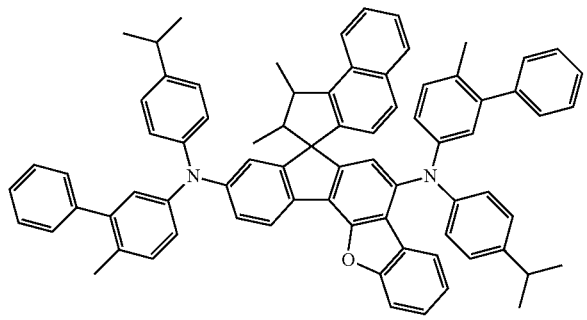
<Compound 6>
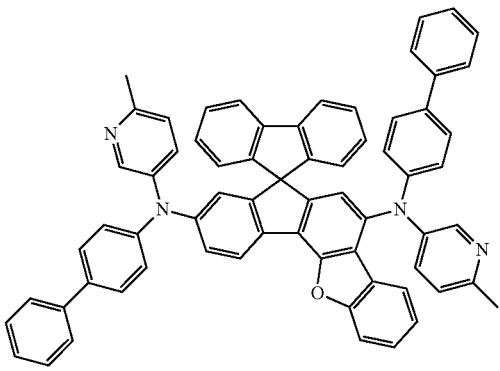
<Compound 7>
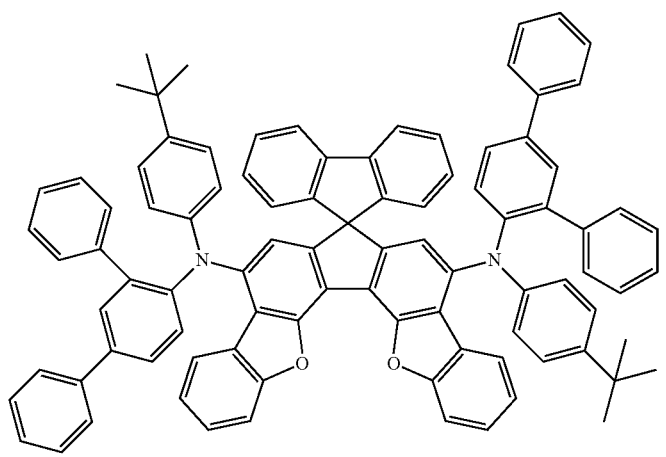
<Compound 9>
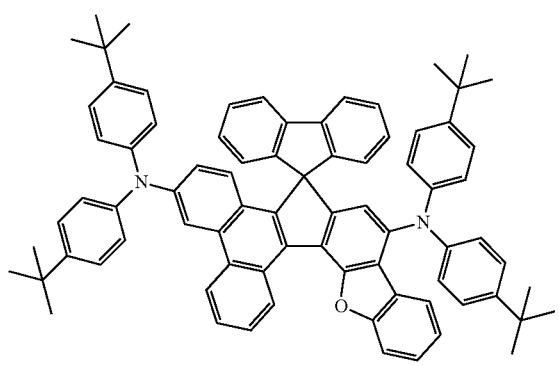
<Compound 10>
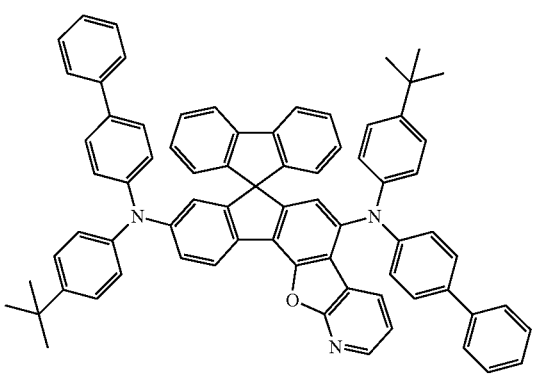
<Compound 11>
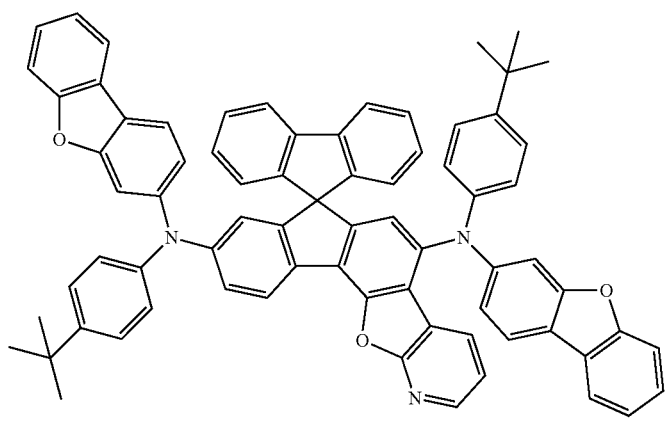

-continued
<Compound 12>
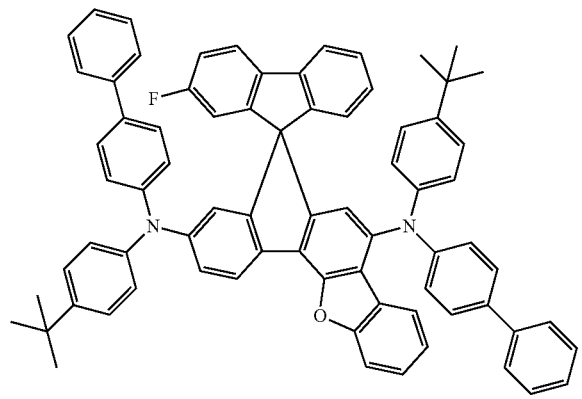
<Compound 13>
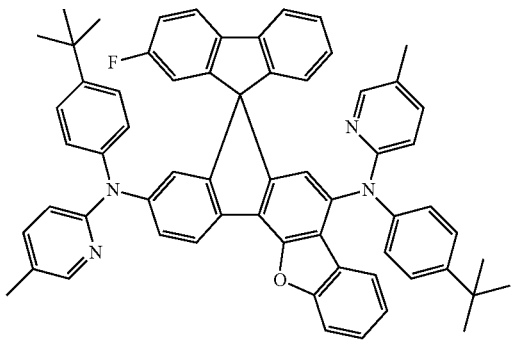
<Compound 14>
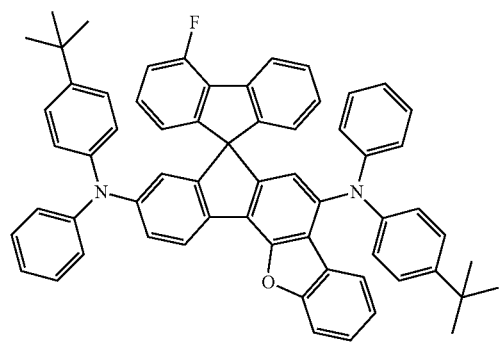
<Compound 15>
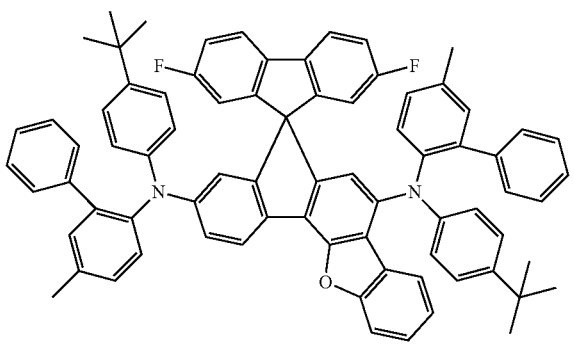
<Compound 16>
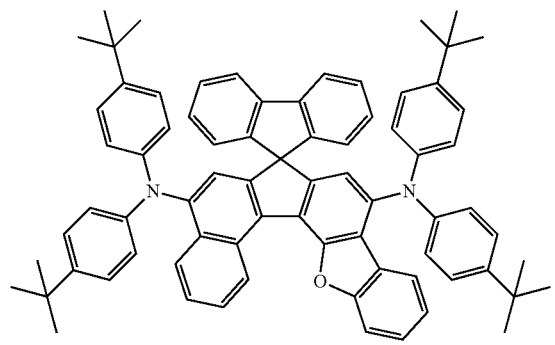
<Compound 17>
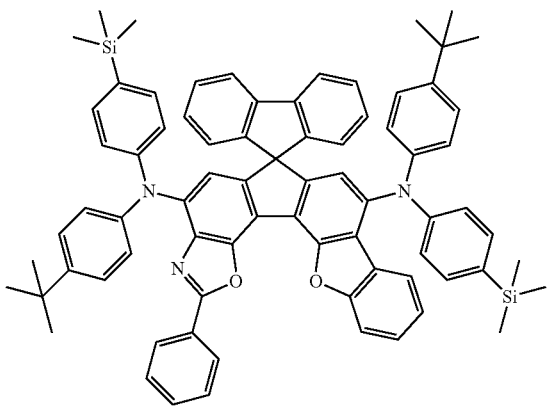

-continued
<Compound 18>
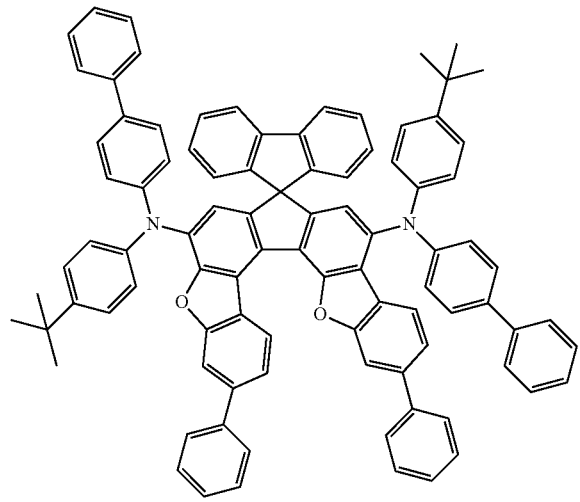
<Compound 19>
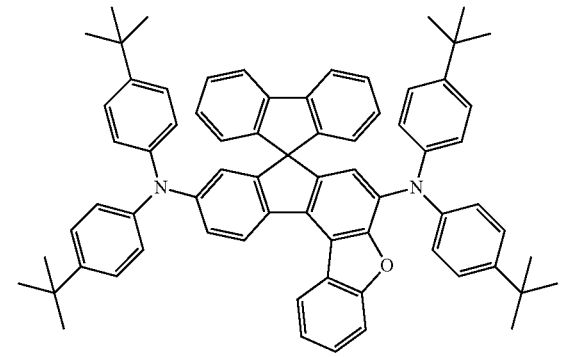
<Compound 20>
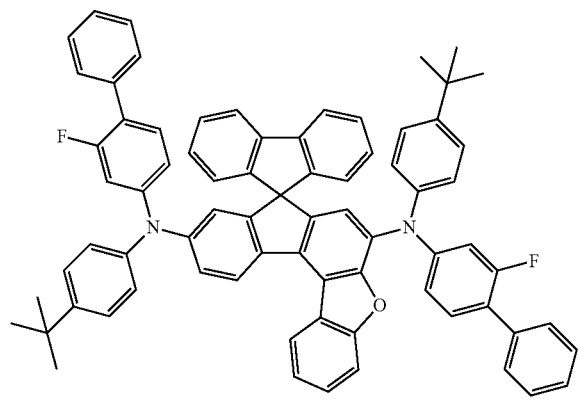
<Compound 21>
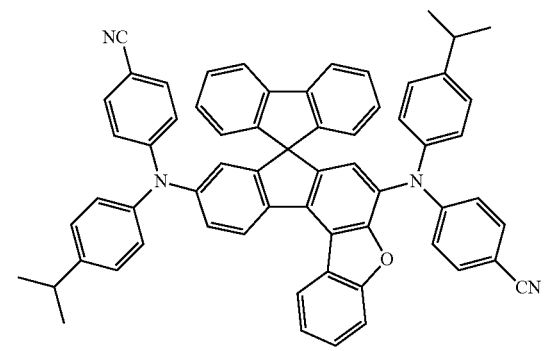
<Compound 22>
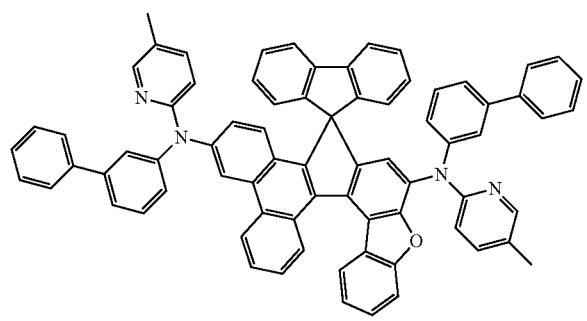
<Compound 28>
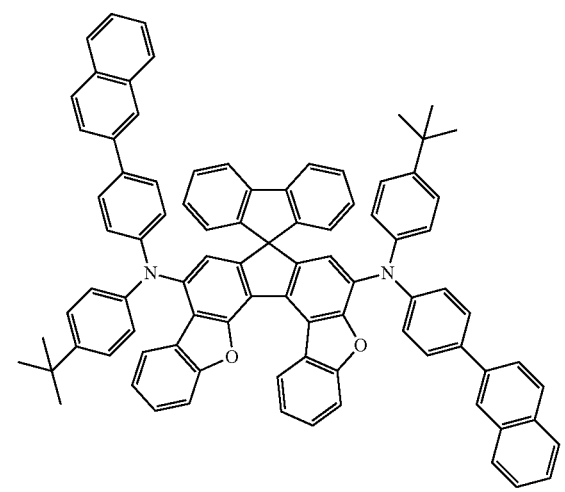

<Compound 29>
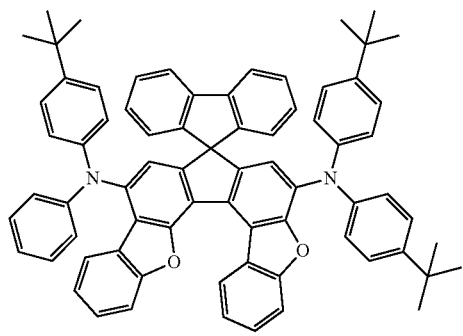
<Compound 31>
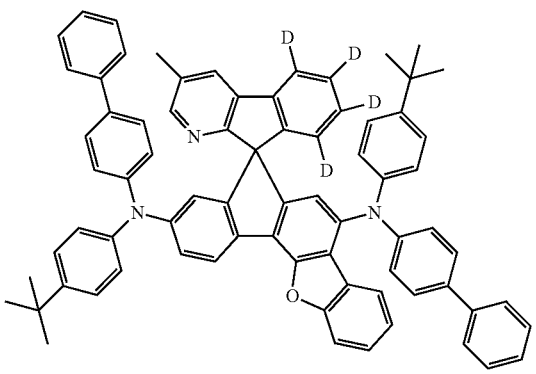
<Compound 32>
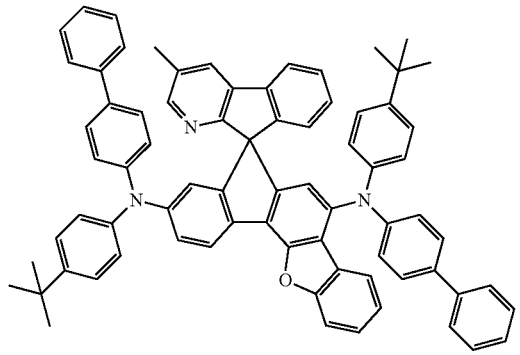
<Compound 33>
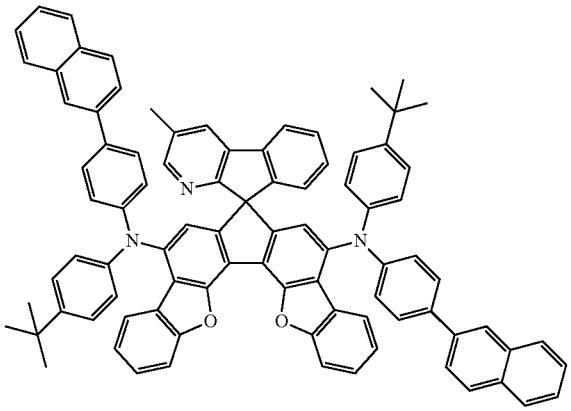
<Compound 34>
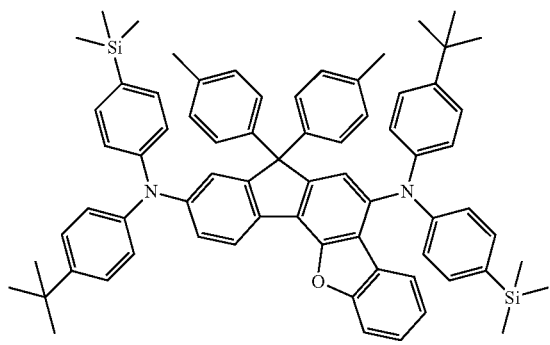
<Compound 36>
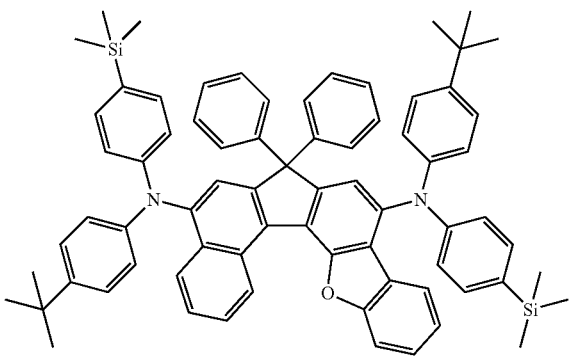

-continued
<Compound 37>
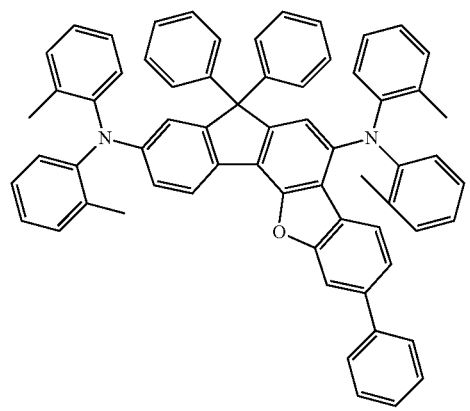
<Compound 38>
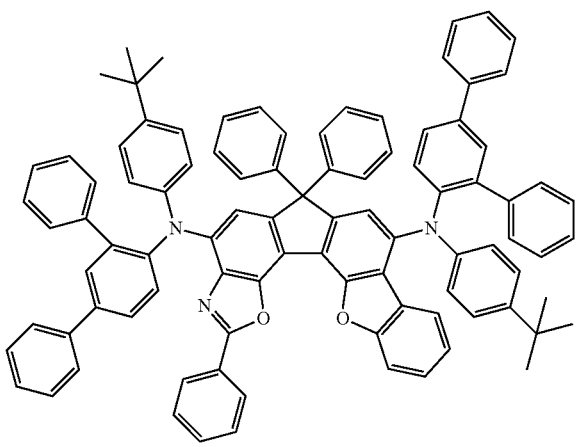
<Compound 39>
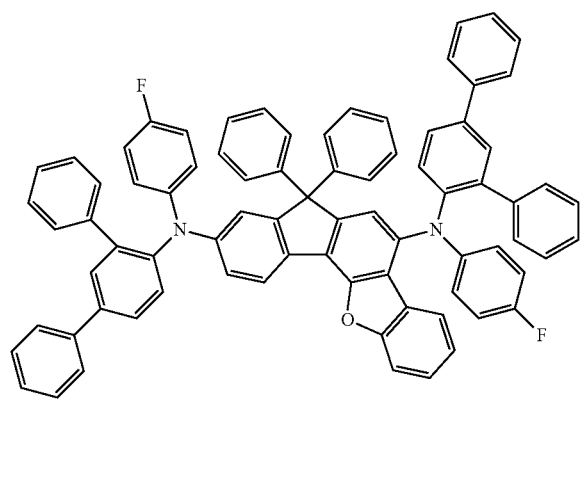
<Compound 41>
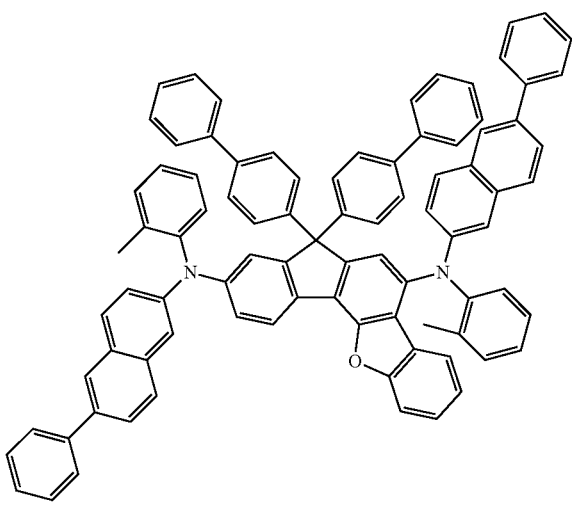
<Compound 42>
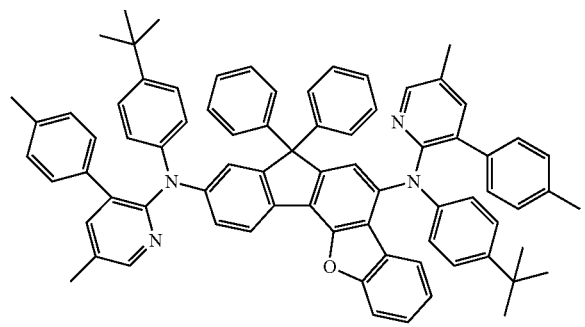
<Compound 43>
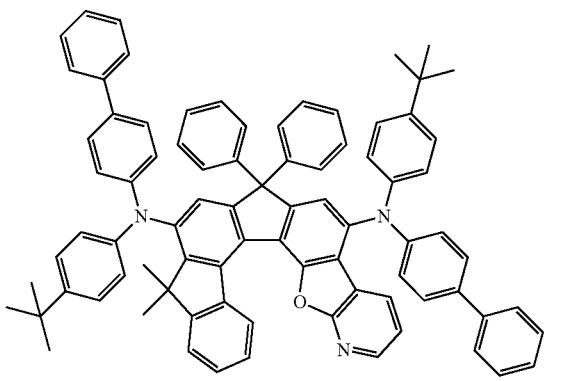

-continued
<Compound 44>
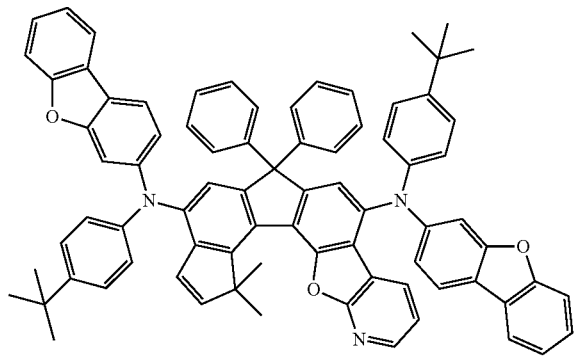
<Compound 45>
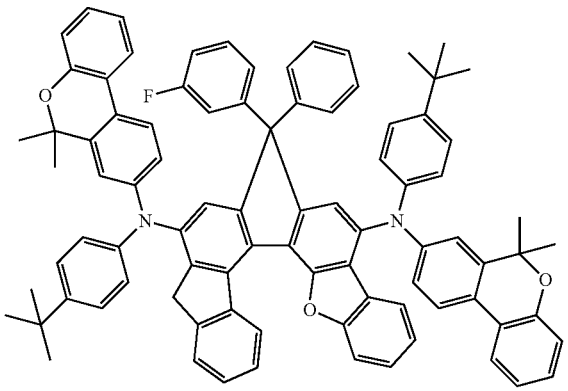
<Compound 46>
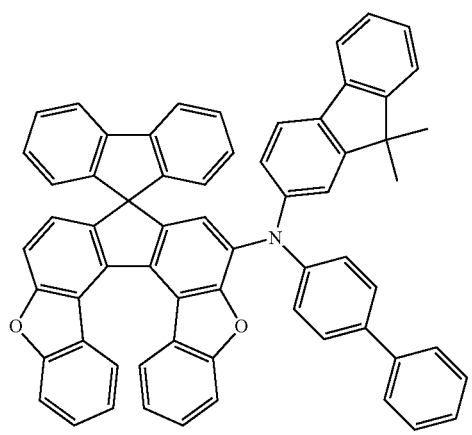
<Compound 47>
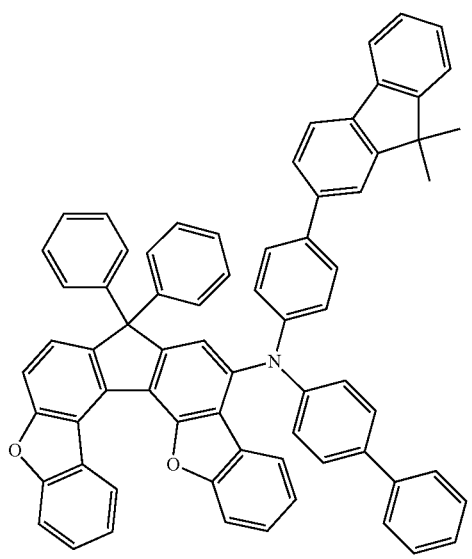
<Compound 48>
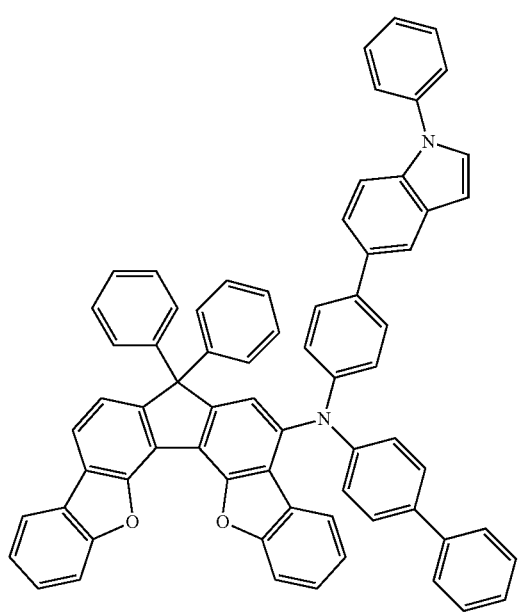

<Compound 49>
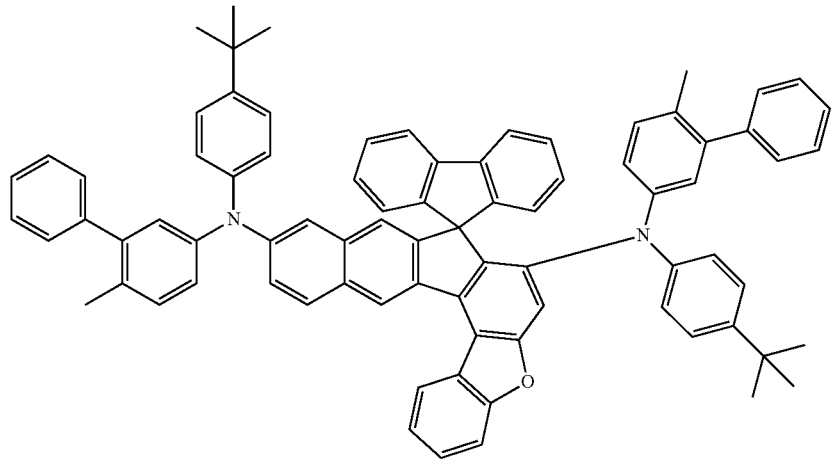
<Compound 50>
<Compound 51>
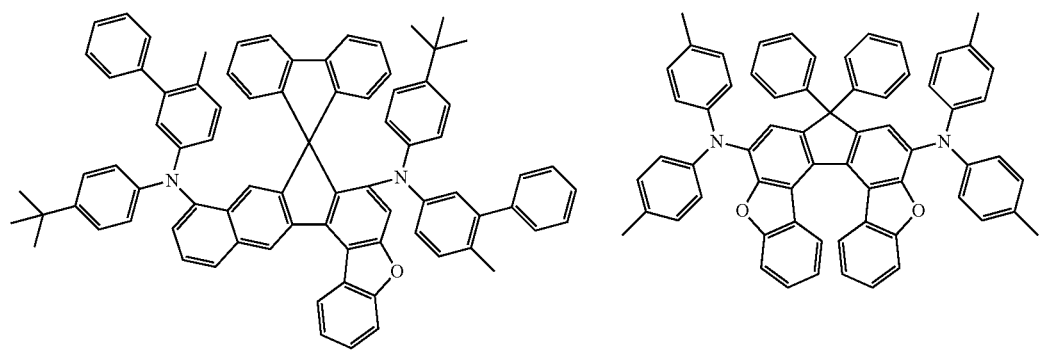
<Compound 53>
<Compound 54>
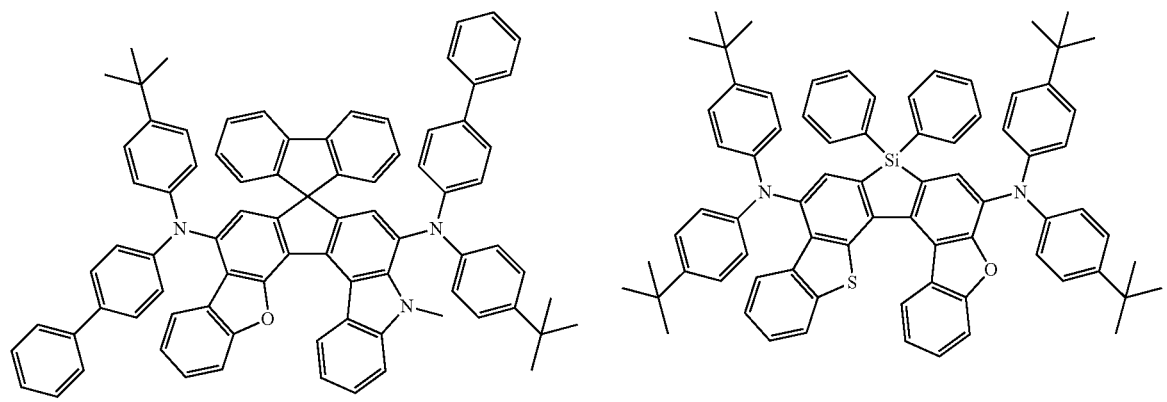
<Compound 55>
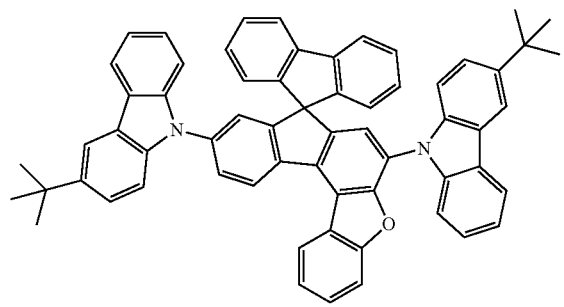

-continued
<Compound 56>
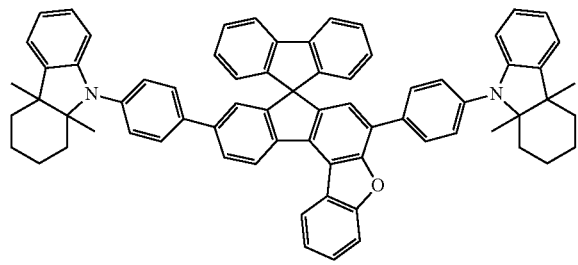
<Compound 57>
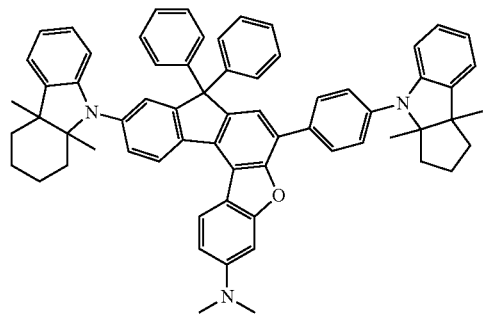
<Compound 58>
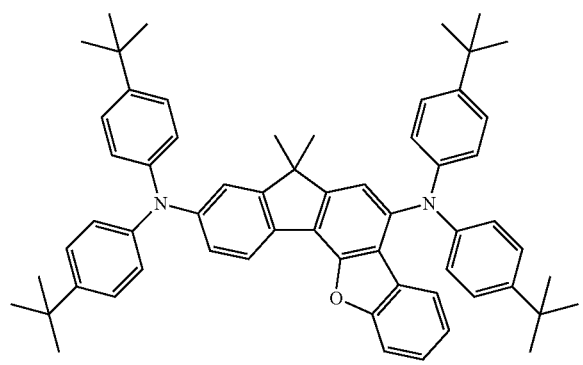
<Compound 59>
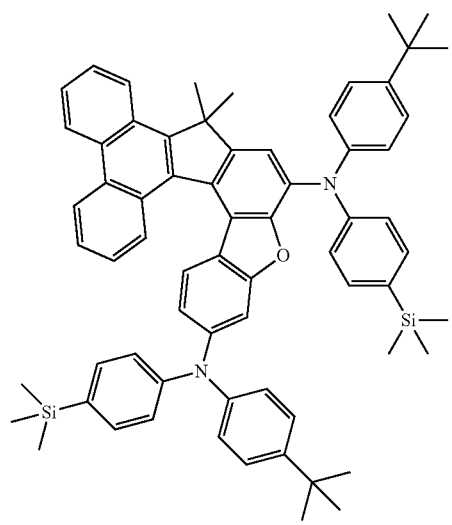
<Compound 60>
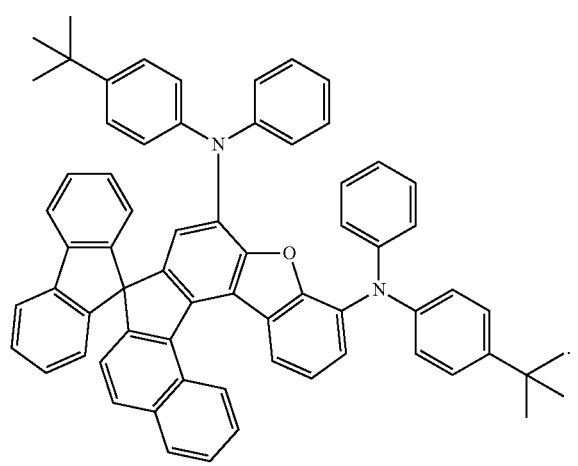

12. The organic light-emitting diode of claim 1, wherein the compound represented by one of Chemical Formula H1 to H7 are any one organic compound selected from among the following Compounds 101 to 199,
<Compound 101>
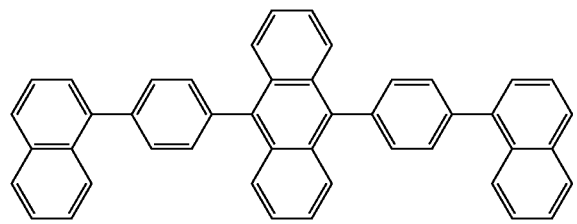
<Compound 102>
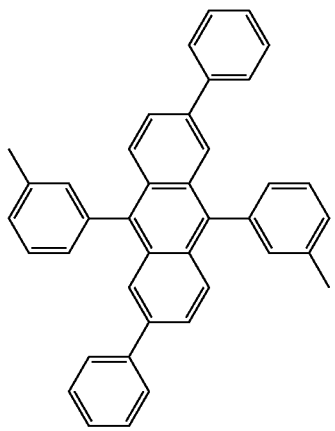
<Compound 103>
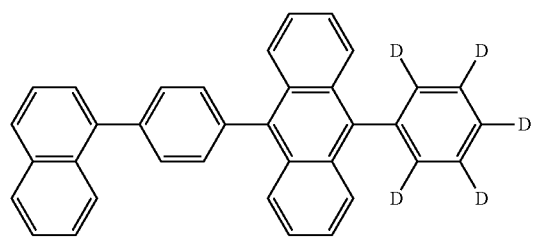
<Compound 104>
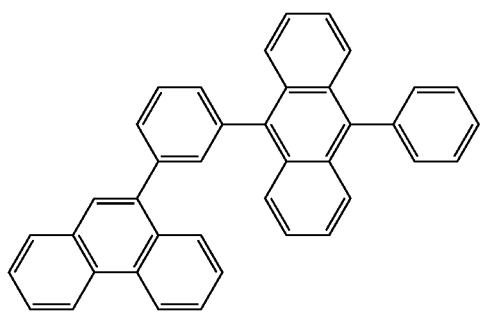
<Compound 105>
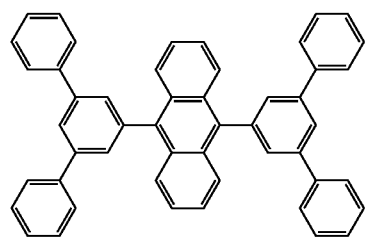
<Compound 106>
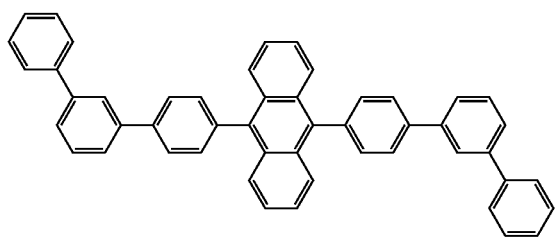
<Compound 107>
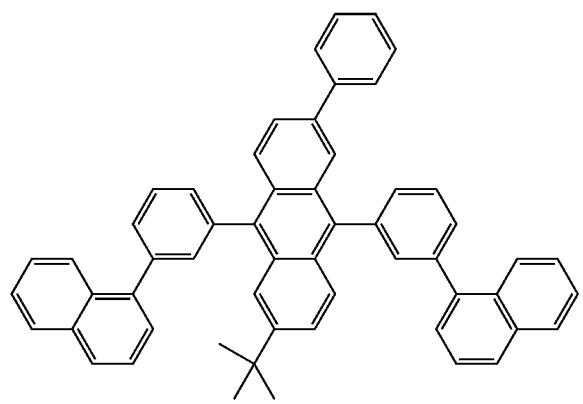
<Compound 108>
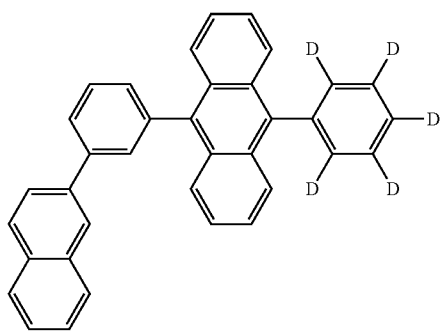

<Compound 109>
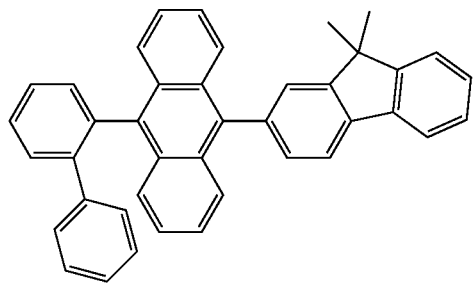
<Compound 110>
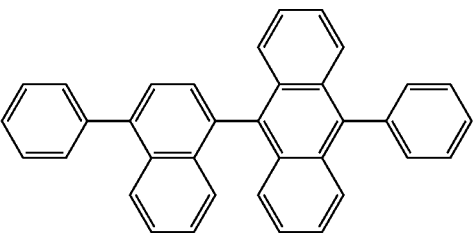
<Compound 111>
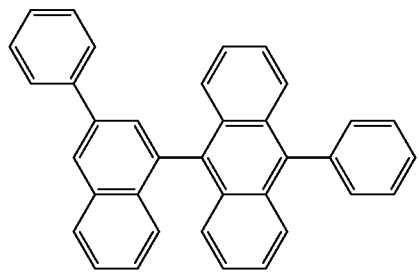
<Compound 112>
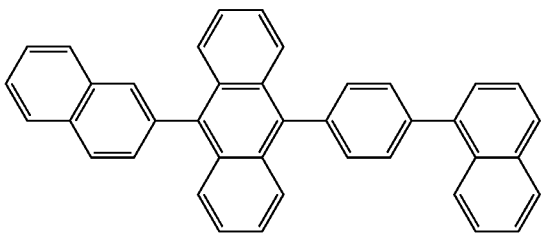
<Compound 113>
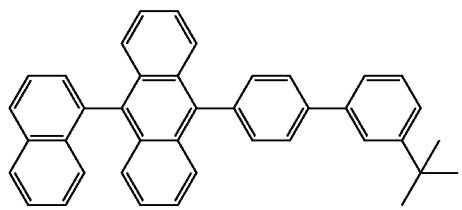
<Compound 114>
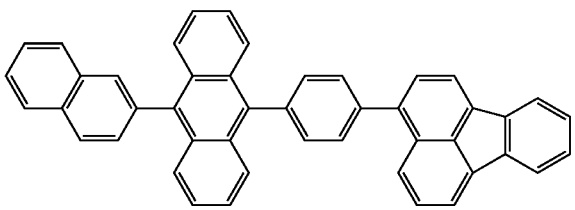
<Compound 115>
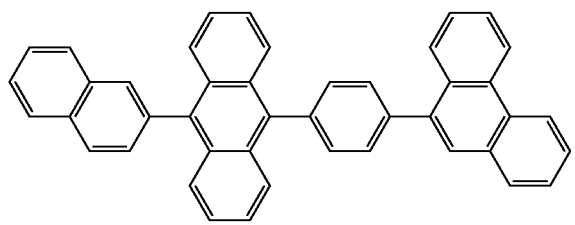
<Compound 116>
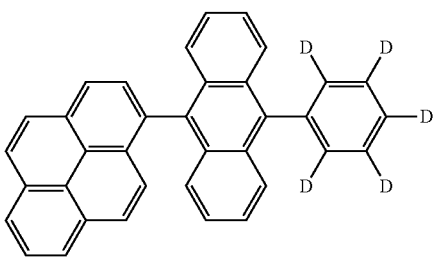
<Compound 117>
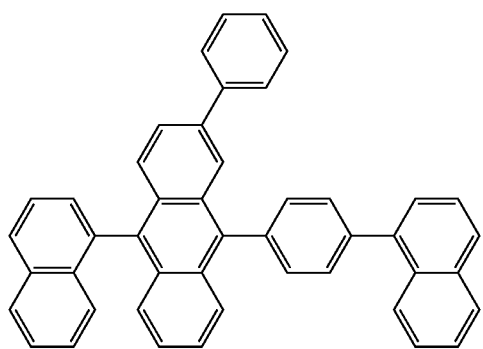
<Compound 118>

-continued
<Compound 119>
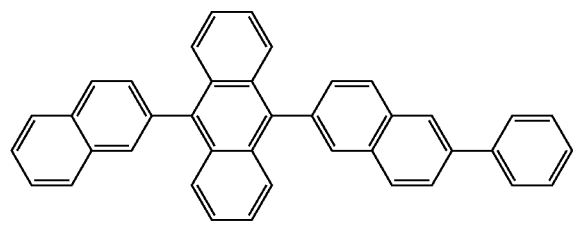
<Compound 120>
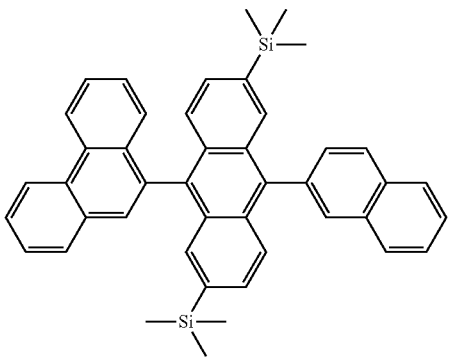
<Compound 121>
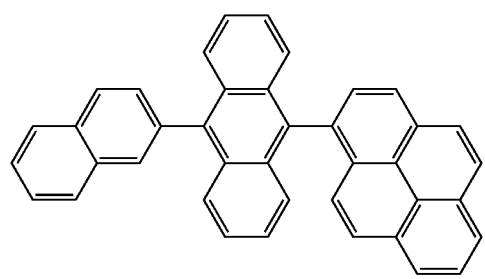
<Compound 122>
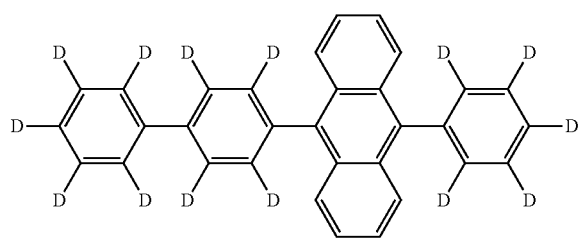
<Compound 123>
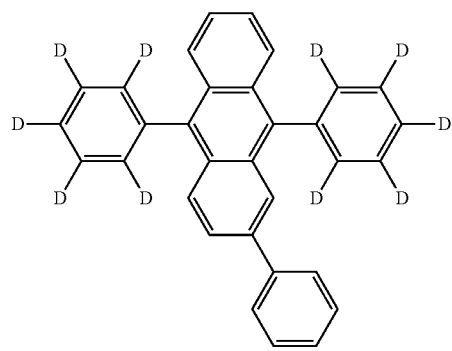
<Compound 124>
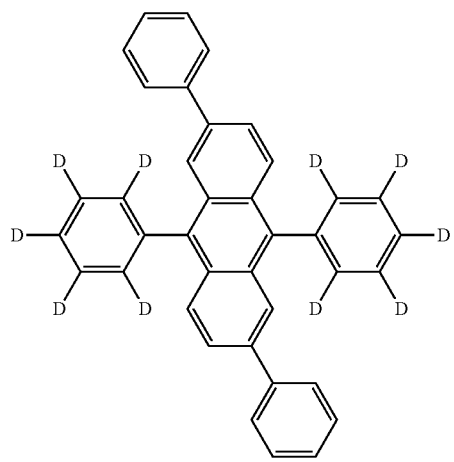
<Compound 125>
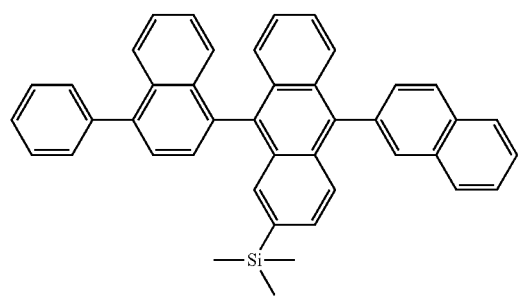
<Compound 126>
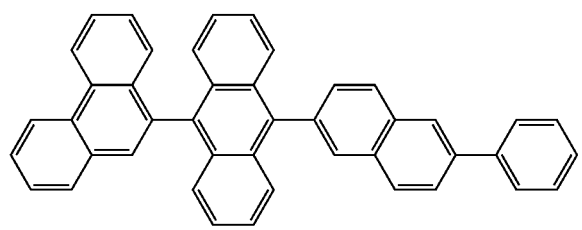

-continued
<Compound 127>
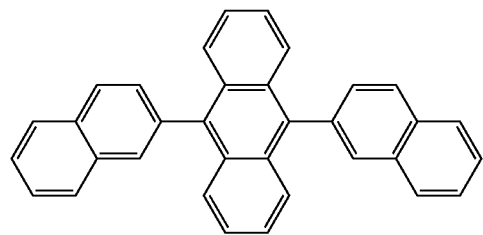
<Compound 128>
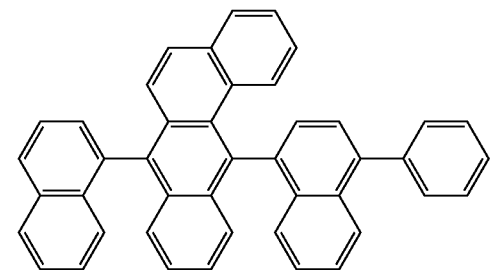
<Compound 129>
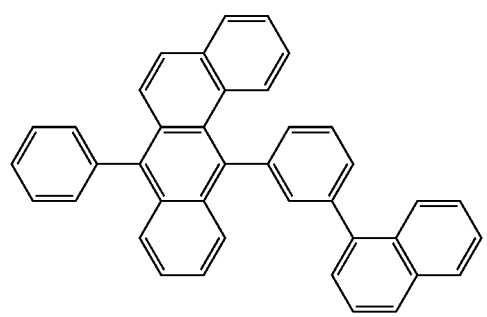
<Compound 130>
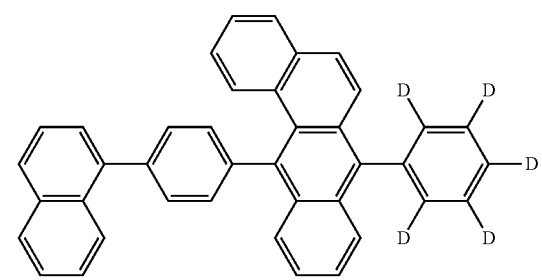
<Compound 131>
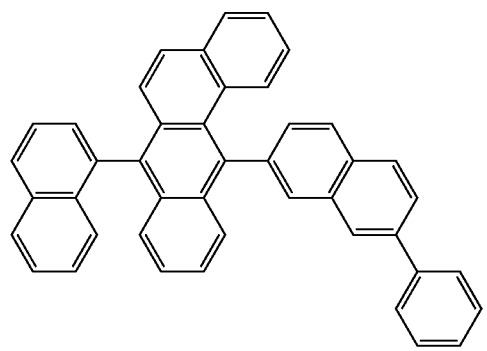
<Compound 132>
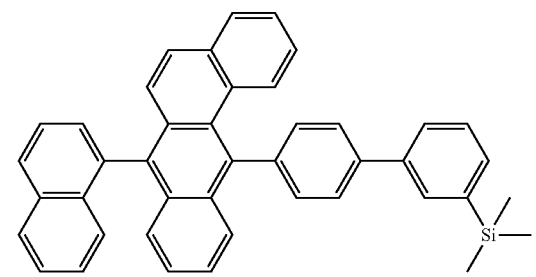
<Compound 133>
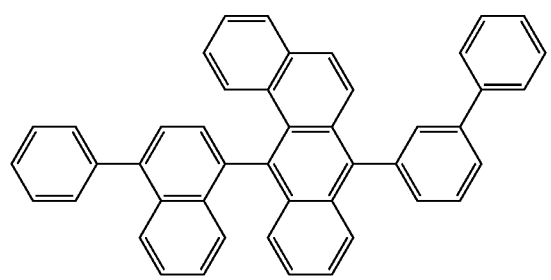
<Compound 134>
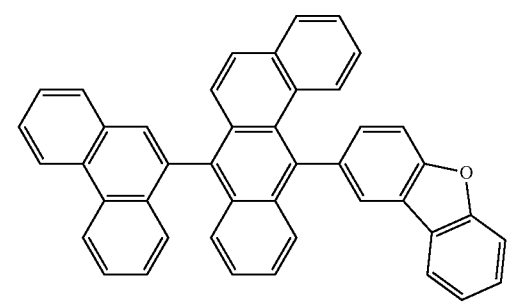

<Compound 135>
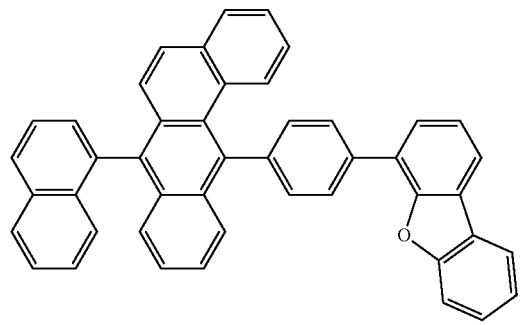
<Compound 136>
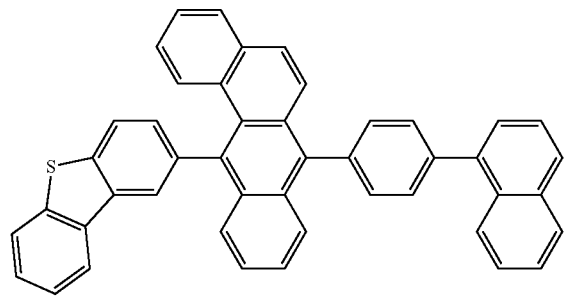
<Compound 137>
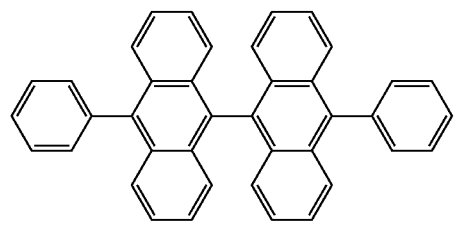
<Compound 138>
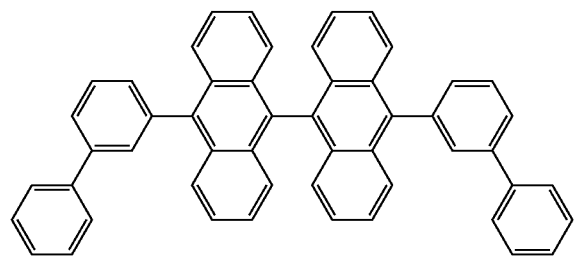
<Compound 139>
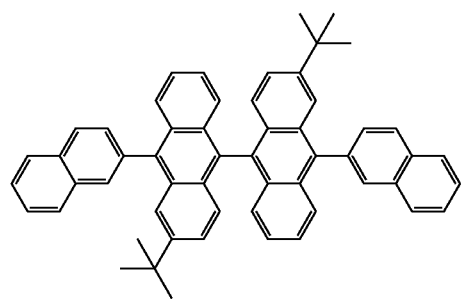
<Compound 140>
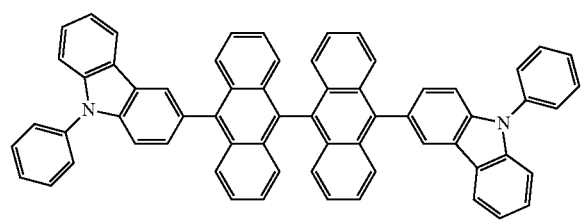
<Compound 141>
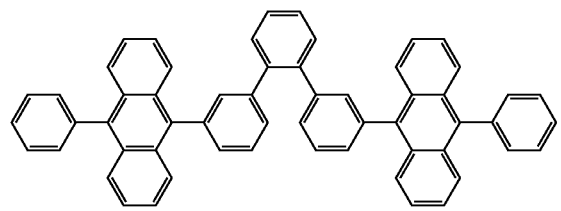
<Compound 142>
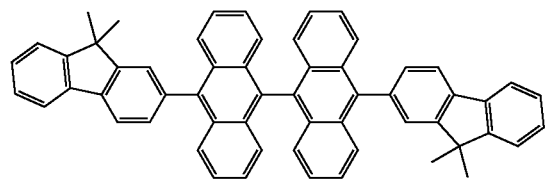
<Compound 143>
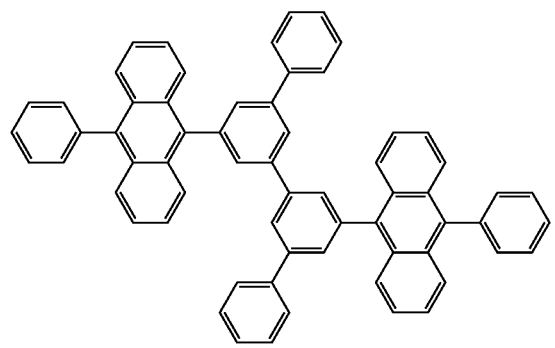
<Compound 144>
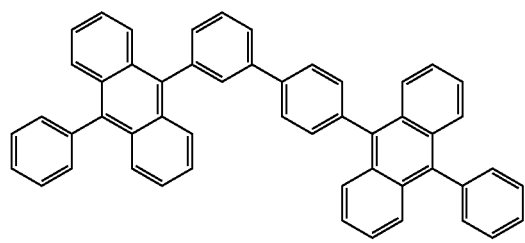

-continued
<Compound 145>
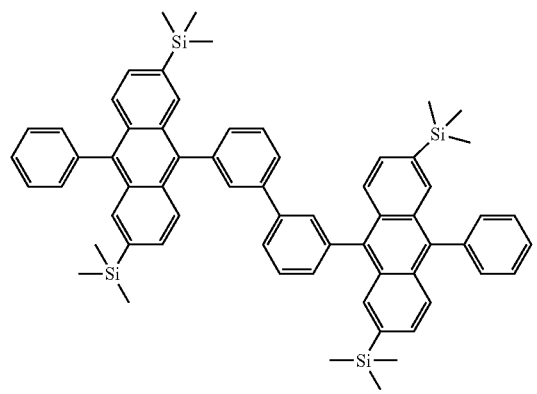
<Compound 146>
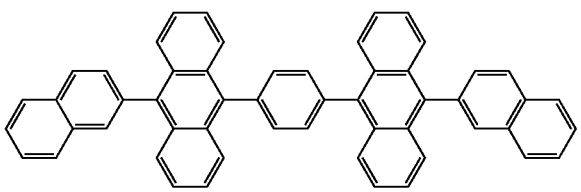
<Compound 147>
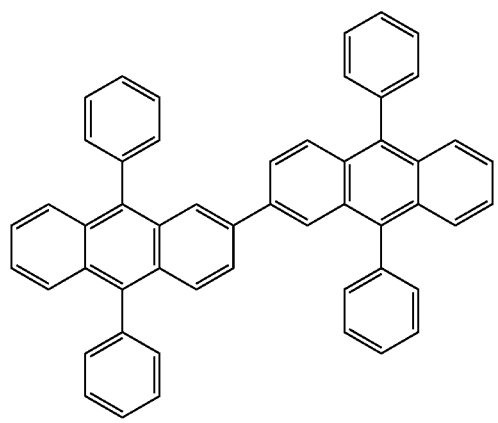
<Compound 148>
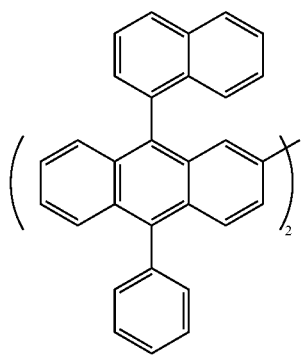
<Compound 149>
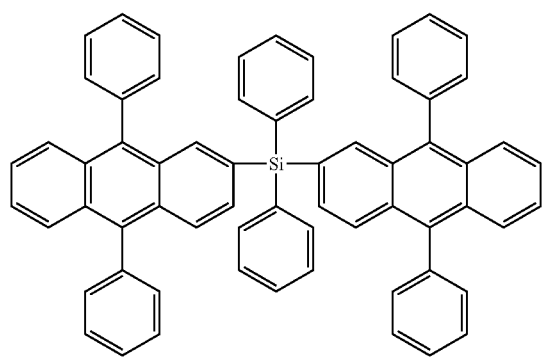
<Compound 150>
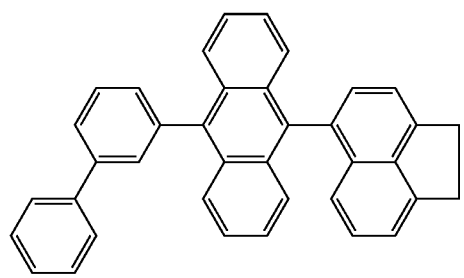
<Compound 151>
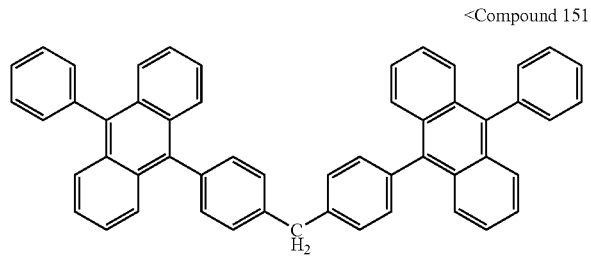
<Compound 152>
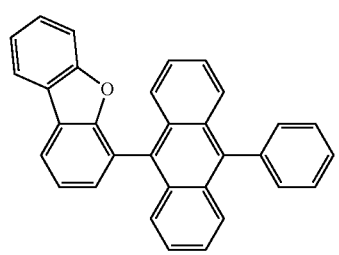

-continued
<Compound 153>
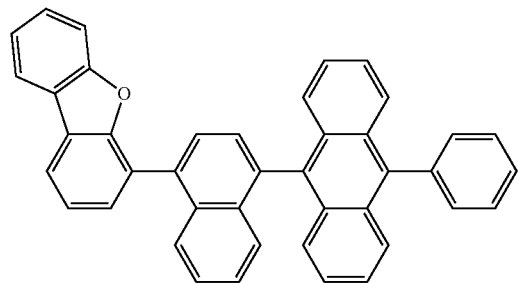
<Compound 154>
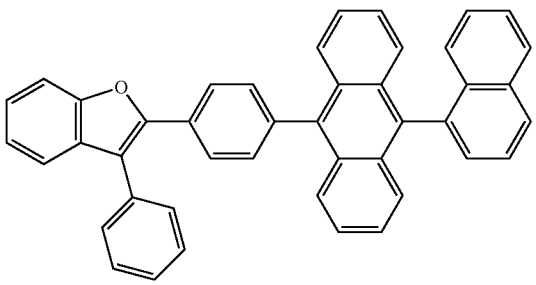
<Compound 155>
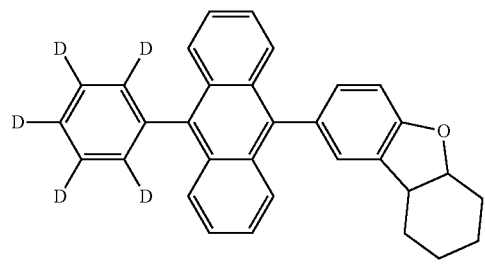
<Compound 156>
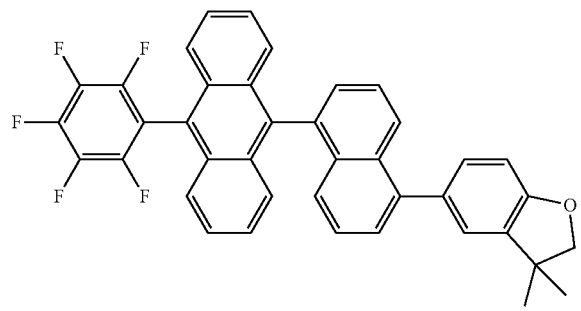
<Compound 157>
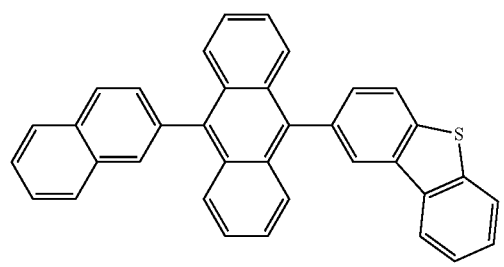
<Compound 158>
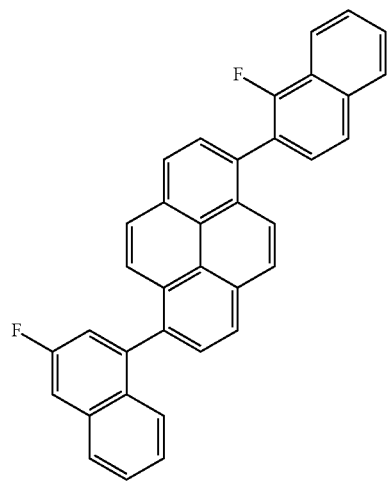
<Compound 159>
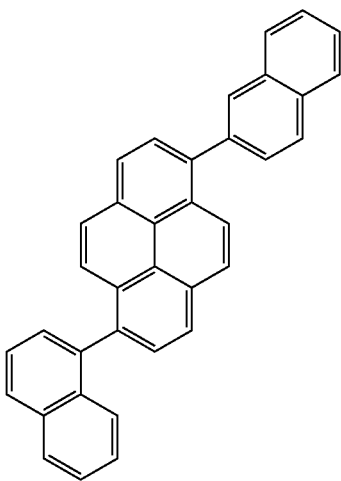

-continued
<Compound 160>
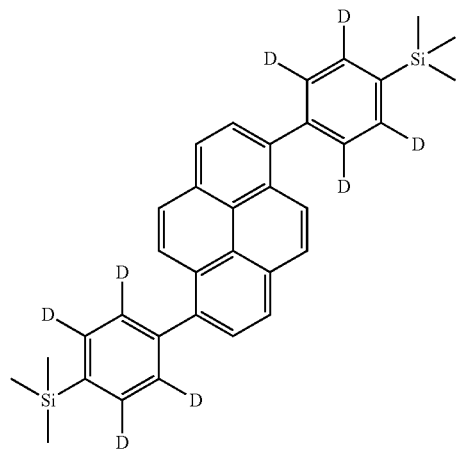
<Compound 161>
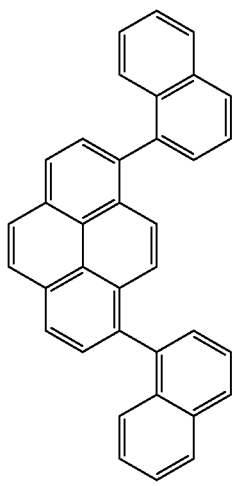
<Compound 162>
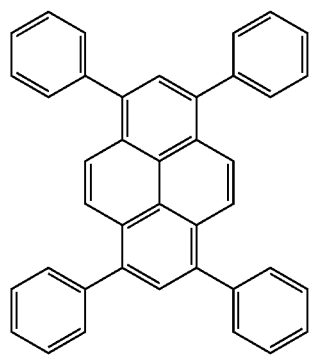
<Compound 163>
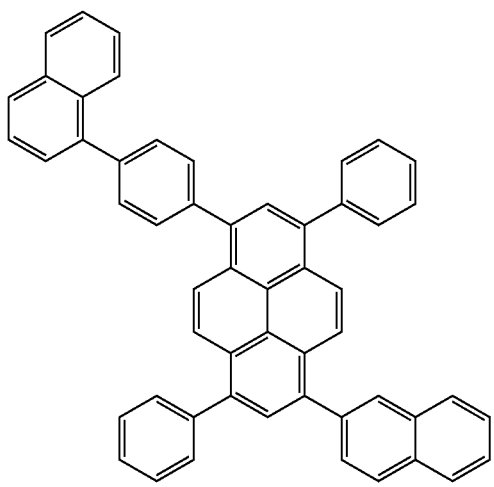
<Compound 164>
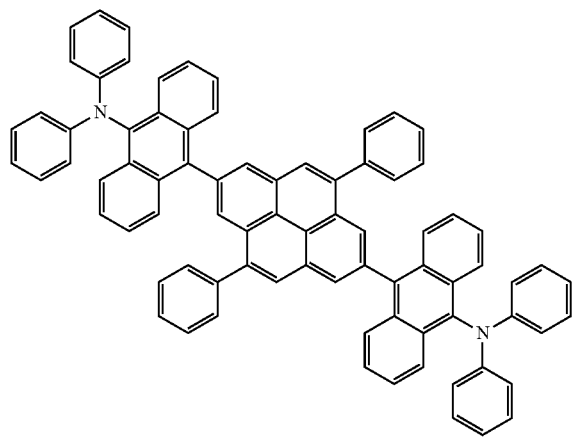
<Compound 165>
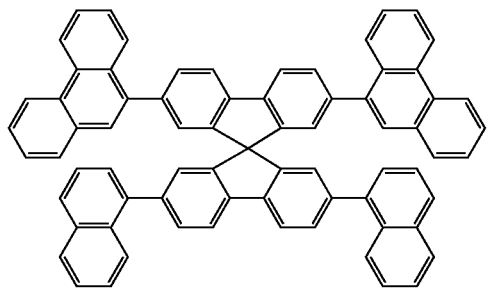

<Compound 166>
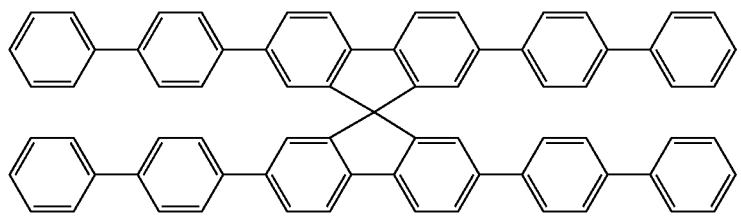
<Compound 167>
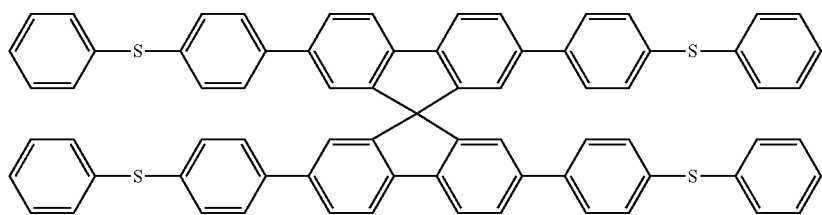
<Compound 168>
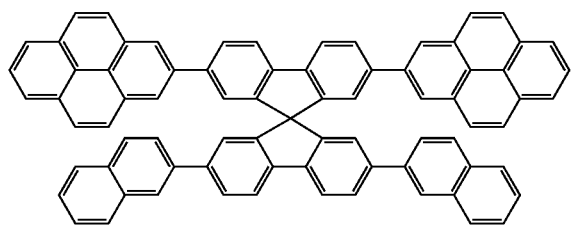
<Compound 169>
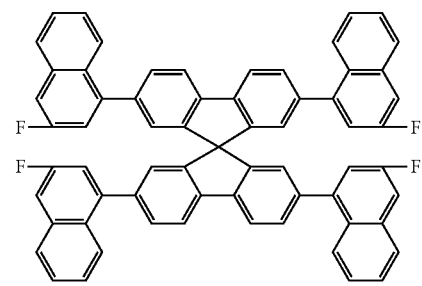
<Compound 170>
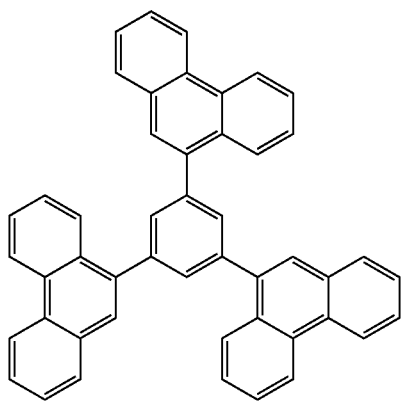
<Compound 171>
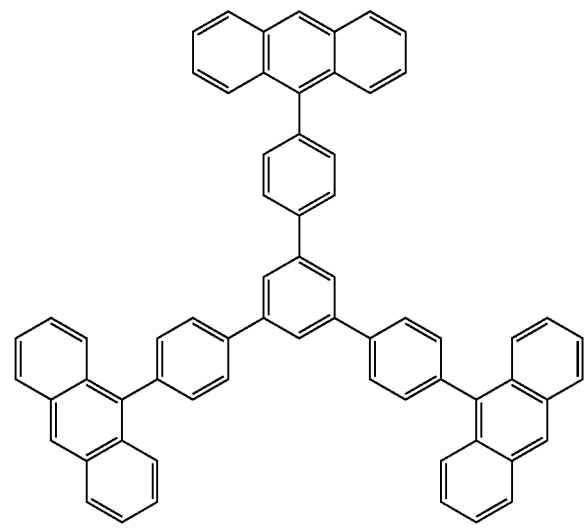

-continued
<Compound 172>
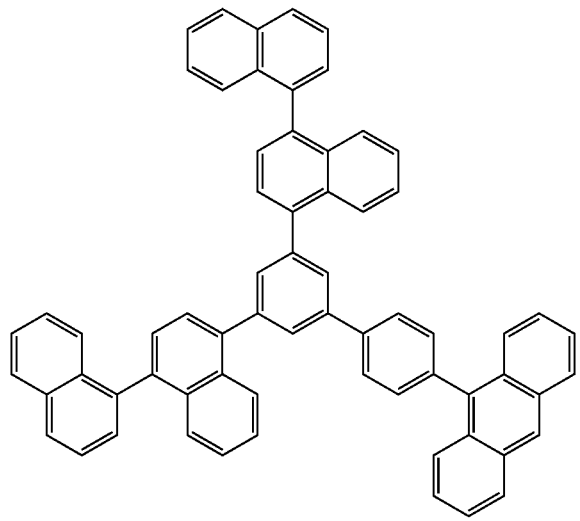
<Compound 173>
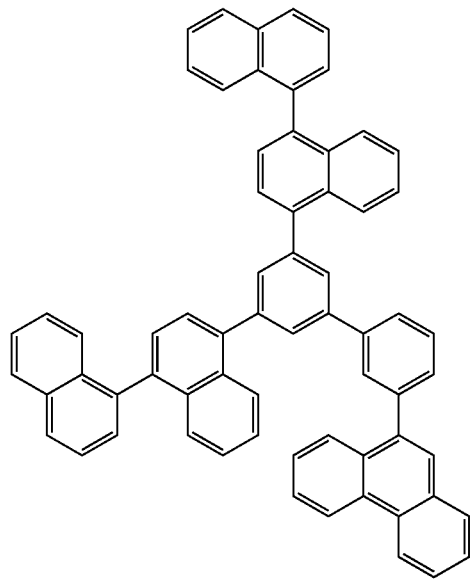
<Compound 174>
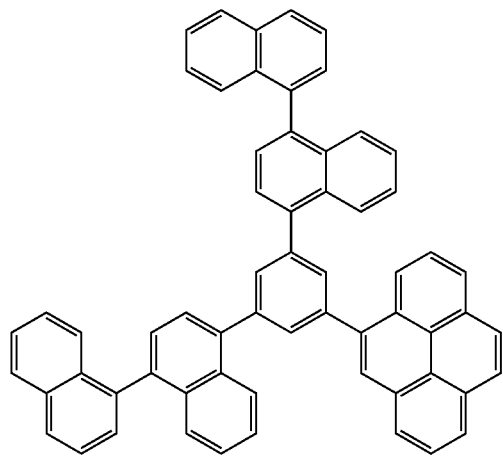
<Compound 175>
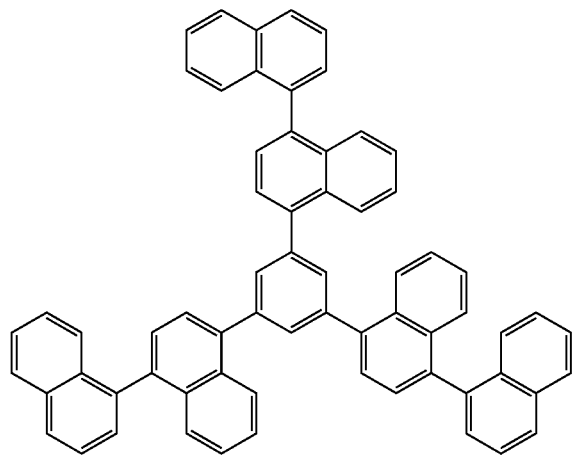
<Compound 176>
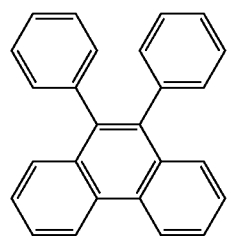
<Compound 177>
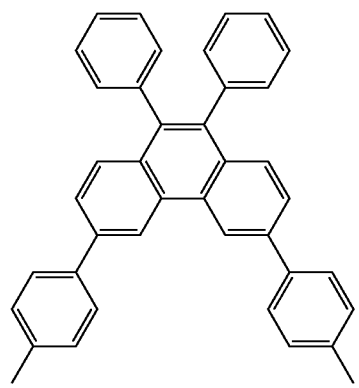

-continued
<Compound 178>
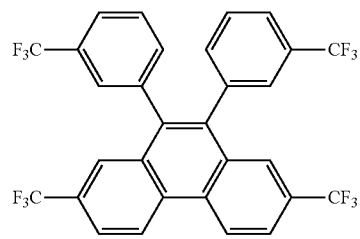
<Compound 179>
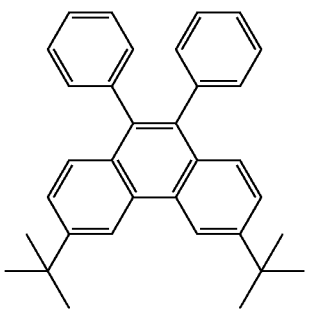
<Compound 180>
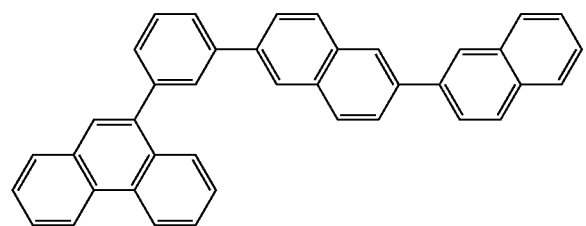
<Compound 181>
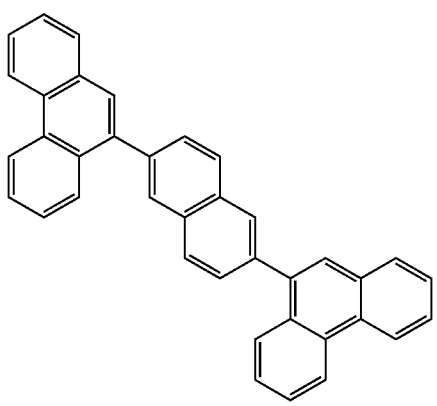
<Compound 182>
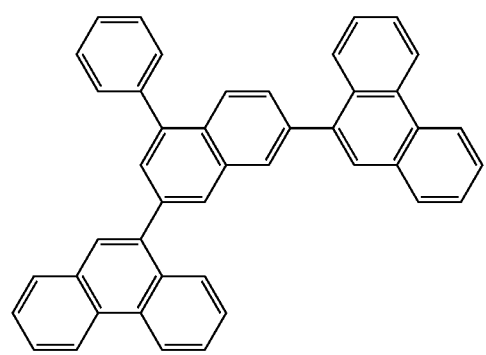
<Compound 183>
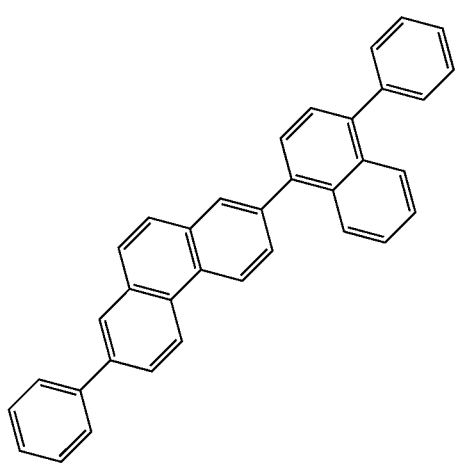
<Compound 184>
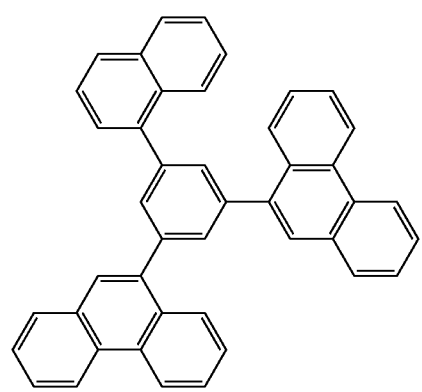
<Compound 185>
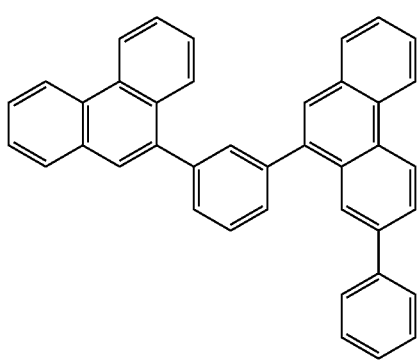

<Compound 186>
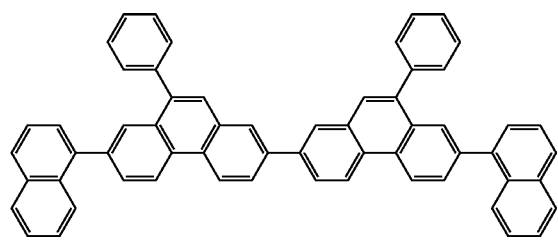
<Compound 187>
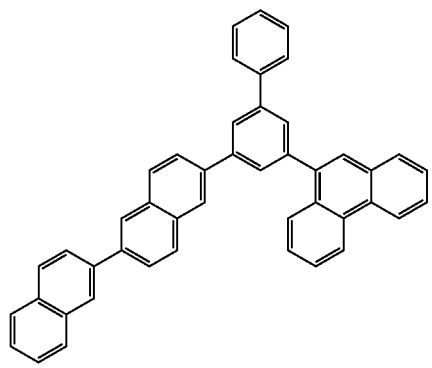
<Compound 188>
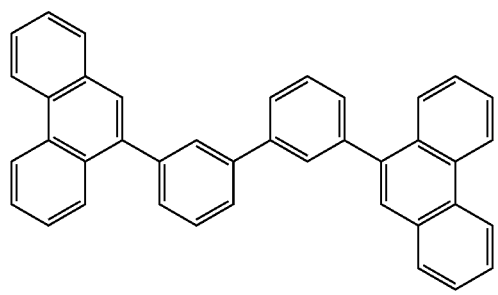
<Compound 189>
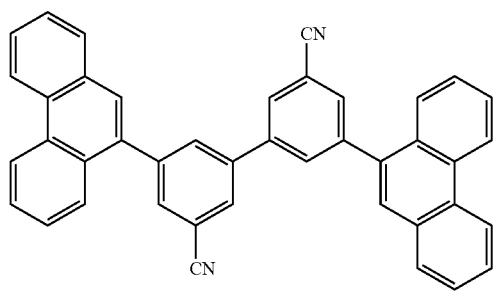
<Compound 190>
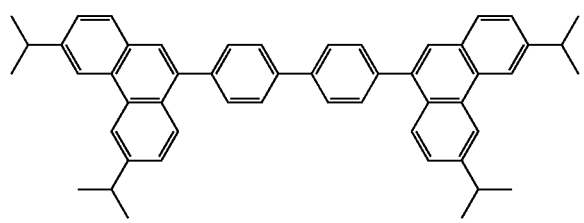
<Compound 191>
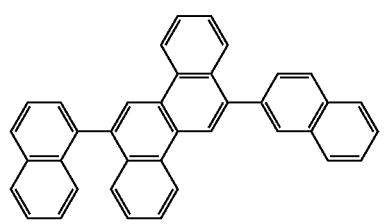
<Compound 192>
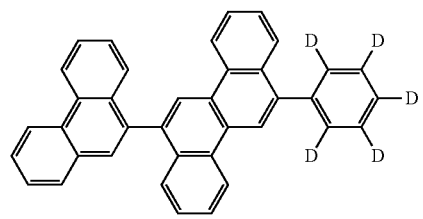
<Compound 193>
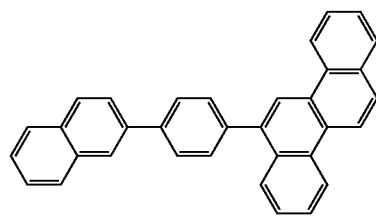
<Compound 194>
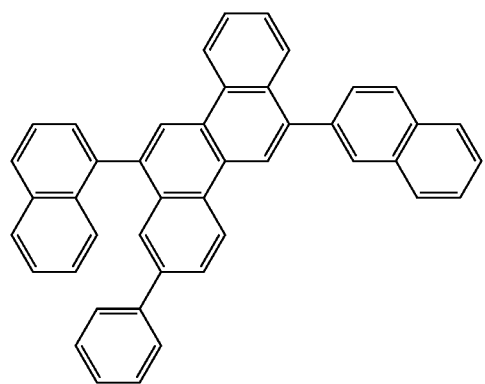
<Compound 195>
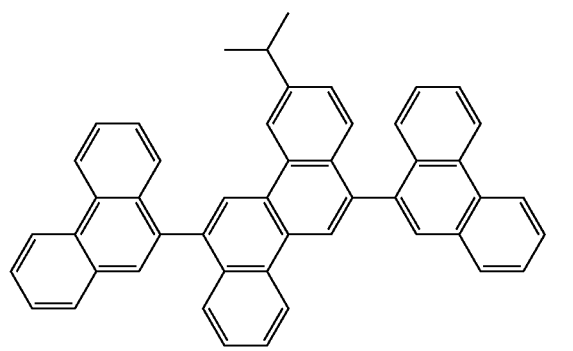

-continued

<Compound 196>

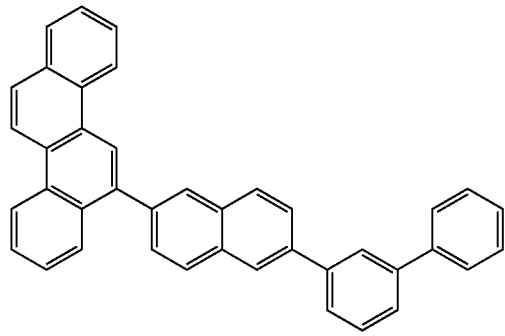

<Compound 197>

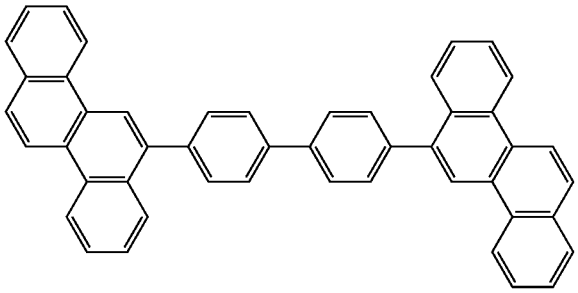

<Compound 198>

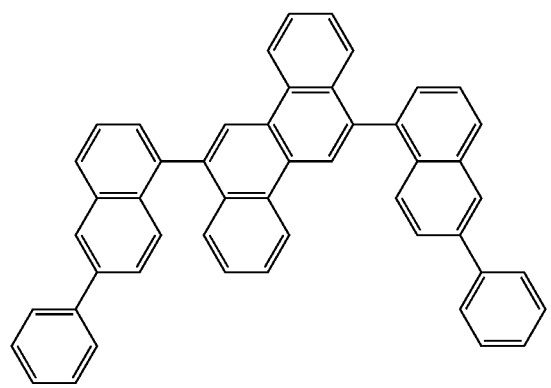

<Compound 199>

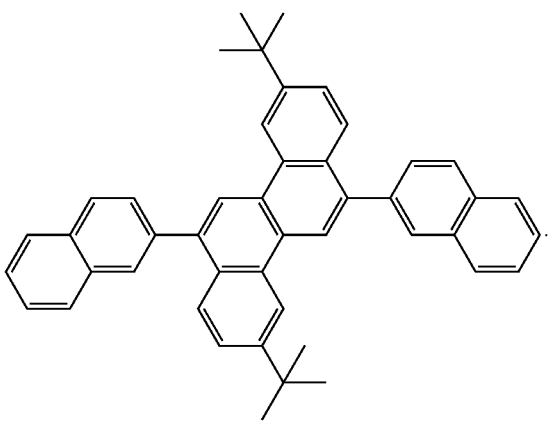

13. The organic light-emitting diode of claim 1, further comprising at least one of a hole injection layer, a hole transport layer, a functional layer capable of both hole injection and hole transport, an electron transport layer, and an electron injection layer, in addition to the light-emitting layer.

14. The organic light-emitting diode of claim 13, wherein at least one of the layers is formed using a deposition process or a solution process.

15. The organic light-emitting diode of claim 1, wherein the organic light-emitting diode is used for a device selected from among a flat display device, a flexible display device, a monochrome or grayscale flat illumination device, and a monochrome or grayscale flexible illumination device.

* * * * *